US012622147B2

(12) United States Patent
Yamazaki et al.

(10) Patent No.: US 12,622,147 B2
(45) **Date of Patent: *May 5, 2026**

(54) DISPLAY DEVICE, DISPLAY MODULE, ELECTRONIC DEVICE, AND TELEVISION DEVICE

(71) Applicant: SEMICONDUCTOR ENERGY LABORATORY CO., LTD., Atsugi (JP)

(72) Inventors: Shunpei Yamazaki, Tokyo (JP); Satoshi Seo, Kanagawa (JP); Harue Osaka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/751,482

(22) Filed: Jun. 24, 2024

(65) Prior Publication Data

US 2024/0431129 A1 Dec. 26, 2024

Related U.S. Application Data

(63) Continuation of application No. 17/431,246, filed as application No. PCT/IB2020/051228 on Feb. 14, 2020, now Pat. No. 12,029,056.

(30) Foreign Application Priority Data

| | | | |
|---|---|---|---|
| Feb. 26, 2019 | (JP) | ................................ | 2019-033191 |
| Apr. 19, 2019 | (JP) | ................................ | 2019-080050 |
| Jul. 2, 2019 | (JP) | ................................ | 2019-123874 |

(51) Int. Cl.
*H10K 59/35* (2023.01)
*H10K 50/11* (2023.01)
(Continued)

(52) U.S. Cl.
CPC ............ *H10K 59/35* (2023.02); *H10K 50/11* (2023.02); *H10K 50/15* (2023.02); *H10K 50/16* (2023.02);
(Continued)

(58) Field of Classification Search
CPC ...................................................... H10K 85/30
See application file for complete search history.

(56) References Cited

U.S. PATENT DOCUMENTS 7,040,943 B2 5/2006 Takahashi et al.
8,486,543 B2 7/2013 Seo et al.
(Continued)

FOREIGN PATENT DOCUMENTS

CN 001615673 A 5/2005
CN 102428589 A 4/2012
(Continued)

OTHER PUBLICATIONS

International Search Report (Application No. PCT/IB2020/051228) Dated Jun. 9, 2020.
(Continued)

*Primary Examiner* — Yu-Hsi D Sun
(74) *Attorney, Agent, or Firm* — Fish & Richardson P.C.

(57) ABSTRACT

A display device having a long lifetime is provided. A large-sized display device is provided. A display device includes a first light-emitting device and a second light-emitting device. The first light-emitting device includes a hole-injection layer, a first light-emitting layer, and an electron-transport layer. The second light-emitting device includes a second light-emitting layer. The hole-injection layer contains a first compound and a second compound. The first light-emitting layer contains a third compound that emits light of a first color. The second light-emitting layer contains a fourth compound that emits light of a second
(Continued)

color. The electron-transport layer contains a fifth compound. The first compound has a property of accepting electrons from the second compound. The second compound has a HOMO level higher than or equal to −5.7 eV and lower than or equal to −5.4 eV. The fifth compound has a HOMO level higher than or equal to −6.0 eV and an electron mobility higher than or equal to 1×10^−7 cm^2/Vs and lower than or equal to 5×10^−5 cm^2/Vs when the square root of electric field strength [V/cm] is 600.

19 Claims, 47 Drawing Sheets

(51) Int. Cl.

| | |
|---|---|
| ***H10K 50/15*** | (2023.01) |
| ***H10K 50/16*** | (2023.01) |
| ***H10K 50/17*** | (2023.01) |
| ***H10K 71/13*** | (2023.01) |
| *H10K 59/80* | (2023.01) |
| *H10K 85/30* | (2023.01) |
| *H10K 85/60* | (2023.01) |
| *H10K 101/10* | (2023.01) |
| *H10K 101/25* | (2023.01) |
| *H10K 101/30* | (2023.01) |
| *H10K 101/40* | (2023.01) |

(52) U.S. Cl.

CPC ........... *H10K 50/17* (2023.02); *H10K 71/135* (2023.02); *H10K 59/876* (2023.02); *H10K 85/30* (2023.02); *H10K 85/342* (2023.02); *H10K 85/615* (2023.02); *H10K 85/626* (2023.02); *H10K 85/633* (2023.02); *H10K 85/636* (2023.02); *H10K 85/657* (2023.02); *H10K 85/6572* (2023.02); *H10K 85/6574* (2023.02); *H10K 85/6576* (2023.02); *H10K 2101/10* (2023.02); *H10K 2101/25* (2023.02); *H10K 2101/30* (2023.02); *H10K 2101/40* (2023.02)

(56) References Cited

U.S. PATENT DOCUMENTS

| | | | | |
|---|---|---|---|---|
| 9,088,006 | B2 | 7/2015 | Yamazaki et al. | |
| 9,153,790 | B2 | 10/2015 | Kuma et al. | |
| 9,627,648 | B2 | 4/2017 | Yamazaki et al. | |
| 9,698,354 | B2 | 7/2017 | Seo et al. | |
| 9,755,174 | B2 | 9/2017 | Uesaka et al. | |
| 10,003,047 | B2 | 6/2018 | Yamazaki et al. | |
| 10,333,091 | B2 | 6/2019 | Uesaka et al. | |
| 10,381,599 | B2 | 8/2019 | Yamazaki et al. | |
| 10,411,193 | B2 | 9/2019 | Kawakami et al. | |
| 10,756,287 | B2 | 8/2020 | Seo et al. | |
| 10,903,453 | B2 | 1/2021 | Yamazaki et al. | |
| 10,930,855 | B2 | 2/2021 | Takita et al. | |
| 10,950,805 | B2 | 3/2021 | Watabe et al. | |
| 11,101,432 | B2 | 8/2021 | Kawakami et al. | |
| 2004/0208988 | A1 | 10/2004 | Takahashi et al. | |
| 2005/0218792 | A1 | 10/2005 | Jianpu et al. | |
| 2006/0289882 | A1 | 12/2006 | Nishimura et al. | |
| 2009/0026929 | A1 | 1/2009 | Song et al. | |
| 2010/0295445 | A1 | 11/2010 | Kuma et al. | |
| 2013/0015450 | A1 | 1/2013 | Kim et al. | |
| 2015/0069357 | A1 | 3/2015 | Park | |
| 2015/0236075 | A1 | 8/2015 | Jeong | |
| 2016/0276601 | A1 | 9/2016 | Choi et al. | |
| 2017/0092890 | A1* | 3/2017 | Seo | H10K 85/6572 |
| 2017/0141337 | A1 | 5/2017 | Hamade et al. | |
| 2017/0155070 | A1 | 6/2017 | Han et al. | |
| 2017/0222156 | A1 | 8/2017 | Kawakami et al. | |
| 2017/0352830 | A1 | 12/2017 | Kishimoto et al. | |
| 2018/0151630 | A1 | 5/2018 | Yamaoka et al. | |
| 2018/0358562 | A1 | 12/2018 | Takita et al. | |
| 2019/0088897 | A1 | 3/2019 | Seo et al. | |
| 2020/0395576 | A1 | 12/2020 | Yamazaki et al. | |
| 2021/0249619 | A1 | 8/2021 | Seo et al. | |
| 2021/0257562 | A1 | 8/2021 | Watabe et al. | |
| 2022/0123253 | A1* | 4/2022 | Seo | H10K 50/11 |
| 2022/0328784 | A1 | 10/2022 | Seo et al. | |
| 2023/0138085 | A1 | 5/2023 | Kawakami et al. | |

FOREIGN PATENT DOCUMENTS

| | | | |
|---|---|---|---|
| CN | 105990529 | A | 10/2016 |
| CN | 108369996 | A | 8/2018 |
| CN | 110117267 | A | 8/2019 |
| DE | 112017000558 | | 11/2018 |
| EP | 2330652 | A | 6/2011 |
| EP | 2434559 | A | 3/2012 |
| JP | 2004-164943 | A | 6/2004 |
| JP | 2006-066380 | A | 3/2006 |
| JP | 2012-113976 | A | 6/2012 |
| JP | 2014-197522 | A | 10/2014 |
| JP | 2015-115178 | A | 6/2015 |
| JP | 2017-139457 | A | 8/2017 |
| JP | 2018-165639 | A | 10/2018 |
| KR | 2005-0097120 | A | 10/2005 |
| KR | 2006-0048920 | A | 5/2006 |
| KR | 2012-0024624 | A | 3/2012 |
| KR | 2015-0098259 | A | 8/2015 |
| KR | 2016-0103932 | A | 9/2016 |
| KR | 2016-0111596 | A | 9/2016 |
| KR | 2018-0095872 | A | 8/2018 |
| KR | 2018-0107159 | A | 10/2018 |
| TW | 200610806 | | 4/2006 |
| TW | 201101922 | | 1/2011 |
| TW | 201630227 | | 8/2016 |
| TW | 201736357 | | 10/2017 |
| WO | WO-2004/045254 | | 5/2004 |
| WO | WO-2010/134352 | | 11/2010 |
| WO | WO-2012/070330 | | 5/2012 |
| WO | WO-2017/103732 | | 6/2017 |
| WO | WO-2017/130079 | | 8/2017 |
| WO | WO-2021/186306 | | 9/2021 |

OTHER PUBLICATIONS

Written Opinion (Application No. PCT/IB2020/051228) Dated Jun. 9, 2020.

Okachi. T et al., “Determination of Charge-Carrier Mobility in Organic Light-Emitting Diodes by Impedance Spectroscopy in Presence of Localized States”, Jpn. J. Appl. Phys. (Japanese Journal of Applied Physics) , Dec. 19, 2008, vol. 47, No. 12, pp. 8965-8972, The Japan Society of Applied Physics.

Taiwanese Office Action (Application No. 109105328) Dated Dec. 15, 2023.

Taiwanese Office Action (Application No. 113129054) Dated May 9, 2025.

’ADN—9, 10-Bis(2-naphthyl)anthracene CAS No. 122648-99-1, https://www.ossila.com/products/adn?_ pos=1&_sid=c7a74316f&_ ss=r, Ossila.

* cited by examiner

FIG. 9A
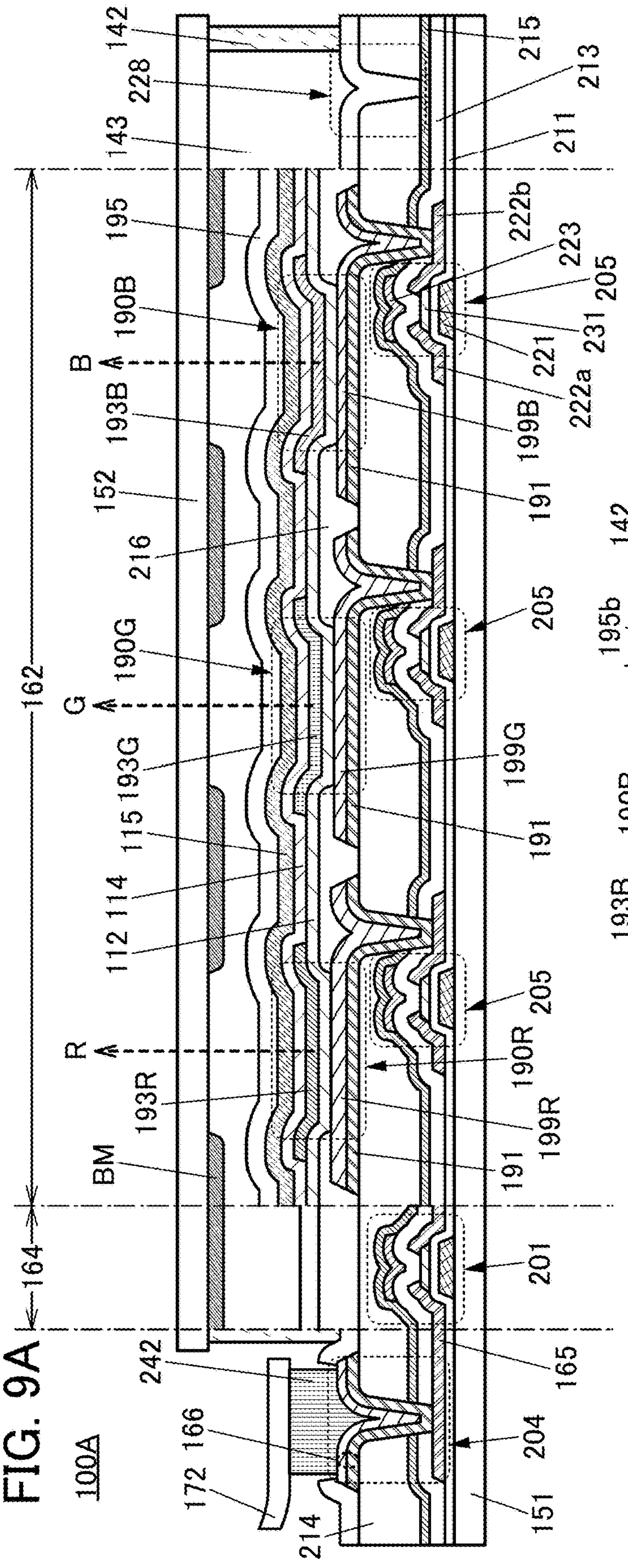
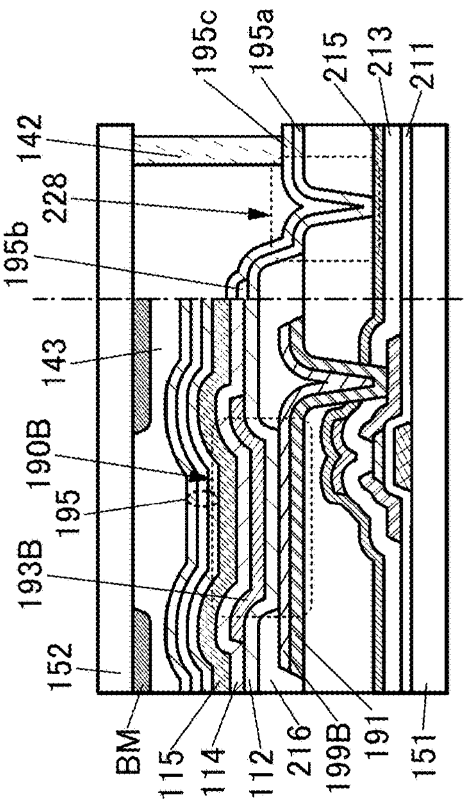
FIG. 9B

DISPLAY DEVICE, DISPLAY MODULE, ELECTRONIC DEVICE, AND TELEVISION DEVICE

CROSS REFERENCE TO RELATED APPLICATIONS

This application is a continuation of U.S. application Ser. No. 17/431,246, filed Aug. 16, 2021, now allowed, which is incorporated by reference and is a U.S. National Phase Application under 35 U.S.C. § 371 of International Application PCT/IB2020/051228, filed on Feb. 14, 2020, which is incorporated by reference and claims the benefit of foreign priority applications filed in Japan on Feb. 26, 2019, as Application No. 2019-033191, on Apr. 19, 2019, as Application No. 2019-080050, and on Jul. 2, 2019, as Application No. 2019-123874.

TECHNICAL FIELD

One embodiment of the present invention relates to a display device, a display module, an electronic device, and a television device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, application of display devices to a variety of uses has been expected. Examples of uses for a large display device include a television device for home use (also referred to as a TV or a television receiver), digital signage, and a PID (Public Information Display). In addition, a smartphone and a tablet terminal including a touch panel are being developed as portable information terminals.

Light-emitting apparatuses including light-emitting devices (also referred to as light-emitting elements) have been developed as display devices, for example. Light-emitting devices (also referred to as EL devices or EL elements) utilizing an electroluminescence (hereinafter referred to as EL) phenomenon have features such as ease of reduction in thickness and weight, high-speed response to an input signal, and driving with a direct-current low voltage source, and application of the light-emitting devices to display devices has been discussed. For example, Patent Document 1 discloses a flexible light-emitting apparatus including an organic EL device (also referred to as an organic EL element).

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a long-lifetime display device. An object of one embodiment of the present invention is to provide a highly reliable display device. An object of one embodiment of the present invention is to provide a large-sized display device. An object of one embodiment of the present invention is to provide a display device with high resolution. An object of one embodiment of the present invention is to provide a display device with high productivity. An object of one embodiment of the present invention is to provide a display device with high display quality.

Note that the description of these objects does not preclude the existence of other objects. One embodiment of the present invention does not need to achieve all the objects. Other objects can be derived from the description of the specification, the drawings, and the claims.

Means for Solving the Problems

One embodiment of the present invention is a display device including a first light-emitting device and a second light-emitting device. The first light-emitting device includes a first electrode and a common electrode. The second light-emitting device includes a second electrode and the common electrode. The first light-emitting device includes a hole-injection layer, a first light-emitting layer, and an electron-transport layer in this order from a side of one of the first electrode and the common electrode that functions as an anode. The second light-emitting device includes a second light-emitting layer between the second electrode and the common electrode. The hole-injection layer is in contact with the one of the first electrode and the common electrode that functions as the anode. The hole-injection layer contains a first compound and a second compound. The first light-emitting layer contains a third compound that emits light of a first color. The second light-emitting layer contains a fourth compound that emits light of a second color. The electron-transport layer contains a fifth compound. The first compound has a property of accepting an electron from the second compound. The second compound has a HOMO level higher than or equal to −5.7 eV and lower than or equal to −5.4 eV. The fifth compound has a HOMO level higher than or equal to −6.0 eV and an electron mobility higher than or equal to $1\times10^{-7}$ $cm^2/Vs$ and lower than or equal to $5\times10^{-5}$ $cm^2/Vs$ when the square root of electric field strength [V/cm] is 600.

The second light-emitting device preferably includes a layer shared with the first light-emitting device between the second electrode and the common electrode.

The second light-emitting device preferably includes the hole-injection layer and the electron-transport layer.

One embodiment of the present invention is a display device including a first light-emitting device and a second light-emitting device. The first light-emitting device includes a first electrode and a common electrode. The second light-emitting device includes a second electrode and the common electrode. The first light-emitting device includes a hole-injection layer, a first hole-transport layer, a first light-emitting layer, and an electron-transport layer in this order from a side of one of the first electrode and the common electrode that functions as an anode. The second light-emitting device includes a second light-emitting layer between the second electrode and the common electrode. The hole-injection layer is in contact with the one of the first electrode and the common electrode that functions as the anode. The hole-injection layer contains a first compound and a second compound. The first light-emitting layer contains a third compound that emits light of a first color. The second light-emitting layer contains a fourth compound that emits light of a second color. The electron-transport layer contains a fifth compound. The first hole-transport layer contains a sixth compound. The first compound has a property of accepting an electron from the second compound. The second compound has a HOMO level higher than or equal to −5.7 eV and lower than or equal to −5.4 eV. The fifth compound has a HOMO level higher than or equal to −6.0 eV and an electron mobility higher than or equal to $1\times10^{-7}$ $cm^2/Vs$ and lower than or equal to $5\times10^{-5}$ $cm^2/Vs$ when the square root of electric field strength [V/cm] is 600. The HOMO level of the sixth compound is lower than or equal to the HOMO level of the second compound. A difference between the HOMO level of the sixth compound and the HOMO level of the second compound is 0.2 eV or less.

The second compound and the sixth compound each preferably include at least one of a carbazole skeleton, a dibenzofuran skeleton, a dibenzothiophene skeleton, and an anthracene skeleton.

The first light-emitting device preferably further includes a second hole-transport layer. The second hole-transport layer preferably contains a seventh compound. The HOMO level of the seventh compound is preferably lower than the HOMO level of the sixth compound. The second compound, the sixth compound, and the seventh compound each preferably include at least one of a carbazole skeleton, a dibenzofuran skeleton, a dibenzothiophene skeleton, and an anthracene skeleton.

One embodiment of the present invention is a display device including a first light-emitting device and a second light-emitting device. The first light-emitting device includes a first electrode and a common electrode. The second light-emitting device includes a second electrode and the common electrode. The first light-emitting device includes a hole-injection layer, a first light-emitting layer, and an electron-transport layer in this order from a side of one of the first electrode and the common electrode that functions as an anode. The second light-emitting device includes a second light-emitting layer between the second electrode and the common electrode. The hole-injection layer is in contact with the one of the first electrode and the common electrode that functions as the anode. The hole-injection layer contains a first compound and a second compound. The first light-emitting layer contains a third compound that emits light of a first color. The second light-emitting layer contains a fourth compound that emits light of a second color. The electron-transport layer contains a fifth compound and an eighth compound. The first compound has a property of accepting an electron from the second compound. The second compound has a HOMO level higher than or equal to −5.7 eV and lower than or equal to −5.4 eV. The fifth compound has a HOMO level higher than or equal to −6.0 eV and an electron mobility higher than or equal to $1\times10^{-7}$ $cm^2/Vs$ and lower than or equal to $5\times10^{-5}$ $cm^2/Vs$ when the square root of electric field strength [V/cm] is 600. The eighth compound is an organic complex containing an alkali metal or an alkaline earth metal.

The ratio of the fifth compound to the eighth compound in the electron-transport layer preferably differs between the first light-emitting layer side and the common electrode side.

The electron-transport layer preferably includes a first region on the first light-emitting layer side and a second region on the common electrode side. The amount of the eighth compound in the second region is preferably smaller than that in the first region.

The first light-emitting device preferably further includes a first hole-transport layer. The first hole-transport layer preferably contains a sixth compound. The HOMO level of the sixth compound is preferably lower than or equal to the HOMO level of the second compound. A difference between the HOMO level of the sixth compound and the HOMO level of the second compound is preferably 0.2 eV or less. The second compound and the sixth compound each preferably include at least one of a carbazole skeleton, a dibenzofuran skeleton, a dibenzothiophene skeleton, and an anthracene skeleton.

The first light-emitting device preferably further includes a second hole-transport layer. The second hole-transport layer preferably contains a seventh compound. The HOMO level of the seventh compound is preferably lower than the HOMO level of the sixth compound. The second compound, the sixth compound, and the seventh compound each preferably include at least one of a carbazole skeleton, a dibenzofuran skeleton, a dibenzothiophene skeleton, and an anthracene skeleton.

Each of the third compound and the fourth compound is preferably a fluorescent substance.

The first color is preferably blue.

A decay curve expressed as a change in luminance of light emission obtained when a certain amount of current flows through the first light-emitting device preferably has a local maximum value.

One embodiment of the present invention is a display device including a first light-emitting device, a second light-emitting device, and a third light-emitting device. The first light-emitting device includes a first electrode and a common electrode. The second light-emitting device includes a second electrode and the common electrode. The third light-emitting device includes a third electrode and the common electrode. The first light-emitting device includes a hole-injection layer, a first light-emitting layer, and an electron-transport layer in this order from a side of one of the first electrode and the common electrode that functions as an anode. The second light-emitting device includes a second light-emitting layer between the second electrode and the common electrode. The third light-emitting device includes a third light-emitting layer between the third electrode and the common electrode. The hole-injection layer is in contact with the one of the first electrode and the common electrode that functions as the anode. The hole-injection layer contains a first compound and a second compound. The electron-transport layer contains a third compound. The first compound has a property of accepting an electron from the second compound. The second compound has a HOMO level higher than or equal to −5.7 eV and lower than or equal to −5.4 eV. The third compound has a HOMO level higher than or equal to −6.0 eV and an electron mobility higher than or equal to $1\times10^{-7}$ $cm^2/Vs$ and lower than or equal to $5\times10^{-5}$ $cm^2/Vs$ when the square root of electric field strength [V/cm] is 600. The maximum peak wavelength of the emission spectrum of the first light-emitting device is shorter than the maximum peak wavelength of the emission spectrum of the second light-emitting device. The maximum peak wavelength of the emission spectrum of the second light-emitting device is shorter than the maximum peak wavelength of the emission spectrum of the third light-emitting device. In a top view, the area of a light-emitting region of the second light-emitting device is larger than the area of a light-emitting region of the third light-emitting device. In the top view, the area of a light-emitting region of the first light-emitting device is larger than or equal to the area of the light-emitting region of the third light-emitting device and smaller than or equal to the area of the light-emitting region of the second light-emitting device.

One embodiment of the present invention is a display device including a first light-emitting device, a second light-emitting device, and a third light-emitting device. The first light-emitting device includes a first electrode and a common electrode. The second light-emitting device includes a second electrode and the common electrode. The third light-emitting device includes a third electrode and the common electrode. The first light-emitting device includes a first light-emitting layer and an electron-transport layer in this order from a side of one of the first electrode and the common electrode that functions as an anode. The second light-emitting device includes a second light-emitting layer between the second electrode and the common electrode. The third light-emitting device includes a third light-emitting layer between the third electrode and the common electrode. The electron-transport layer contains an electron-transport material and an organometallic complex of an alkali metal or an alkaline earth metal. The electron-transport layer includes a first region and a second region that is positioned closer to the common electrode than the first region is. The first region and the second region differ in the concentration of the electron-transport material. The maximum peak wavelength of the emission spectrum of the first light-emitting device is shorter than the maximum peak wavelength of the emission spectrum of the second light-emitting device. The maximum peak wavelength of the emission spectrum of the second light-emitting device is shorter than the maximum peak wavelength of the emission spectrum of the third light-emitting device. In a top view, the area of a light-emitting region of the second light-emitting device is larger than the area of a light-emitting region of the third light-emitting device. In the top view, the area of a light-emitting region of the first light-emitting device is larger than or equal to the area of the light-emitting region of the third light-emitting device and smaller than or equal to the area of the light-emitting region of the second light-emitting device. The concentration of the electron-transport material in the second region is preferably lower than that in the first region.

It is preferable that the first light-emitting device exhibit fluorescence and that the second light-emitting device and the third light-emitting device each exhibit phosphorescence.

One embodiment of the present invention is a display module including the display device having any of the above-described structures, where a connector such as a flexible printed circuit (hereinafter, also referred to as FPC) or a TCP (Tape Carrier Package) is attached or an integrated circuit (IC) is mounted by a COG (Chip On Glass) method, a COF (Chip On Film) method, or the like.

One embodiment of the present invention is an electronic device including the above-described display module and at least one of an antenna, a battery, a housing, a camera, a speaker, a microphone, and an operation button.

One embodiment of the present invention is a television device that includes the above-described display module and a communication control portion and can be connected to a computer network using the communication control portion.

Effect of the Invention

According to one embodiment of the present invention, a long-lifetime display device can be provided. According to one embodiment of the present invention, a highly reliable display device can be provided. According to one embodiment of the present invention, a large-sized display device can be provided. According to one embodiment of the present invention, a display device with high resolution can be provided. According to one embodiment of the present invention, a display device with high productivity can be provided. According to one embodiment of the present invention, a display device with high display quality can be provided.

Note that the description of these effects does not preclude the existence of other effects. One embodiment of the present invention does not need to have all these effects. Other effects can be derived from the description of the specification, the drawings, and the claims.

BRIEF DESCRIPTION OF THE DRAWINGS

FIG. 9A and FIG. 9B are cross-sectional views showing an example of a display device.

MODE FOR CARRYING OUT THE INVENTION

Figure 1A:
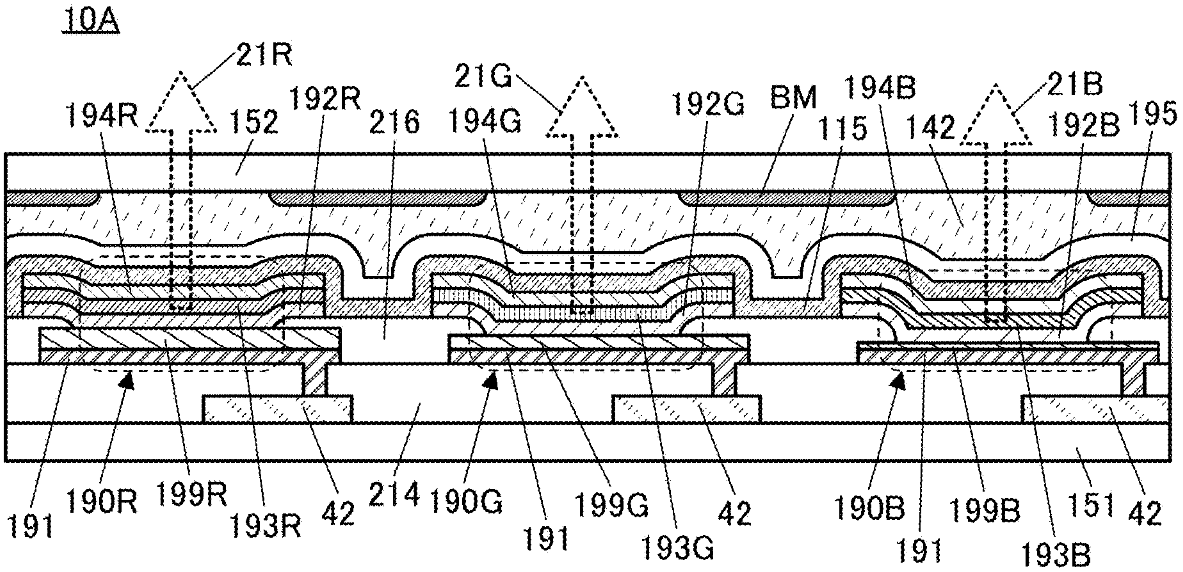
FIG. 1A and FIG. 1B are cross-sectional views each showing an example of a display device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term “film” and the term “layer” can be interchanged with each other depending on the case or circumstances. For example, the term “conductive layer” can be changed into the term “conductive film”. As another example, the term “insulating film” can be changed into the term “insulating layer”.

In this specification and the like, unless otherwise specified, in describing a structure including a plurality of elements (e.g., light-emitting devices and light-emitting layers), letters are not added when a common part of the elements is described. For example, when a common part of a light-emitting layer 193R, a light-emitting layer 193G, and the like is described, the light-emitting layers are simply referred to as the light-emitting layer 193, in some cases.

Embodiment 1

In this embodiment, a display device of one embodiment of the present invention is described with reference to FIG. 1 to FIG. 10.

In the display device of this embodiment, a light-emitting device is included in a display portion, and an image can be displayed on the display portion.

As the light-emitting device, an EL device such as an OLED (Organic Light Emitting Diode) or a QLED (Quantum-dot Light Emitting Diode) is preferably used. As a light-emitting substance contained in the EL device, a substance that exhibits fluorescence (a fluorescent substance), a substance that exhibits phosphorescence (a phosphorescent substance), an inorganic compound (e.g., a quantum dot material), a substance that exhibits thermally activated delayed fluorescence (a thermally activated delayed fluorescent (TADF) material), and the like can be given.

As a coloring method for the display device of this embodiment, a separate coloring method is employed. In the case of employing a separate coloring method for a small display device, the alignment accuracy of a metal mask can be increased and the yield in separate coloring can be increased, which is preferable. Furthermore, a large display device can have a comparatively low resolution, which is advantageous in employing a light-emitting device formed by a separate coloring method.

Light-emitting devices included in subpixels of respective colors include light-emitting layers different from each other. The light-emitting layers included in the respective light-emitting devices are preferably separated from each other. Note that when the resolution of the display device is high, the light-emitting layers of the light-emitting devices partly overlap with each other in some cases.

The display device of this embodiment can have any of a top-emission structure in which light is emitted in a direction opposite to a substrate where a light-emitting device is formed, a bottom-emission structure in which light is emitted toward the substrate where the light-emitting device is formed, and a dual-emission structure in which light is emitted toward both surfaces.

The light-emitting device preferably employs a micro optical resonator (microcavity) structure. Specifically, it is preferable that to adjust the optical distance between a pair of electrodes, in EL layers, not only a light-emitting layer but also a layer of another kind (e.g., a hole-transport layer) be formed by separate coloring for the light-emitting devices of the respective colors and other layers be shared by the light-emitting devices of the respective colors. This structure simplifies the process and makes it possible to provide a display device from which light can be efficiently extracted and which can perform display with a wide color gamut.

The display device of this embodiment includes a light-emitting device in which holes are easily injected into a light-emitting layer and electrons are less likely to be injected into the light-emitting layer. Holes are easily injected from a hole-injection layer and a hole-transport layer and the amount of electrons injected into the light-emitting layer from an electron-transport layer is suppressed, whereby the light-emitting layer can be inhibited from having excess electrons. Moreover, injection of electrons into the light-emitting layer with time increases luminance, and the luminance increase can cancel out initial decay. Using a light-emitting device with little initial decay and an extremely long driving lifetime can extend lifetime of the display device and increase reliability thereof. The structure of the light-emitting device is described later with reference to FIG. 4 to FIG. 7.

Figure 2A:
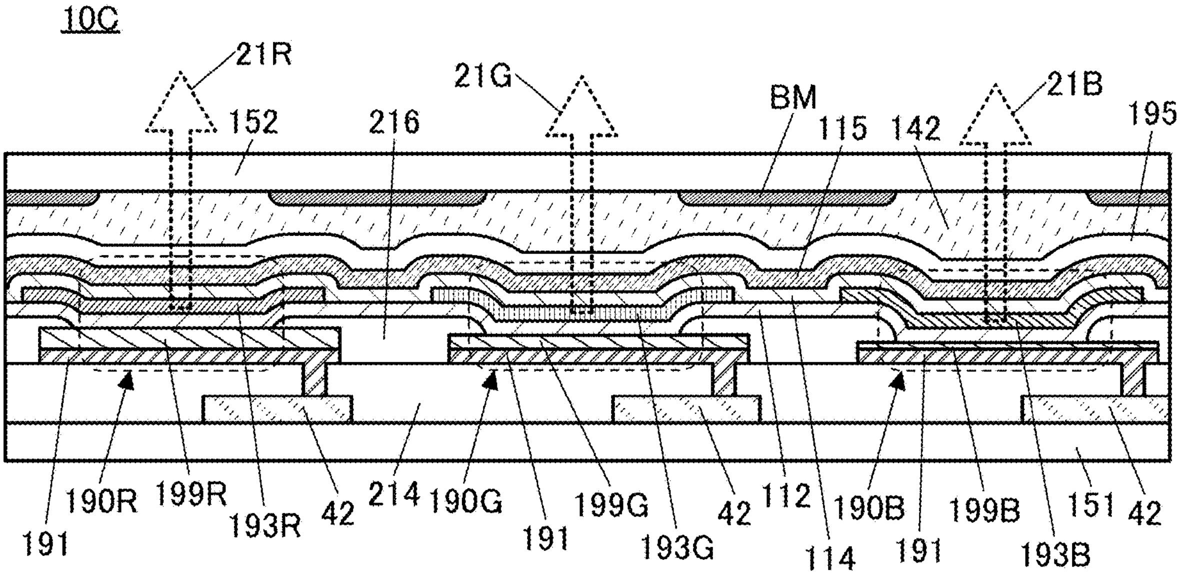
FIG. 2A and FIG. 2B are cross-sectional views each showing an example of a display device.
Figure 2B:
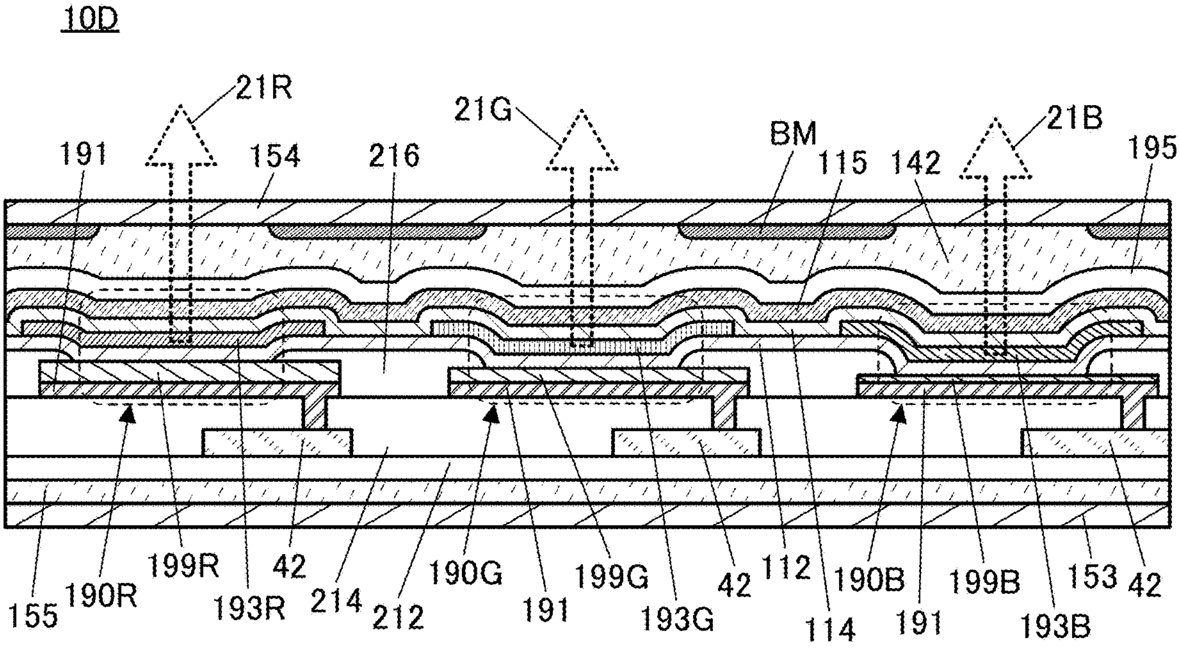
Figure 3:
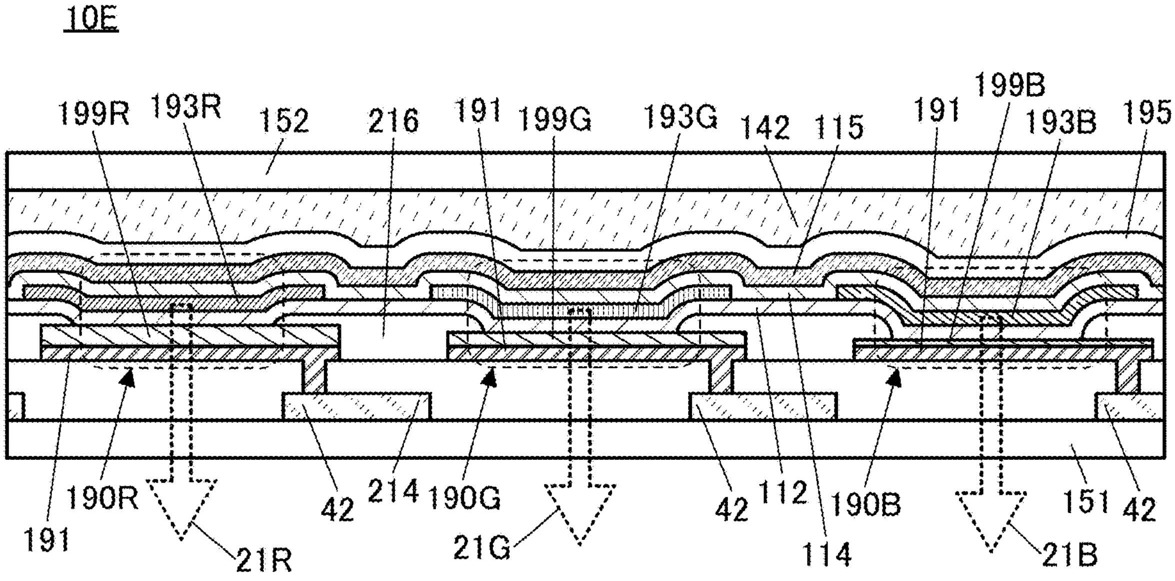
FIG. 3 is a cross-sectional view showing an example of a display device.

First, FIG. 1 to FIG. 3 illustrate structure examples of the display devices. In each of the display devices illustrated in FIG. 1 to FIG. 3, at least one light-emitting device employs a structure of the light-emitting device illustrated in FIG. 4 to FIG. 7.

[Display Device 10A]

FIG. 1A is a cross-sectional view of a display device 10A.

The display device 10A includes a light-emitting device 190R that emits red light 21R, a light-emitting device 190G that emits green light 21G, and a light-emitting device 190B that emits blue light 21B.

The light-emitting device 190R includes a pixel electrode 191, an optical adjustment layer 199R, a buffer layer 192R, a light-emitting layer 193R, a buffer layer 194R, and a common electrode 115. The light-emitting layer 193R contains an organic compound that emits red light.

The light-emitting device 190G includes the pixel electrode 191, an optical adjustment layer 199G, a buffer layer 192G, a light-emitting layer 193G, a buffer layer 194G, and the common electrode 115. The light-emitting layer 193G contains an organic compound that emits green light.

The light-emitting device 190B includes the pixel electrode 191, an optical adjustment layer 199B, a buffer layer 192B, a light-emitting layer 193B, a buffer layer 194B, and the common electrode 115. The light-emitting layer 193B contains an organic compound that emits blue light.

At least one of the light-emitting device 190R, the light-emitting device 190G, and the light-emitting device 190B employs the structure of the light-emitting device illustrated in FIG. 4 to FIG. 7.

In this embodiment, the case where the pixel electrode 191 functions as an anode and the common electrode 115 functions as a cathode is described as an example.

The pixel electrode 191, the optical adjustment layer 199R, the optical adjustment layer 199G, the optical adjustment layer 199B, the buffer layer 192R, the buffer layer 192G, the buffer layer 192B, the light-emitting layer 193R, the light-emitting layer 193G, the light-emitting layer 193B, the buffer layer 194R, the buffer layer 194G, the buffer layer 194B, and the common electrode 115 may each have a single-layer structure or a stacked-layer structure.

The pixel electrode 191 is positioned over an insulating layer 214. An end portion of the pixel electrode 191 is covered with a partition 216. The pixel electrodes 191 are electrically insulated (electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The buffer layer 192 is positioned over the pixel electrode 191. The light-emitting layer 193 overlaps with the pixel electrode 191 with the buffer layer 192 therebetween. The buffer layer 194 is positioned over the light-emitting layer 193. The light-emitting layer 193 overlaps with the common electrode 115 with the buffer layer 194 therebetween. The buffer layer 192 can include one or both of a hole-injection layer and a hole-transport layer. The buffer layer 194 can include one or both of an electron-injection layer and an electron-transport layer.

The common electrode 115 is a layer used in common by the light-receiving devices 190 of the respective colors.

The display device 10A includes the light-emitting devices 190, transistors 42, and the like between a pair of substrates (a substrate 151 and a substrate 152).

In the light-emitting device 190, the buffer layer 192, the light-emitting layer 193, and the buffer layer 194 that are positioned between the pixel electrode 191 and the common electrode 115 can be referred to as an EL layer. The pixel electrode 191 preferably has a function of reflecting visible light. The common electrode 115 has a function of transmitting visible light.

The light-emitting device included in the display device of this embodiment preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light emission obtained from the light-emitting layer can be resonated between the electrodes, whereby light emitted from the light-emitting device can be intensified.

Note that the transflective electrode can have a stacked-layer structure of a reflective electrode and an electrode having a property of transmitting visible light (also referred to as a transparent electrode). In this specification and the like, a reflective electrode functioning as part of a transflective electrode may be referred to as a pixel electrode or a common electrode, and a transparent electrode may be referred to as an optical adjustment layer; in some cases, a transparent electrode (an optical adjustment layer) can also be regarded as having a function of a pixel electrode or a common electrode.

The light transmittance of the transparent electrode is greater than or equal to 40%. For example, an electrode whose transmittance for each of visible light (light with a wavelength greater than or equal to 400 nm and less than 750 nm) and near-infrared light (light with a wavelength greater than or equal to 750 nm and less than or equal to 1300 nm) is greater than or equal to 40% is preferably used in the light-emitting device. The reflectivity of the transflective electrode for each of visible light and near-infrared light is greater than or equal to 10% and less than or equal to 95%, preferably greater than or equal to 30% and less than or equal to 80%. The reflectivity of the reflective electrode for each of visible light and near-infrared light is greater than or equal to 40% and less than or equal to 100%, preferably greater than or equal to 70% and less than or equal to 100%. These electrodes preferably have a resistivity less than or equal to $1\times10^{-2}$ Ωcm.

In this embodiment, an example in which the optical adjustment layer 199 is provided over the pixel electrode 191 is described, but the optical adjustment layer 199 is not necessarily provided. For example, the buffer layer 192 or the buffer layer 194 may have a function of an optical adjustment layer. By changing the thickness of the buffer layer 192 or the buffer layer 194, light of a particular color can be intensified and taken out from each light-emitting device. Note that when the transflective electrode has a stacked-layer structure of a reflective electrode and a transparent electrode, the optical distance between the pair of electrodes represents the optical distance between a pair of reflective electrodes.

The light-emitting device 190 has a function of emitting visible light. Specifically, the light-emitting device 190 is an electroluminescent device that emits light to the substrate 152 side by application of voltage between the pixel electrode 191 and the common electrode 115.

The pixel electrode 191 is electrically connected to a source or a drain of the transistor 42 through an opening provided in the insulating layer 214. The transistor 42 has a function of controlling driving of the light-emitting device 190.

The light-emitting devices 190 are preferably covered with a protective layer 195. In FIG. 1A, the protective layer 195 is provided on and in contact with the common electrode 115. With the protective layer 195, entry of impurities such as water into the light-emitting device 190 can be inhibited, leading to an increase in the reliability of the light-emitting device 190. The protective layer 195 and the substrate 152 are bonded to each other with an adhesive layer 142.

For a light-blocking layer BM, a material that blocks light emitted from the light-emitting device can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

[Display Device 10B]

Figure 1B:
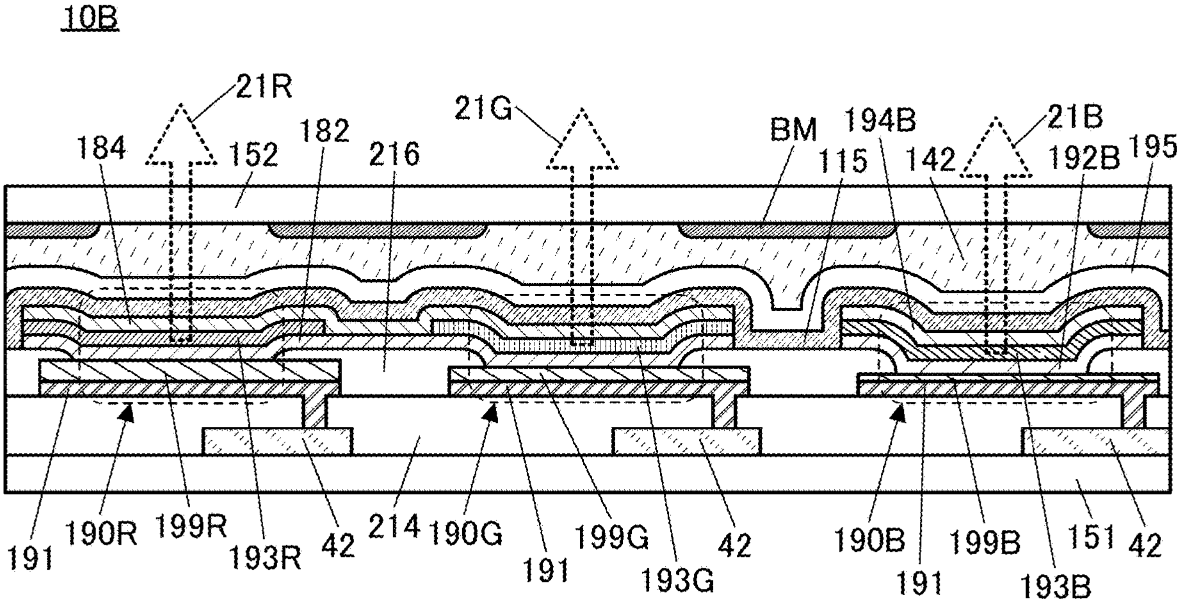

FIG. 1B is a cross-sectional view of a display device 10B. Note that in the description of the display device below, components similar to those of the above-described display device are not described in some cases.

The display device 10B is different from the display device 10A in that the red-light-emitting device 190R and the green-light-emitting device 190G include a common layer 182 and a common layer 184.

It is preferable that at least two of the red-light-emitting device 190R, the green-light-emitting device 190G, and the blue-light-emitting device 190B share at least one layer (common layer). Accordingly, the display device can be manufactured in a smaller number of manufacturing steps.

FIG. 1B illustrates an example in which the light-emitting device 190R and the light-emitting device 190G include the common layer 182 and the common layer 184; however, the display device of one embodiment of the present invention may have a structure in which the light-emitting device 190R and the light-emitting device 190G include only the common layer 182 or the common layer 184.

The common layer 182 is positioned between the pixel electrode 191 and the light-emitting layer 193R and between the pixel electrode 191 and the light-emitting layer 193G.

The common layer 184 is positioned between the light-emitting layer 193R and the common electrode 115 and between the light-emitting layer 193G and the common electrode 115.

The common layer 182 and the common layer 184 may each have a single-layer structure or a stacked-layer structure.

One or both of a hole-injection layer and a hole-transport layer can be formed as the common layer 182, for example.

One or both of an electron-injection layer and an electron-transport layer can be formed as the common layer 184, for example.

The light-emitting device 190R and the light-emitting device 190G may include a buffer layer in at least one of positions between the pixel electrode 191 and the common layer 182, between the common layer 182 and the light-emitting layer, between the light-emitting layer and the common layer 184, and between the common layer 184 and the common electrode 115. For example, at least one of a hole-injection layer, a hole-transport layer, an electron-transport layer, and an electron-injection layer can be formed as the buffer layer.

For example, the light-emitting device 190B preferably employs the structure of the light-emitting device illustrated in FIG. 4 to FIG. 7. Alternatively, both the light-emitting device 190R and the light-emitting device 190G may employ the structure of the light-emitting device illustrated in FIG. 4 to FIG. 7.

In the case where the light-emitting device 190B and one of the light-emitting device 190R and the light-emitting device 190G, i.e., two light-emitting devices in total, employ the structure of the light-emitting device illustrated in FIG. 4 to FIG. 7, the light-emitting device 190B and one of the light-emitting device 190R and the light-emitting device 190G preferably include the common layer 182 and the common layer 184. In this case, the structures of the common layer 182 and the common layer 184 preferably employ the structure of the light-emitting device illustrated in FIG. 4 to FIG. 7.

[Display Device 10C]

FIG. 2A is a cross-sectional view of a display device 10C.

The display device 10C is different from the display device 10A in that the red-light-emitting device 190R, the green-light-emitting device 190G, and the blue-light-emitting device 190B include a common layer 112 and a common layer 114.

It is preferable that the red light-emitting device 190R, the green light-emitting device 190G, and the blue light-emitting device 190B share at least one layer (common layer). Accordingly, the display device can be manufactured in a smaller number of manufacturing steps.

FIG. 2A illustrates an example in which the light-emitting devices of the respective colors include the common layer 112 and the common layer 114, but the display device of one embodiment of the present invention may have a structure in which the light-emitting devices of the respective colors include only the common layer 112 or the common layer 114.

The common layer 112 is positioned between the pixel electrode 191 and the light-emitting layers of the respective colors.

The common layer 114 is positioned between the light-emitting layers of the respective colors and the common electrode 115.

The common layer 112 and the common layer 114 may each have a single-layer structure or a stacked-layer structure.

One or both of a hole-injection layer and a hole-transport layer can be formed as the common layer 112, for example.

One or both of an electron-injection layer and an electron-transport layer can be formed as the common layer 114, for example.

The light-emitting devices may include a buffer layer in at least one of positions between the pixel electrode 191 and the common layer 112, between the common layer 112 and the light-emitting layer, between the light-emitting layer and the common layer 114, and between the common layer 114 and the common electrode 115. For example, at least one of a hole-injection layer, a hole-transport layer, an electron-transport layer, and an electron-injection layer can be formed as the buffer layer.

Each of the light-emitting devices preferably employs the structure of the light-emitting device illustrated in FIG. 4 to FIG. 7. In this case, the structures of the common layer 112 and the common layer 114 preferably employ the structure of the light-emitting device illustrated in FIG. 4 to FIG. 7. It is particularly preferable that light-emitting substances contained in the light-emitting layer 193R, the light-emitting layer 193G, and the light-emitting layer 193B be fluorescent substances. This can further extend lifetime of the light-emitting devices.

Alternatively, it is preferable that the light-emitting substances contained in the light-emitting layer 193R and the light-emitting layer 193G be phosphorescent substances and that the light-emitting substance contained in the light-emitting layer 193B be a fluorescent substance.

[Display Device 10D]

FIG. 2B is a cross-sectional view of a display device 10D.

The display device 10D is different from the display device 10C in that the substrate 151 and the substrate 152 are not included and a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display device 10D has a structure formed in such a manner that the insulating layer 212, the transistors 42, the light-emitting devices of the respective colors, and the like that are formed over a formation substrate are transferred onto the substrate 153. The substrate 153 and the substrate 154 preferably have flexibility. Accordingly, the flexibility of the display device 10D can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display device of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

[Display Device 10E]

FIG. 3 is a cross-sectional view of a display device 10E.

The display device 10E is a bottom-emission type, which is different from the display device 10C.

The pixel electrode 191 has a function of transmitting visible light. The common electrode 115 preferably has a function of reflecting visible light.

The transistors 42 are preferably provided in positions not overlapping with light-emitting regions of the light-emitting devices.

Although the display device 10E is an example in which the substrate 152 is provided over the protective layer 195 with the adhesive layer 142 therebetween, the adhesive layer 142 and the substrate 152 are not necessarily provided.

[Light-Emitting Device]

Figure 4A:
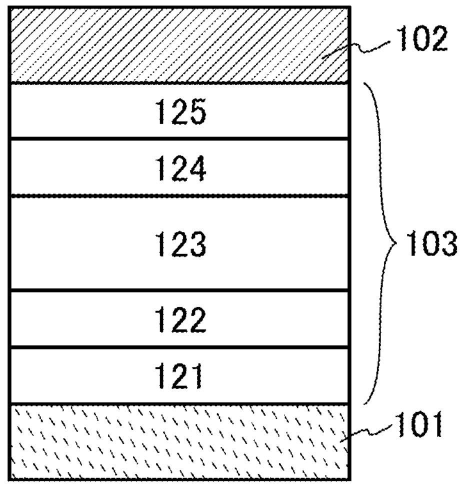
FIG. 4A to FIG. 4C are cross-sectional views each showing an example of a light-emitting device.
Figure 4B:
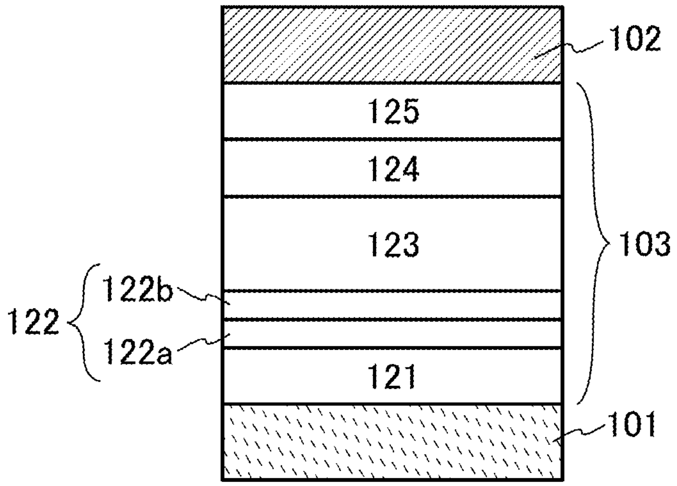
Figure 4C:
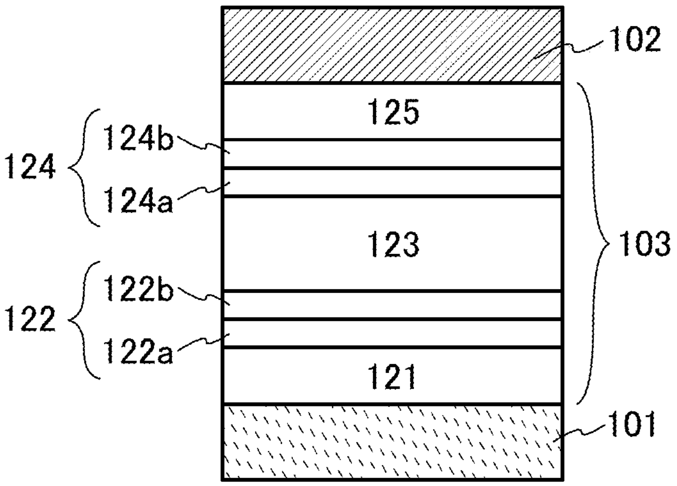

FIG. 4A to FIG. 4C each illustrate an example of a light-emitting device that can be used for the display device of this embodiment.

A light-emitting device illustrated in FIG. 4A includes an anode 101, an EL layer 103, and a cathode 102. The EL layer 103 includes a hole-injection layer 121, a hole-transport layer 122, a light-emitting layer 123, an electron-transport layer 124, and an electron-injection layer 125 from the anode 101 side. Although not illustrated in FIG. 4A to FIG. 4C, the light-emitting device may include an optical adjustment layer.

Each of the anode 101, the cathode 102, the hole-injection layer 121, the hole-transport layer 122, the light-emitting layer 123, the electron-transport layer 124, and the electron-injection layer 125 may have a single-layer structure or a stacked-layer structure.

The hole-transport layer 122 included in each of the light-emitting devices illustrated in FIG. 4B and FIG. 4C has a two-layer structure of a hole-transport layer 122*a* on the hole-injection layer 121 side and a hole-transport layer 122*b* on the light-emitting layer 123 side.

The electron-transport layer 124 included in the light-emitting device illustrated in FIG. 4C has a two-layer structure of an electron-transport layer 124*a* on the light-emitting layer 123 side and an electron-transport layer 124*b* on the electron-injection layer 125 side.

Materials that can be used in the light-emitting device will be described below.

<Electrode>

As a material that forms the pair of electrodes of the light-emitting device, a metal, an alloy, an electrically conductive compound, a mixture thereof, and the like can be used as appropriate. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

To manufacture a light-emitting device having a microcavity structure, a reflective electrode and a transflective electrode are used. Thus, a single layer or stacked layers can be formed using one or more desired conductive materials. For fabrication of the electrodes, a sputtering method or a vacuum evaporation method can be used.

<Hole-Injection Layer>

The hole-injection layer 121 contains an electron-accepting material and a hole-transport material.

The electron-accepting material exhibits an electron-accepting property with respect to the hole-transport material.

The highest occupied molecular orbital level (HOMO level) of the hole-transport material is preferably relatively low (deep). Specifically, the HOMO level of the hole-transport material is preferably higher than or equal to −5.7 eV and lower than or equal to −5.4 eV. A relatively low HOMO level of the hole-transport material is preferable because hole injection into the hole-transport layer 122 can be easily performed.

As the electron-accepting material, an organic compound including an electron-withdrawing group (particularly a cyano group or a halogen group such as a fluoro group) can be used.

Examples of the electron-accepting material include 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylen-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is preferable because it is thermally stable. Alternatively, a [3]radialene derivative including an electron-withdrawing group (in particular, a cyano group or a halogen group such as a fluoro group) is preferable because it has a very high electron-accepting property. Examples of the [3]radialene derivative including an electron-withdrawing group include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The hole-transport material has a hole-transport property higher than an electron-transport property. The hole-transport material preferably includes at least one of a carbazole skeleton, a dibenzofuran skeleton, a dibenzothiophene skeleton, and an anthracene skeleton. The hole-transport material may be an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of the amine through an arylene group.

The hole-transport material including an N,N-bis(4-biphenyl)amino group is preferred because a light-emitting device having a long lifetime can be manufactured.

Examples of the hole-transport material include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4-(2;1'-binaphthyl-6-yl)-4',4"-diphenyltriphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4-(6;2'-binaphthyl-2-yl)-4',4"-diphenyltriphenylamine (abbreviation: BBA(βN2)B), 4-(2;2'-binaphthyl-7-yl)-4',4"-diphenyltriphenylamine (abbreviation: BBA(βN2)B-03), 4-(1;2'-binaphthyl-4-yl)-4',4"-diphenyltriphenylamine (abbreviation: BBAβNαNB), 4-(1;2'-binaphthyl-5-yl)-4',4"-diphenyltriphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-(1-naphthyl)-4'-phenyltriphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

<Hole-Transport Layer>

The hole-transport layer 122 is a layer that transports holes injected by the hole-injection layer 121, to the light-emitting layer 123.

The hole-transport layer 122 contains a hole-transport material. For the hole-transport layer 122, a hole-transport material that can be used for the hole-injection layer 121 can be used. In the case where the hole-transport layer 122 has a stacked-layer structure, the hole-transport layer **122*b* on the light-emitting layer 123** side preferably has a function of an electron-blocking layer.

The HOMO level of the hole-transport material used for the hole-transport layer 122 is preferably lower than or equal to the HOMO level of the hole-transport material used for the hole-injection layer 121. A difference between the HOMO level of the hole-transport material used for the hole-transport layer 122 and the HOMO level of the hole-transport material used for the hole-injection layer 121 is preferably 0.2 eV or less. It is further preferable that the hole-transport material used for the hole-injection layer 121 and the hole-transport material used for the hole-transport layer 122 be the same because hole injection can be performed smoothly.

In the case where the hole-transport layer 122 has a stacked-layer structure, the HOMO level of the hole-transport material used for the hole-transport layer **122*b* formed on the light-emitting layer 123 side is preferably lower than the HOMO level of the hole-transport material used for the hole-transport layer 122*a* formed on the hole-injection layer 121 side. Furthermore, a difference in the HOMO level between the two hole-transport materials is preferably 0.2 eV or less. Owing to the above-described relation between the HOMO levels of the hole-transport materials used for the hole-injection layer 121 and the hole-transport layer 122 having a stacked-layer structure, holes can be injected into each layer smoothly, which can prevent an increase in driving voltage and deficiency of holes in the light-emitting layer 123**.

It is preferable that the hole-transport materials used for the hole-injection layer 121 and the hole-transport layer 122 having a stacked-layer structure each include a hole-transport skeleton. A carbazole skeleton, a dibenzofuran skeleton, a dibenzothiophene skeleton, and an anthracene skeleton, with which the HOMO levels of the hole-transport materials do not become too high (shallow), are preferably used as the hole-transport skeleton.

The hole-transport materials used for the adjacent layers of the hole-injection layer 121 and the hole-transport layer 122 having a stacked-layer structure preferably include the same hole-transport skeleton (in particular, a dibenzofuran skeleton), in which case holes can be injected smoothly.

The hole-transport materials used for the adjacent layers of the hole-injection layer 121 and the hole-transport layer 122 having a stacked-layer structure are preferably the same, in which case holes can be injected more smoothly into the adjacent layer in the cathode 102 direction.

<Light-Emitting Layer>

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

The light-emitting layer may contain one or more kinds of organic compounds (e.g., a host material and an assist material) in addition to the light-emitting substance (a guest material). As the one or more kinds of organic compounds, one or both of the hole-transport material and the electron-transport material described in this embodiment can be used. As the one or more kinds of organic compounds, a bipolar material may be used.

There is no particular limitation on the light-emitting substance that can be used for the light-emitting layer, and it is possible to use a light-emitting substance that converts singlet excitation energy into light emission in the visible light range or the near-infrared light range or a light-emitting substance that converts triplet excitation energy into light emission in the visible light range or the near-infrared light range.

As an example of the light-emitting substance that converts singlet excitation energy into light, a fluorescent substance can be given; examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b]naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine] (abbreviation: 1,6BnfAPrn-02), and N,N-(pyrene-1,6-diyl)bis[(6,N-diphenylbenzo[b]naphtho[1,2-d]furan)-8-amine] (abbreviation: 1,6BnfAPrn-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), or the like.

Examples of the light-emitting substance that converts triplet excitation energy into light include a phosphorescent substance and a thermally activated delayed fluorescent (TADF) material that exhibits thermally activated delayed fluorescence.

Examples of the phosphorescent substance include an organometallic complex (particularly an iridium complex) including a 4H-triazole skeleton, a 1H-triazole skeleton, an imidazole skeleton, a pyrimidine skeleton, a pyrazine skeleton, or a pyridine skeleton; an organometallic complex (particularly an iridium complex) in which a phenylpyridine derivative including an electron-withdrawing group is a ligand; a platinum complex; and a rare earth metal complex.

As a phosphorescent substance that emits blue or green light and whose emission spectrum has a peak wavelength at greater than or equal to 450 nm and less than or equal to 570 nm, the following substances can be given.

The examples include organometallic complexes including a 4H-triazole skeleton, such as tris{2-[5-(2-methylphenyl)-4-(2,6-dimethylphenyl)-4H-1,2,4-triazol-3-yl-κN2]phenyl-KC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: Ir(iPr5btz)$_3$]); organometallic complexes including a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes including an imidazole skeleton, such as fac-tris[1-(2,6-diisopropylphenyl)-2-phenyl-1H-imidazole]iridium(III) (abbreviation: [Ir(iPrpmi)$_3$]), and tris[3-(2,6-dimethylphenyl)-7-methylimidazo[1,2-f]phenanthridinato]iridium(III) (abbreviation: [Ir(dmpimpt-Me)$_3$]); organometallic complexes in which a phenylpyridine derivative including an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)); and the like.

As a phosphorescent substance that emits green or yellow light and whose emission spectrum has a peak wavelength at greater than or equal to 495 nm and less than or equal to 590 nm, the following substances can be given.

The examples include organometallic iridium complexes including a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN3]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes including a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes including a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), bis(2-phenylquinolinato-N,C$^{2'}$)iridium(III) acetylacetonate (abbreviation: [Ir(pq)$_2$(acac)]), [2-(4-phenyl-2-pyridinyl-κN)phenyl-κC]bis[2-(2-pyridinyl-κN)phenyl-κC]iridium(III) (abbreviation: [Ir(ppy)$_2$(4dppy)]), and bis[2-(2-pyridinyl-κN)phenyl-κC][2-(4-methyl-5-phenyl-2-pyridinyl-N)phenyl-κC]; organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato) (monophenanthroline) terbium(III) (abbreviation: [Tb(acac)$_3$(Phen)]).

As a phosphorescent substance that emits yellow or red light and whose emission spectrum has a peak wavelength at greater than or equal to 570 nm and less than or equal to 750 nm, the following substances can be given.

The examples include organometallic complexes including a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), bis[4,6-di(naphthalen-1-yl)pyrimidinato] (dipivaloylmethanato)iridium(III) (abbreviation: [Ir(d1npm)$_2$(dpm)]), and tris(4-t-butyl-6-phenylpyrimidinato)iridium(III) (abbreviation: [Ir(tBuppm)$_3$]); organometallic complexes including a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-N]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-N]phenyl-κC}(2,2,6,6-tetramethyl-3,5-heptanedionato-κ$^2$O,O')iridium(III) (abbreviation: [Ir(dmdppr-dmCP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), (acetylacetonato)bis[2,3-bis(4-fluorophenyl)quinoxalinato]iridium(III) (abbreviation: [Ir(Fdpq)$_2$(acac)]), and bis{4,6-dimethyl-2-[5-(5-cyano-2-methylphenyl)-3-(3,5-dimethylphenyl)-2-pyrazinyl-N]phenyl-κC}(2,2,6,6-tetramethyl-3,5-heptanedionato-κ$^2$O,O')iridium(III) (abbreviation: [Ir(dmdppr-m5CP)$_2$(dpm)]); organometallic complexes including a pyridine skeleton, such as tris(1-phenylisoquinolinato-N,C$^{2'}$)iridium(III) (abbreviation: [Ir(piq)$_3$]), bis(1-phenylisoquinolinato-N,C$^{2'}$)iridium(III) acetylacetonate (abbreviation: [Ir(piq)$_2$(acac)]), and bis[4,6-dimethyl-2-(2-quinolinyl-κN)phenyl-κC] (2,4-pentanedionato-κ$^2$O,O')iridium(III); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato) (monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]).

As the organic compounds (e.g., the host material and the assist material) used in the light-emitting layer, one or more kinds of substances having a larger energy gap than the light-emitting substance can be used.

As an organic compound used in combination with the fluorescent substance, it is preferable to use an organic compound that has a high energy level in a singlet excited state and has a low energy level in a triplet excited state.

In terms of a preferable combination with the light-emitting substance (the fluorescent substance or the phosphorescent substance), specific examples of the organic compounds are shown below though some of them overlap the specific examples shown above.

Examples of the organic compound that can be used in combination with the fluorescent substance include fused polycyclic aromatic compounds, such as an anthracene derivative, a tetracene derivative, a phenanthrene derivative, a pyrene derivative, a chrysene derivative, and a dibenzo[g,p]chrysene derivative.

Specific examples of the organic compound (the host material) used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N'-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N",N",N"',N"'-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)-biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

As the organic compound used in combination with the phosphorescent substance, an organic compound that has higher triplet excitation energy (energy difference between a ground state and a triplet excited state) than the light-emitting substance is selected.

In the case where a plurality of organic compounds (e.g., a first host material and a second host material (or an assist material)) are used in combination with the light-emitting substance in order to form an exciplex, the plurality of organic compounds are preferably mixed with a phosphorescent substance (particularly an organometallic complex).

Such a structure makes it possible to efficiently obtain light emission utilizing ExTET (Exciplex-Triplet Energy Transfer), which is energy transfer from an exciplex to a light-emitting substance. Note that a combination of a plurality of organic compounds that easily forms an exciplex is preferable, and it is particularly preferable to combine a compound that easily accepts holes (a hole-transport material) and a compound that easily accepts electrons (an electron-transport material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. As the hole-transport material and the electron-transport material, specifically, any of the materials described in this embodiment can be used. With this structure, high efficiency, low voltage, and a long lifetime of the light-emitting device can be achieved at the same time.

In a combination of materials for forming an exciplex, the HOMO level of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

Examples of the organic compound that can be used in combination with the phosphorescent substance include an aromatic amine (a compound including an aromatic amine skeleton), a carbazole derivative (a compound including a carbazole skeleton), a dibenzothiophene derivative (a thiophene derivative), a dibenzofuran derivative (a furan derivative), a zinc- or aluminum-based metal complex, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative.

Specific examples of the aromatic amine, the carbazole derivative, the dibenzothiophene derivative, and the dibenzofuran derivative, which are organic compounds having a high hole-transport property, are given below.

Examples of the carbazole derivative include a bicarbazole derivative (e.g., a 3,3'-bicarbazole derivative) and an aromatic amine including a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(1,1'-biphenyl-4-yl)-3,3'-bi-9H-carbazole, 9,9'-bis(1,1'-biphenyl-3-yl)-3,3'-bi-9H-carbazole, 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the aromatic amine including a carbazolyl group include PCBA1BP, N-(4-biphenyl)-N-(9,9-dimethyl-9H-fluoren-2-yl)-9-phenyl-9H-carbazol-3-amine (abbreviation: PCBiF), PCBBiF, PCBBi1BP, PCBANB, PCBNBB, 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), PCBASF, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N'-diphenyl-9,9-dimethylfluorene-2,7-diamine (abbreviation: YGA2F), and 4,4',4"-tris(carbazol-9-yl)triphenylamine (abbreviation: TCTA).

In addition to the above, other examples of the carbazole derivative include 3-[4-(9-phenanthryl)-phenyl]-9-phenyl-9H-carbazole (abbreviation: PCPPn), PCPN, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and CzPA.

Specific examples of the thiophene derivative (a compound including a thiophene skeleton) and the furan derivative (a compound including a furan skeleton) include compounds including a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), and 4-{3-[3-(9-phenyl-9H-fluoren-9-yl)phenyl]phenyl}dibenzofuran (abbreviation: mmDBFFLBi-II).

Specific examples of the aromatic amine include 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), BPAFLP, mBPAFLP, N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]spiro-9,9'-bifluorene (abbreviation: DPA2SF), 4,4',4"-tris[N-(1-naphthyl)-N-phenylamino]triphenylamine (abbreviation: 1'-TNATA), TDATA, m-MTDATA, N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

As the organic compound having a high hole-transport property, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), or poly[N,N'-bis(4-butylphenyl)-N,N'-bis(phenyl)benzidine] (abbreviation: Poly-TPD) can also be used.

Specific examples of the zinc- and aluminum-based metal complexes, which are organic compounds having a high electron-transport property, include metal complexes including a quinoline skeleton or a benzoquinoline skeleton, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq).

A metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used.

Specific examples of the oxadiazole derivative, the triazole derivative, the benzimidazole derivative, the quinoxaline derivative, the dibenzoquinoxaline derivative, and the phenanthroline derivative, which are organic compounds having a high electron-transport property, include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol-2-yl)stilbene (abbreviation: BzOs), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Specific examples of a heterocyclic compound having a diazine skeleton, a heterocyclic compound having a triazine skeleton, and a heterocyclic compound having a pyridine skeleton, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), and 1,3,5-tri[3-(3-pyridyl)phenyl]benzene (abbreviation: TmPyPB).

As the organic compound having a high electron-transport property, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used.

The TADF material is a material that has a small difference between the Si level and the $T_1$ level and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into light emission. Thermally activated delayed fluorescence is efficiently obtained under the condition where the difference in energy between the Si level and the $T_1$ level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

An exciplex whose excited state is formed by two kinds of substances has an extremely small difference between the Si level and the $T_1$ level and functions as a TADF material that can convert triplet excitation energy into singlet excitation energy.

A phosphorescent spectrum observed at low temperatures (e.g., 77 K to 10 K) is used for an index of the T1 level. When the level of energy with a wavelength of the line obtained by extrapolating a tangent to the fluorescent spectrum at a tail on the short wavelength side is the $S_1$ level and the level of energy with a wavelength of the line obtained by extrapolating a tangent to the phosphorescent spectrum at a tail on the short wavelength side is the $T_1$ level, the difference between $S_1$ and $T_1$ of the TADF material is preferably less than or equal to 0.3 eV, further preferably less than or equal to 0.2 eV.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

Other than these, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), PCCzPTzn, 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02) can be used.

The heterocyclic compound is preferable because of having both a high electron-transport property and a high hole-transport property owing to a π-electron rich heteroaromatic ring and a π-electron deficient heteroaromatic ring. Among skeletons having a π-electron deficient heteroaromatic ring, a pyridine skeleton, a diazine skeleton (a pyrimidine skeleton, a pyrazine skeleton, or a pyridazine skeleton), and a triazine skeleton are particularly preferable because of their high stability and reliability. In particular, a benzofuropyrimidine skeleton, a benzothienopyrimidine skeleton, a benzofuropyrazine skeleton, and a benzothienopyrazine skeleton are preferable because of their high electron-accepting properties and reliability.

Among skeletons having a π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. Note that a dibenzofuran skeleton and a dibenzothiophene skeleton are preferable as the furan skeleton and the thiophene skeleton, respectively. As the pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which a π-electron rich heteroaromatic ring and a π-electron deficient heteroaromatic ring are directly bonded to each other is particularly preferable because the electron-donating property of the π-electron rich heteroaromatic ring and the electron-accepting property of the π-electron deficient heteroaromatic ring are both increased and the energy difference between the $S_1$ level (the energy level in a singlet excited state) and the $T_1$ level (the energy level in a triplet excited state) becomes small, and thus thermally activated delayed fluorescence can be obtained efficiently. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring including a nitrile group or a cyano group, such as benzo-nitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

Note that the TADF material can also be used in combination with another organic compound. In particular, the TADF material can be used in combination with the host material, the hole-transport material, and the electron-transport material described above. In the case of using the TADF material, the $S_1$ level of the host material is preferably higher than the $S_1$ level of the TADF material. In addition, the $T_1$ level of the host material is preferably higher than the $T_1$ level of the TADF material.

Alternatively, the TADF material may be used as a host material, and a fluorescent substance may be used as a guest material. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. At this time, the TADF material functions as an energy donor, and the light-emitting substance functions as an energy acceptor. Therefore, the use of the TADF material as the host material is very effective in the case where a fluorescent substance is used as the guest material. In that case, the $S_1$ level of the TADF material is preferably higher than the $S_1$ level of the fluorescent substance in order that high emission efficiency can be achieved. Furthermore, the $T_1$ level of the TADF material is preferably higher than the $S_1$ level of the fluorescent substance. Therefore, the $T_1$ level of the TADF material is preferably higher than the $T_1$ level of the fluorescent substance.

It is preferable to use a TADF material that exhibits light emission whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order that singlet excitation energy is efficiently generated from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon group are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituent having no π bond has a poor carrier-transport property, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

<Electron-Transport Layer>

The electron-transport layer 124 is a layer that transports electrons injected from the cathode 102, to the light-emitting layer 123.

The electron-transport layer 124 contains an electron-transport material.

The electron-transport material has an electron-transport property higher than a hole-transport property. The electron-transport material preferably has a HOMO level higher than or equal to −6.0 eV. The electron mobility of the electron-transport material is preferably higher than or equal to 1×10 7 $cm^2/Vs$ and lower than or equal to $5\times10^{-5}$ $cm^2/Vs$, further preferably higher than or equal to $1\times10^{-7}$ $cm^2/Vs$ and lower than or equal to $1\times10^{-5}$ $cm^2$ when the square root of electric field strength [V/cm] is 600.

The electron mobility of the electron-transport material with a HOMO level higher than or equal to −6.0 eV that is used for the electron-transport layer 124 (the electron mobility when the square root of electric field strength [V/cm] is 600) is preferably lower than the electron mobility of the host material used for the light-emitting layer 123. The amount of electrons injected into the light-emitting layer 123 can be controlled by reduction in the electron-transport property of the electron-transport layer 124, whereby the light-emitting layer 123 can be prevented from having excess electrons.

The electron-transport material preferably has an anthracene skeleton, and further preferably has an anthracene skeleton and a heterocyclic skeleton. The heterocyclic skeleton is preferably a nitrogen-containing five-membered ring skeleton. It is particularly preferable that the nitrogen-containing five-membered ring skeleton include two heteroatoms in a ring, like a pyrazol ring, an imidazole ring, an oxazole ring, or, a thiazole ring. In addition, some of the above-described electron-transport materials that can be used as the host material, and the above-described substances given as materials that can be used as the host material in combination with the above fluorescent substance can be used for the electron-transport layer 124.

It is preferable that the electron-transport layer 124 further contain an organometallic complex of an alkali metal or an alkaline earth metal.

As the organometallic complex of an alkali metal or an alkaline earth metal, an organic complex of lithium is preferable, and 8-quinolinolato-lithium (abbreviation: Liq) is particularly preferable.

Figure 5A:
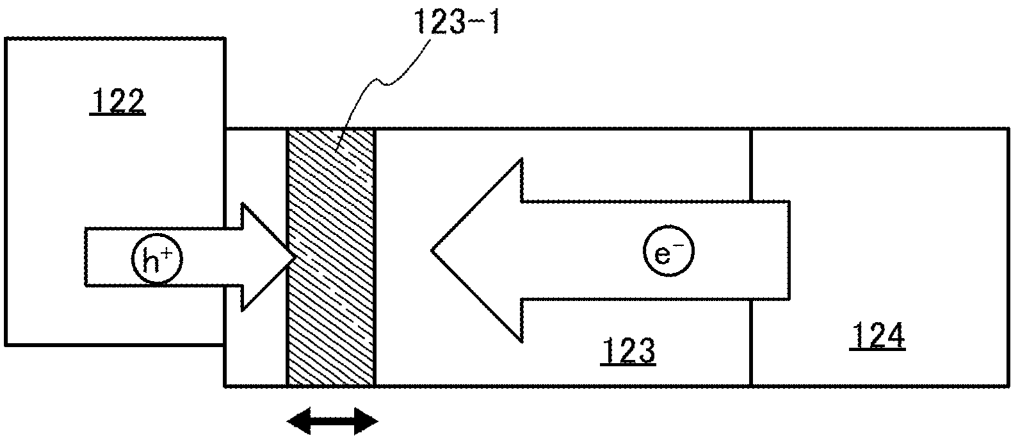
FIG. 5A and FIG. 5B are diagrams showing a light-emitting region of a light-emitting device.

When the light-emitting layer 123 has excess electrons, a light-emitting region 123-1 is limited to a part as illustrated in FIG. 5A and a great strain is imposed on the part, which accelerates degradation. In addition, electrons failing to recombine and passing through the light-emitting layer 123 also diminish a lifetime and emission efficiency. In one embodiment of the present invention, a reduction in the electron-transport property of the electron-transport layer

Figure 5B:
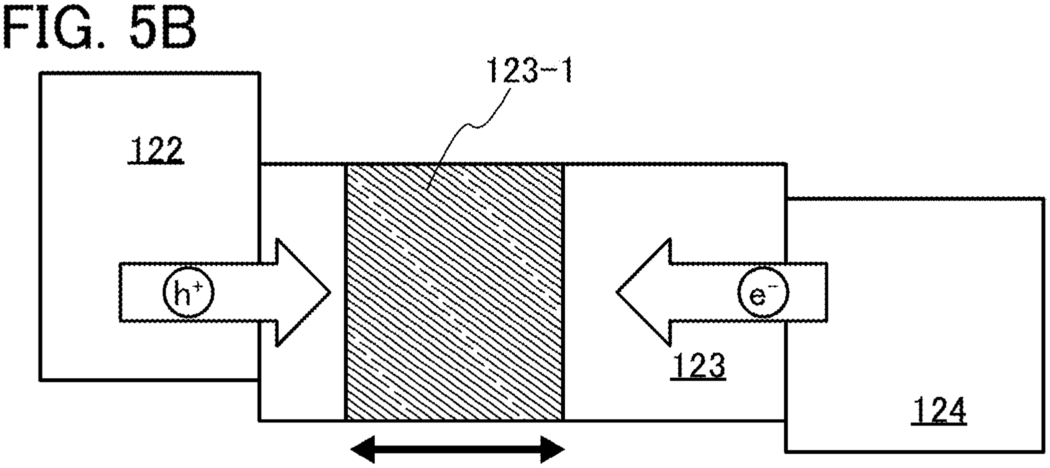

124 expands the light-emitting region 123-1 as illustrated in FIG. 5B and spreads the strain on the material contained in the light-emitting layer 123; thus, a light-emitting device having a long lifetime and high emission efficiency can be provided. Note that in FIG. 5A, FIG. 5B, FIG. 6A, and FIG. 6B, $e^-$ represents an electron and $h^+$ represents a hole.

Figure 5C:
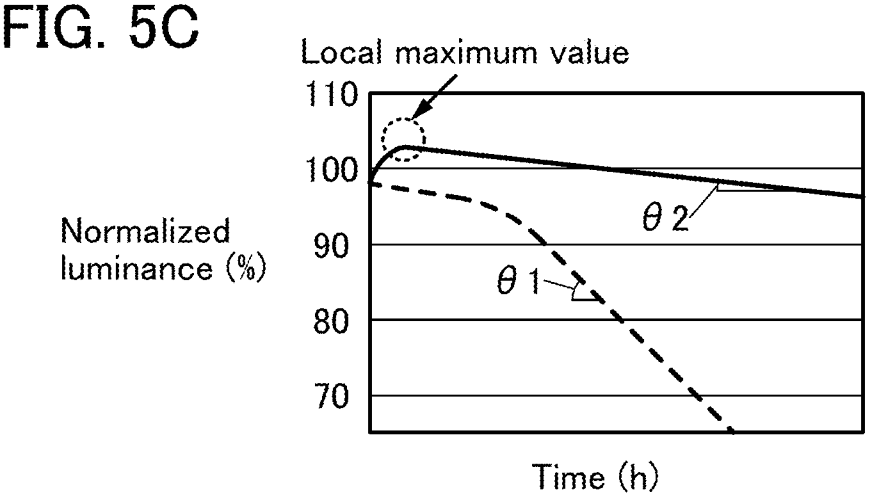
FIG. 5C is a diagram showing normalized luminance of a light-emitting device with time.

Here, normalized luminance with time of the light-emitting device of this embodiment and a comparative light-emitting device will be described with reference to FIG. 5C. In FIG. 5C, a thick solid line is a decay curve of normalized luminance of the light-emitting device of this embodiment, and a thick dashed line is a decay curve of normalized luminance of the comparative light-emitting device.

As shown in FIG. 5C, the slope of the decay curve of normalized luminance is different between the light-emitting device of this embodiment and the comparative light-emitting device. Specifically, a slope θ2 of the decay curve of the light-emitting device of this embodiment is smaller than a slope θ1 of the decay curve of the comparative light-emitting device.

As shown in FIG. 5C, the light-emitting device of this embodiment may have a local maximum value in the decay curve of luminance obtained in a driving test under a condition with a fixed current density. In other words, the decay curve of the light-emitting device of one embodiment of the present invention may have a portion where the luminance increases with time. The light-emitting device showing such a degradation behavior enables a rapid decay at the initial driving stage, which is called an initial decay, to be canceled out by the luminance increase. Thus, the light-emitting device can have an extremely long driving lifetime with a small initial decay.

A differential value of such a decay curve having the local maximum value is 0 in a part. The light-emitting device of one embodiment of the present invention with a decay curve having a differential value of 0 in a part has an extremely long lifetime with a small initial decay.

Figure 6A:
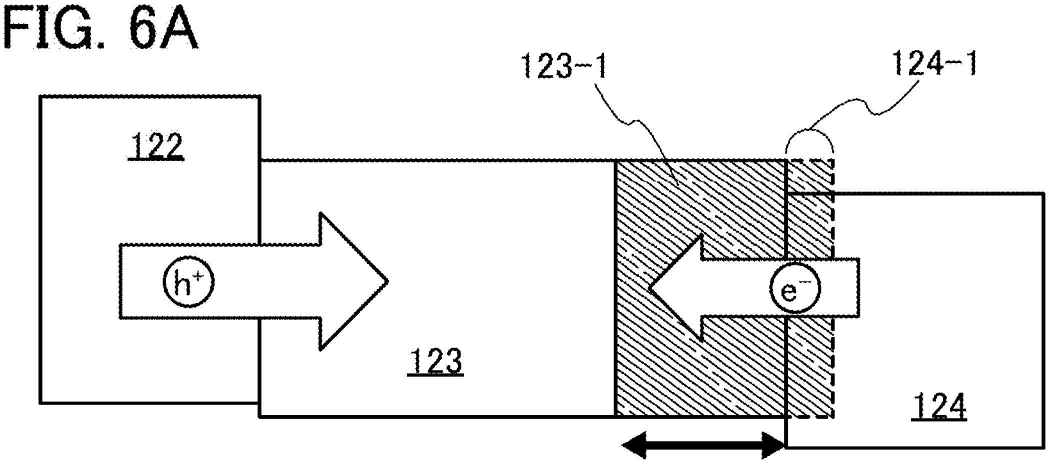
FIG. 6A and FIG. 6B are diagrams showing a light-emitting region of a light-emitting device.

Such a behavior of the decay curve is probably a phenomenon caused by recombination that occurs in a non-light-emitting recombination region 124-1 because of a low electron mobility in the electron-transport layer 124 and does not contribute to light emission, as illustrated in FIG. 6A. In the light-emitting device of one embodiment of the present invention having the above-described structure, a hole injection barrier is small at the initial driving stage and the electron-transport property of the electron-transport layer 124 is relatively low; accordingly, the light-emitting region 123-1 (i.e., a recombination region) is formed closer to the electron-transport layer 124 side. Since the HOMO level of the electron-transport material contained in the electron-transport layer 124 is higher than or equal to −6.0 eV, which is comparatively high, some holes reach the electron-transport layer 124 to cause recombination also in the electron-transport layer 124; thus, the non-light-emitting recombination region 124-1 is formed. Since the recombination region even reaches the inside of the electron-transport layer 124, a difference in the HOMO level between the electron-transport material and the organometallic complex contained in the electron-transport layer 124 is preferably 0.2 eV or less.

Figure 6B:
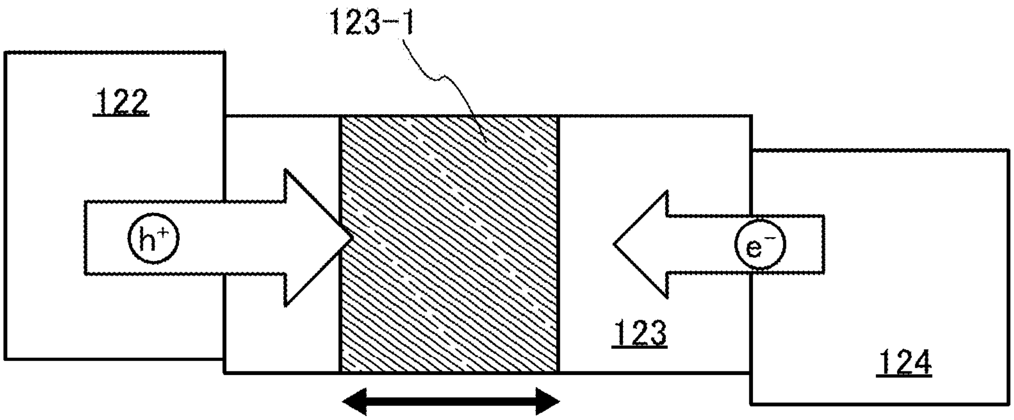

As the carrier balance changes with driving time, the light-emitting region 123-1 (recombination region) moves toward the hole-transport layer 122 side as illustrated in FIG. 6B. A reduction in the non-light-emitting recombination region 124-1 allows energy of recombining carriers to effectively contribute to light emission, so that the luminance increases as compared with that at the initial driving stage. This luminance increase cancels out the rapid luminance reduction at the initial driving stage of the light-emitting device, which is known as the initial decay; thus, the light-emitting device can have a long driving lifetime with a small initial decay. Note that in this specification and the like, the structure of the above-described light-emitting device may be referred to as a Recombination-Site Tailoring Injection structure (ReSTI structure).

When the initial decay can be reduced, the problem of burn-in, which has still been mentioned as a great drawback of organic EL devices, and the time and effort for aging for reducing the problem before shipment can be significantly reduced.

The light-emitting device of one embodiment of the present invention having the above structure has a long lifetime and high reliability.

It is preferable that a portion exist in the electron-transport layer 124 whose mixing ratio of the electron-transport material to the organometallic complex of an alkali metal or an alkaline earth metal is different from that of another portion in the thickness direction. The electron-transport layer 124 may have a concentration gradient and may have a stacked-layer structure of a plurality of layers having different mixing ratios of the electron-transport material to the organometallic complex of an alkali metal or an alkaline earth metal.

The mixing ratios can be estimated from the amount of atoms and molecules detected by time-of-flight secondary ion mass spectrometry (ToF-SIMS). In portions that contain the same two kinds of materials with different mixing ratios, values measured by ToF-SIMS analysis correspond to the amounts of target atoms or molecules. Therefore, comparing the detected amounts of the electron-transport material and the organometallic complex allows estimation of their mixing ratio.

The amount of the organometallic complex contained in the electron-transport layer 124 is preferably smaller on the cathode 102 side than on the anode 101 side. In other words, the electron-transport layer 124 is preferably formed such that the concentration of the organometallic complex increases from the cathode 102 side to the anode 101 side. That is, in the electron-transport layer 124, a portion where the amount of the electron-transport material is small is closer to the light-emitting layer 123 side than a portion where the amount of the electron-transport material is large is. In other words, it can be said that in the electron-transport layer 124, a portion where the amount of the organometallic complex is large is closer to the light-emitting layer 123 side than a portion where the amount of the organometallic complex is small is.

The electron mobility of the portion where the amount of the electron-transport material is large (the portion where the amount of the organometallic complex is small) is preferably higher than or equal to $1\times10^{-7}$ $cm^2/Vs$ and lower than or equal to $5\times10^{-5}$ $cm^2/Vs$ when the square root of electric field strength [V/cm] is 600.

In the case where the electron-transport layer 124 has a stacked-layer structure as illustrated in FIG. 4C, it is preferable that the electron-transport layer 124*a* formed on the light-emitting layer 123 side and the electron-transport layer 124*b* formed on the electron-injection layer 125 side have different mixing ratios of the electron-transport material to the organometallic complex. It is preferable that the amount of the organometallic complex in the electron-transport layer 124*a* be larger than the amount of the organometallic complex in the electron-transport layer 124*b* and that the amount of the electron-transport material in the electron-transport layer 124*a* be smaller than the amount of the electron-transport material in the electron-transport layer 124*b*. Note that the mixing ratios can be estimated from the amount of atoms and molecules detected by ToF-SIMS analysis as described above.

The electron-transport layer 124*a* only has to be provided closer to the light-emitting layer 123 side than the electron-transport layer 124*b* is, and another layer may exist between the electron-transport layer 124*a* and the electron-transport layer 124*b*.

Figure 7A:
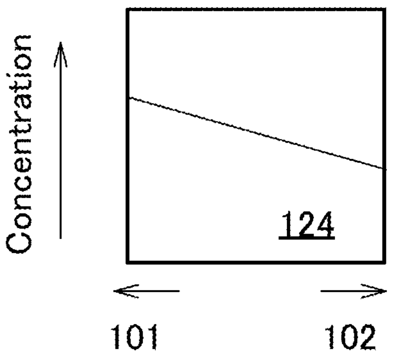
FIG. 7A to FIG. 7D are diagrams each showing the concentration of an organometallic complex in an electron-transport layer.
Figure 7B:
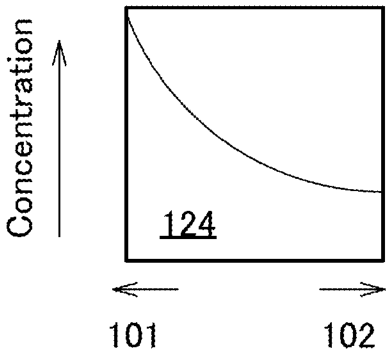
Figure 7C:
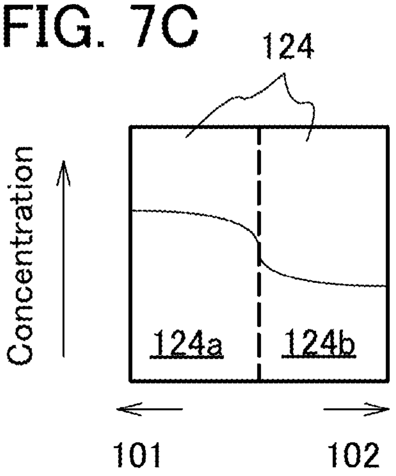
Figure 7D:
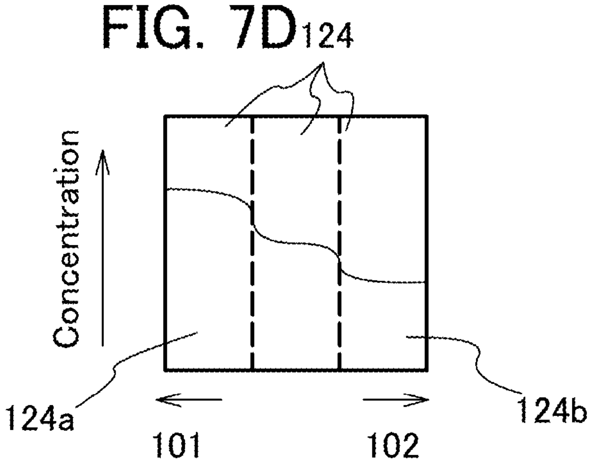

In the case where there is no clear boundary between layers in the electron-transport layer 124, the ratio of the electron-transport material to the organometallic complex may change continuously as illustrated in FIG. 7A and FIG. 7B. In the case where the electron-transport layer 124 has a stacked-layer structure, the ratio may change in a stepwise manner as illustrated in FIG. 7C and FIG. 7D. In any case, it is important that in the electron-transport layer 124, a region where the concentration of the organometallic complex is high is provided closer to the light-emitting layer 123 side than a region where the concentration of the organometallic complex is low, which limits the electron mobility. Note that although a method for estimating the amount, the concentration, and the mixing ratio by ToF-SIMS is described for convenience in this specification, another detection method may be employed as long as the amount, the concentration, and the mixing ratio can be verified.

A change in carrier balance in the light-emitting device of one embodiment of the present invention is probably caused by a change in electron mobility of the electron-transport layer 124. There is a concentration difference of the organometallic complex of an alkali metal or an alkaline earth metal in the electron-transport layer 124 of the light-emitting device of one embodiment of the present invention. The electron-transport layer 124 includes a region with a high concentration of the organometallic complex between a region with a low concentration of the organometallic complex and the light-emitting layer 123. That is, the region with a low concentration of the organometallic complex is closer to the cathode 102 side than the region with a high concentration is. Since the electron mobility of the electron-transport layer 124 becomes higher as the concentration of the organometallic complex is higher, the electron mobility of the electron-transport layer 124 is limited by the region with a low concentration of the organometallic complex.

The present inventors have found that an organometallic complex of an alkali metal or an alkaline earth metal diffuses from the anode 101 side to the cathode 102 side (from the region with a high concentration to the region with a low concentration) by voltage applied to the light-emitting device for driving. Since the region with a high concentration of the organometallic complex is closer to the anode 101 side than the region with a low concentration of the organometallic complex is, the electron mobility of the electron-transport layer 124 increases with driving. This causes a change in carrier balance in the light-emitting device, which is accompanied by the movement of the recombination region; thus, the light-emitting device with the above decay curve and a long lifetime can be obtained.

The light-emitting device of one embodiment of the present invention having the above structure has an extremely long lifetime. In particular, a lifetime in a region with extremely small decay, i.e., approximately LT95 (a time taken until the luminance decreases to 95% of the initial luminance), can be significantly extended.

<Electron-Injection Layer>

The electron-injection layer 125 is a layer that increases the injection efficiency of electrons from the cathode 102. The difference between the work function of the material of the cathode 102 and the LUMO level of the material used for the electron-injection layer 125 is preferably small (0.5 eV or less).

The electron-injection layer 125 can be formed using an alkali metal, an alkaline earth metal, or a compound thereof, such as lithium, cesium, lithium fluoride (LiF), cesium fluoride (CsF), calcium fluoride ($CaF_2$), 8-quinolinolato-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolato-lithium (abbreviation: LiPPP), lithium oxide ($LiO_x$), or cesium carbonate. A rare earth metal compound like erbium fluoride ($ErF_3$) can also be used. In addition, an electrode may be used for the electron-injection layer. Examples of the electrode include a substance in which electrons are added at high concentration to calcium oxide-aluminum oxide. Any of the above-described substances for forming the electron-transport layer can also be used.

For the electron-injection layer, a composite material containing an electron-transport material and a donor material (an electron-donating material) may be used. Such a composite material is excellent in an electron-injection property and an electron-transport property because electrons are generated in the organic compound by the electron donor. The organic compound here is preferably a material excellent in transporting the generated electrons; specifically, for example, the above-described electron-transport materials (e.g., a metal complex or a heteroaromatic compound) can be used. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. An organic compound such as tetrathiafulvalene (abbreviation: TTF) can also be used.

For manufacture of the light-emitting device of one embodiment of the present invention, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Materials of the functional layers included in the light-emitting device are not limited to the above-described corresponding materials. For example, as the materials of the functional layers, a high molecular compound (e.g., an oligomer, a dendrimer, and a polymer), a middle molecular compound (a compound between a low molecular compound and a high molecular compound with a molecular weight of 400 to 4000), or an inorganic compound (e.g., a quantum dot material) may be used. As the quantum dot material, a colloidal quantum dot material, an alloyed quantum dot material, a core-shell quantum dot material, a core quantum dot material, or the like can be used.

The detailed structure of the display device of one embodiment of the present invention is described below with reference to FIG. 8 to FIG. 10 and FIG. 22.

[Layout of Pixels in Display Device]

FIG. 22A to FIG. 22D illustrate examples of a layout of pixels in a display device. Note that the layout, size, shape, and the like of the pixels are not limited thereto.

Figure 22A:
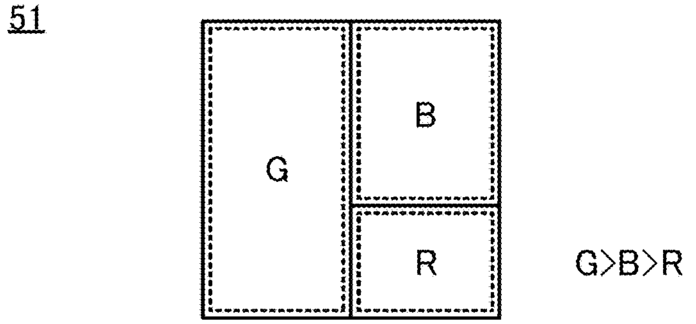
FIG. 22A to FIG. 22D are top views each showing an example of a pixel layout.
Figure 22B:
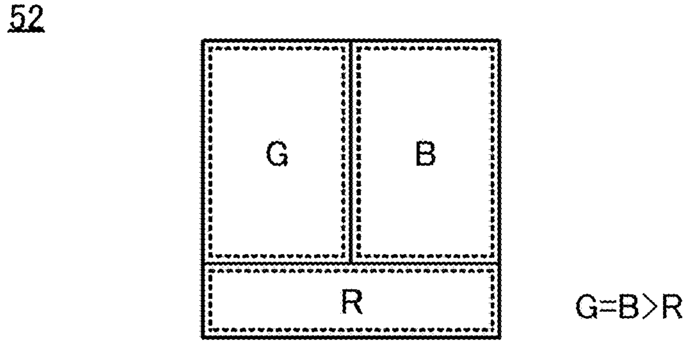
Figure 22C:
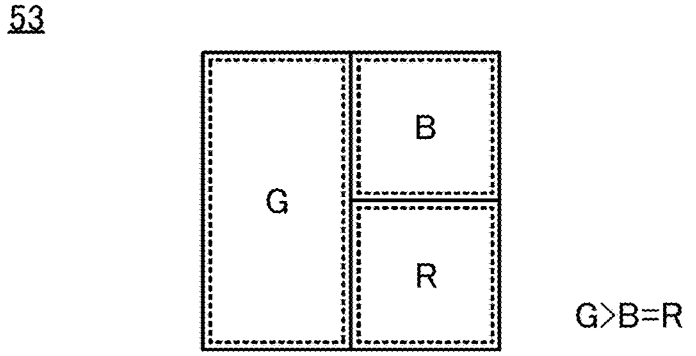

In FIG. 22A to FIG. 22C, a display device in which subpixels of three colors of R (red), G (green), and B (blue) express one color is described as an example. In the display device of one embodiment of the present invention, there is no limitation on kinds and the number of the color elements, and a color other than RGB (e.g., white, yellow, cyan, or magenta) may be used. In FIG. 22A to FIG. 22C, a light-emitting region of each subpixel is indicated by a dotted line.

In each of a pixel 51 illustrated in FIG. 22A, a pixel 52 illustrated in FIG. 22B, and a pixel 53 illustrated in FIG. 22C, the area of the light-emitting region of the green subpixel is larger than the area of the light-emitting region of the red subpixel.

The pixel 51 is an example in which the area of the light-emitting region of the blue subpixel is smaller than the area of the light-emitting region of the green subpixel and larger than the area of the light-emitting region of the red subpixel.

The pixel 52 is an example in which the area of the light-emitting region of the blue subpixel is equal to the area of the light-emitting region of the green subpixel and larger than the area of the light-emitting region of the red subpixel.

The pixel 53 is an example in which the area of the light-emitting region of the blue subpixel is smaller than the area of the light-emitting region of the green subpixel and equal to the area of the light-emitting region of the red subpixel.

For example, it is preferable that a light-emitting device that exhibits phosphorescence be used for each of the green subpixel and the red subpixel and a light-emitting device that exhibits fluorescence be used for the blue subpixel.

Here, a light-emitting device that exhibits phosphorescence with shorter wavelength has higher triplet excitation energies of a light-emitting substance and a host material and an absorption edge on a shorter wavelength side. Therefore, in the case where the light-emitting device that emits green light and the light-emitting device that emits red light exhibit phosphorescence, for example, the light-emitting device that emits green light tends to have lower reliability than the light-emitting device that emits red light. Thus, in a top view, the area of the light-emitting region of the light-emitting device that emits green light is preferably larger than the area of the light-emitting region of the light-emitting device that emits red light. Note that a plurality of subpixels of the same color may be provided in one pixel. In this case, the total area of the light-emitting region(s) of the green subpixel(s) is preferably larger than the total area of the light-emitting region(s) of the red subpixel(s). That is, in one pixel, the total area of the light-emitting region(s) of the light-emitting device(s) that emits (emit) green light is preferably larger than the total area of the light-emitting region(s) of the light-emitting device(s) that emits (emit) red light. Note that the area of a light-emitting region may be referred to as an aperture ratio.

The light-emitting device that emits blue light preferably exhibits fluorescence and has the above-described ReSTI structure. Thus, the initial decay of the light-emitting device that emits blue light can be inhibited and the driving lifetime can be extremely extended. In this case, in a top view, the area of the light-emitting region of the light-emitting device that emits blue light is preferably larger than or equal to the area of the light-emitting region of the light-emitting device that emits red light and smaller than or equal to the area of the light-emitting region of the light-emitting device that emits green light. In addition, the total area of the light-emitting region(s) of the blue subpixel(s) is preferably larger than or equal to the total area of the light-emitting region(s) of the red subpixel(s) and smaller than or equal to the total area of the light-emitting region(s) of the green subpixel(s). For example, in one pixel, the total area of the light-emitting region(s) of the light-emitting device(s) that emits (emit) blue light is preferably larger than or equal to the total area of the light-emitting region(s) of the light-emitting device(s) that emits (emit) red light and smaller than or equal to the total area of the light-emitting region(s) of the light-emitting device(s) that emits (emit) green light.

The light-emitting device included in the display device of this embodiment may also have a function of a light-receiving device. Alternatively, the display device of this embodiment may include a subpixel including a light-receiving device.

Figure 22D:
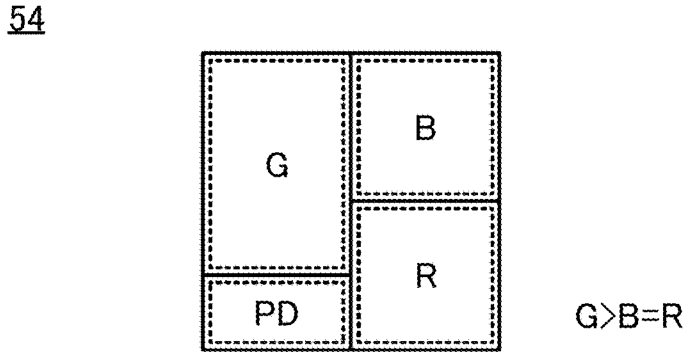

A pixel 54 illustrated in FIG. 22D includes a subpixel PD including a light-receiving device.

It is preferable that an organic EL device be used as the light-emitting device and an organic photodiode be used as the light-receiving device. The organic EL device and the organic photodiode can be formed over one substrate. Thus, the organic photodiode can be incorporated in the display device including the organic EL device.

Since a large number of layers (e.g., a hole-transport layer and an electron-transport layer) of the organic photodiode can be shared with the organic EL device, forming the common layers concurrently can inhibit an increase in the number of film formation steps. Even when the number of film formation steps is the same, reducing the number of layers formed only in either element can suppress the influence of deviation of a film formation pattern and the influence of dust (including small foreign substances called particles) attached to a deposition mask (e.g., a metal mask), for example. Thus, the yield in the manufacture of the display device can be increased. Note that a layer shared by the light-receiving device and the light-emitting device may have functions different in the light-receiving device and the light-emitting device.

When the light-receiving device is used as an image sensor, the display device of this embodiment can capture an image using the light-receiving device.

For example, when light-receiving devices are provided in the entire display portion, an image can be taken using the entire display portion and thus the display device can be used as a scanner (a color scanner).

For example, data on a fingerprint, a palm print, an iris, or the like can be obtained with the use of the image sensor. That is, a biological authentication sensor can be incorporated in the display device of this embodiment. When the display device incorporates a biological authentication sensor, the number of components of an electronic device can be reduced as compared to the case where a biological authentication sensor is provided separately from the display device; thus, the size and weight of the electronic device can be reduced. For example, when light-receiving devices are provided in the entire display portion, a region used for authentication can be expanded and data on a plurality of fingers can be obtained at once, leading to a raise in the security level, improvement in convenience, and the like.

In addition, data on facial expression, eye movement, change of the pupil diameter, or the like of the user can be obtained with the use of the image sensor. By analysis of the data, information on the user's physical and mental state can be obtained. Changing the output contents of one or both of display and sound on the basis of the information allows the user to safely use a device for VR (Virtual Reality), a device for AR (Augmented Reality), or a device for MR (Mixed Reality), for example.

When the light-receiving device is used as a touch sensor, the display device of this embodiment can detect the approach or contact of an object with the use of the light-receiving device.

[Display Device 100A]

Figure 8:
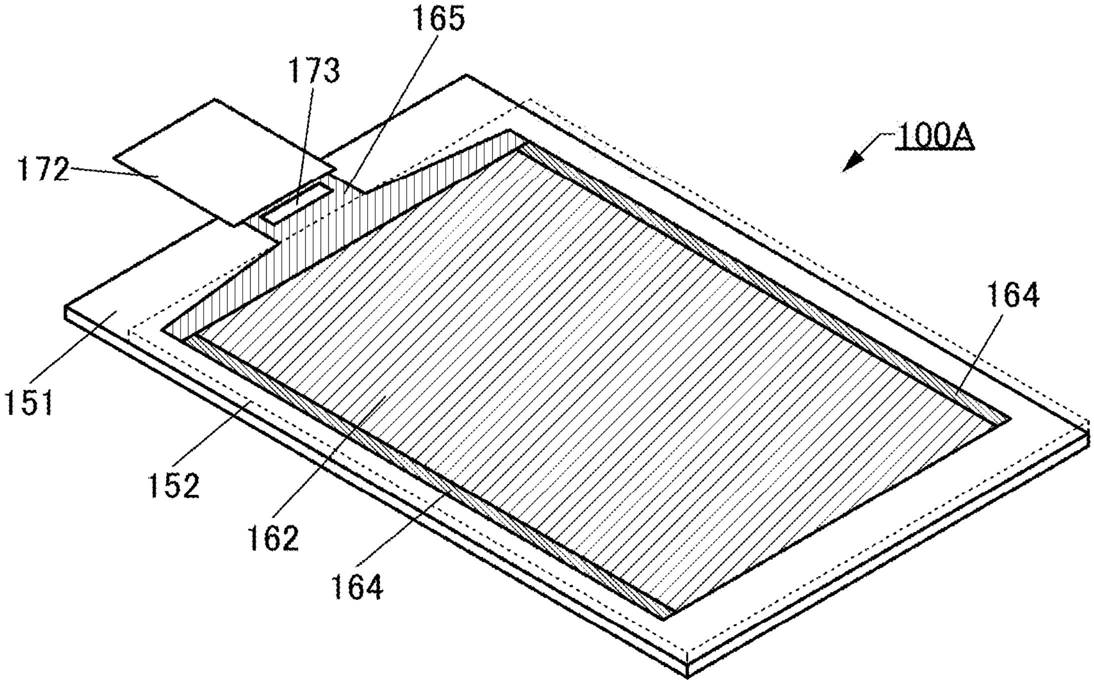
FIG. 8 is a perspective view showing an example of a display device.

FIG. 8 is a perspective view of a display device 100A, and FIG. 9A is a cross-sectional view of the display device 100A.

The display device 100A has a structure in which the substrate 152 and the substrate 151 are bonded to each other. In FIG. 8, the substrate 152 is denoted by a dashed line.

The display device 100A includes a display portion 162, a circuit 164, a wiring 165, and the like. FIG. 8 illustrates an example in which the display device 100A is provided with an IC (integrated circuit) 173 and an FPC 172. Thus, the structure illustrated in FIG. 8 can be regarded as a display module including the display device 100A, the IC, and the FPC.

As the circuit 164, for example, a scan line driver circuit can be used.

The wiring 165 has a function of supplying a signal and power to the display portion 162 and the circuit 164. The signal and the power are input to the wiring 165 from the outside through the FPC 172 or from the IC 173.

FIG. 8 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display device 100A and the display module may have a structure that does not include an IC. The IC may be provided over the FPC by a COF method or the like.

FIG. 9A illustrates an example of a cross section including part of a region including the FPC 172, part of the circuit 164, part of the display portion 162, and part of a region including an end portion in the display device 100A.

The display device 100A illustrated in FIG. 9A includes a transistor 201, transistors 205, the light-emitting device 190R, the light-emitting device 190G, the light-emitting device 190B, and the like between the substrate 151 and the substrate 152.

The protective layer 195 and the substrate 152 are bonded to each other with the adhesive layer 142 therebetween. A solid sealing structure, a hollow sealing structure, or the like can be employed to seal the light-emitting device 190. In FIG. 9A, a hollow sealing structure is employed in which a space 143 surrounded by the substrate 152, the adhesive layer 142, and the substrate 151 is filled with an inert gas (e.g., nitrogen or argon). The adhesive layer 142 may be provided to overlap with the light-emitting device 190. The space 143 surrounded by the substrate 152, the adhesive layer 142, and the substrate 151 may be filled with a resin different from that of the adhesive layer 142.

The light-emitting device 190R has a stacked-layer structure in which the pixel electrode 191, the optical adjustment layer 199R, the common layer 112, the light-emitting layer 193R, the common layer 114, and the common electrode 115 are stacked in this order from the insulating layer 214 side. Similarly, the light-emitting device 190G has a stacked-layer structure in which the pixel electrode 191, the optical adjustment layer 199G, the common layer 112, the light-emitting layer 193G, the common layer 114, and the common electrode 115 are stacked in this order from the insulating layer 214 side. Furthermore, the light-emitting device 190B has a stacked-layer structure in which the pixel electrode 191, the optical adjustment layer 199B, the common layer 112, the light-emitting layer 193B, the common layer 114, and the common electrode 115 are stacked in this order from the insulating layer 214 side.

The pixel electrode 191 is connected to a conductive layer 222*b* included in the transistor 205 through an opening provided in the insulating layer 214.

The end portion of the pixel electrode 191 is covered with the partition 216. The pixel electrode 191 contains a material that reflects visible light, and the common electrode 115 contains a material that transmits visible light.

Light emitted from the light-emitting device 190 is emitted to the substrate 152 side. For the substrate 152, a material having a high visible-light-transmitting property is preferably used.

The transistor 201 and the transistors 205 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that an end portion of the organic insulating film is positioned on the inner side compared to the end portion of the display device 100A, to prevent the organic insulating film from being exposed at the end portion of the display device 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 9A, an opening is formed in the insulating layer 214. This can inhibit entry of impurities into the display portion 162 from the outside through the insulating layer 214 even when an organic insulating film is used as the insulating layer 214. Thus, the reliability of the display device 100A can be increased.

Each of the transistor 201 and the transistors 205 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistor included in the light-emitting apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer in which a channel is formed is provided between two gates is used for the transistor 201 and the transistors 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that does not overlap with the substrate 152. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the pixel electrode 191 and a conductive film obtained by processing the same conductive film as the optical adjustment layer. On a top surface of the connection portion 204, the conductive layer 166 is exposed. Thus, the connection portion 204 and the FPC 172 can be electrically connected to each other through the connection layer 242.

The light-blocking layer BM is preferably provided on a surface of the substrate 152 on the substrate 151 side. Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film suppressing the attachment of stain, a hard coat film inhibiting generation of a scratch caused by the use, a shock absorbing layer, or the like may be provided on the outside of the substrate 152.

With the protective layer 195 that covers the light-emitting device 190, entry of impurities such as water into the light-emitting device 190 can be inhibited, leading to an increase in the reliability of the light-emitting device 190.

In the region 228 in the vicinity of the end portion of the display device 100A, the insulating layer 215 and the protective layer 195 are preferably in contact with each other through the opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Thus, the reliability of the display device 100A can be increased.

FIG. 9B illustrates an example in which the protective layer 195 has a three-layer structure. In FIG. 9B, the protective layer 195 includes an inorganic insulating layer 195*a* over the common electrode 115, an organic insulating layer 195*b* over the inorganic insulating layer 195*a*, and an inorganic insulating layer 195*c* over the organic insulating layer 195*b*.

An end portion of the inorganic insulating layer 195*a* and an end portion of the inorganic insulating layer 195*c* extend beyond an end portion of the organic insulating layer 195*b* and are in contact with each other. The inorganic insulating layer 195*a* is in contact with the insulating layer 215 (inorganic insulating layer) through the opening in the insulating layer 214 (organic insulating layer). Accordingly, the insulating layer 215 and the protective layer 195 can surround the light-emitting device 190, whereby the reliability of the light-emitting device 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

For each of the substrate 151 and the substrate 152, glass, quartz, ceramic, sapphire, resin, or the like can be used. When a flexible material is used for the substrate 151 and the substrate 152, the flexibility of the display device can be increased.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting device 190 may be of a top emission type, a bottom emission type, a dual emission type, or the like. A conductive film that transmits visible light is used as the electrode through which light is extracted. A conductive film that reflects visible light is preferably used as the electrode through which light is not extracted.

The light-emitting device 190 includes at least the light-emitting layer 193. The light-emitting device 190 may further include, as a layer other than the light-emitting layer 193, a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like. For example, the common layer 112 preferably includes one or both of a hole-injection layer and a hole-transport layer. For example, the common layer 114 preferably includes one or both of an electron-transport layer and an electron-injection layer.

The preferred structure of the light-emitting device 190 is as described above (FIG. 4 to FIG. 7).

The common layer 112, the light-emitting layer 193, and the common layer 114 may use either a low molecular compound or a high molecular compound and may also contain an inorganic compound. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 is a layer containing a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used.

As materials that can be used for a gate, a source, and a drain of a transistor and conductive layers such as a variety of wirings and electrodes included in a display device, metals such as aluminum, titanium, chromium, nickel, copper, yttrium, zirconium, molybdenum, silver, tantalum, or tungsten, an alloy containing any of these metals as its main component, and the like can be given. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium is preferably used, in which case the conductivity can be increased. These materials can also be used for conductive layers such as a variety of wirings and electrodes included in the display device, and conductive layers (conductive layers functioning as a pixel electrode or a common electrode) included in the light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 100B]

Figure 10A:
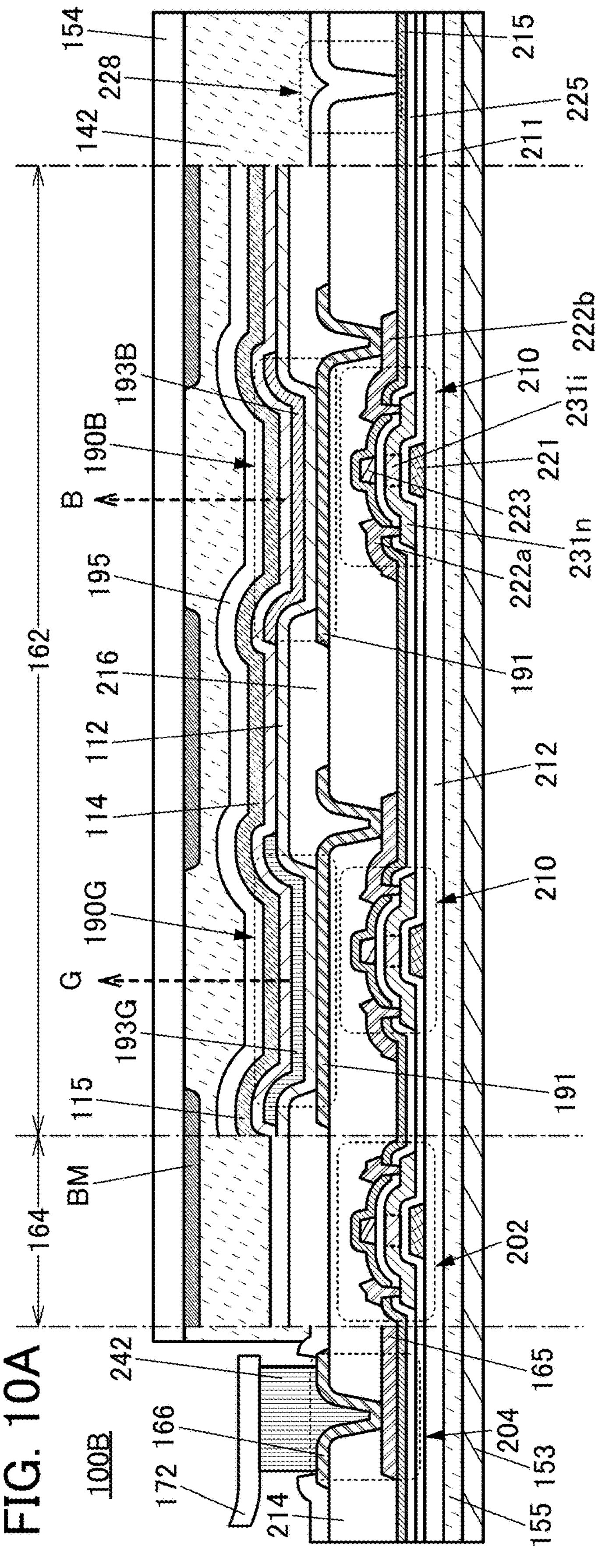
FIG. 10A is a cross-sectional view showing an example of a display device.

FIG. 10A is a cross-sectional view of a display device 100B. A perspective view of the display device 100B is similar to that of the display device 100A (FIG. 8). FIG. 10A illustrates an example of a cross section including part of a region including the FPC 172, part of the circuit 164, and part of the display portion 162 in the display device 100B. FIG. 10A specifically illustrates an example of a cross section of a region including the light-emitting device 190G that emits green light and the light-emitting device 190B that emits blue light in the display portion 162.

The display device 100B illustrated in FIG. 10A includes a transistor 202, transistors 210, the light-emitting device 190G, the light-emitting device 190B, and the like between the substrate 153 and the substrate 154.

The substrate 154 and the protective layer 195 are bonded to each other with the adhesive layer 142. The adhesive layer 142 is provided to overlap with the light-emitting device 190G and the light-emitting device 190B; that is, the display device 100B employs a solid sealing structure.

The substrate 153 and the insulating layer 212 are bonded to each other with the adhesive layer 155.

In a method for manufacturing the display device 100B, first, a formation substrate provided with the insulating layer 212, the transistors, the light-emitting devices, and the like is bonded to the substrate 154 provided with the light-blocking layer BM with the adhesive layer 142. Then, the substrate 153 is attached to a surface exposed by separation of the formation substrate, whereby the components formed over the formation substrate are transferred onto the substrate 153. The substrate 153 and the substrate 154 preferably have flexibility. Accordingly, the flexibility of the display device 100B can be increased.

The inorganic insulating film that can be used as the insulating layer 211, the insulating layer 213, and the insulating layer 215 can be used as the insulating layer 212.

The light-emitting device 190G has a stacked-layer structure in which the pixel electrode 191, the common layer 112, the light-emitting layer 193G, the common layer 114, and the common electrode 115 are stacked in this order from the insulating layer 214 side. Similarly, the light-emitting device 190B has a stacked-layer structure in which the pixel electrode 191, the common layer 112, the light-emitting layer 193B, the common layer 114, and the common electrode 115 are stacked in this order from the insulating layer 214 side.

The pixel electrode 191 is connected to the conductive layer 222*b* included in the transistor 210 through an opening provided in the insulating layer 214. The conductive layer 222*b* is connected to a low-resistance region 231*n* through an opening provided in the insulating layer 215 and an insulating layer 225. The transistor 210 has a function of controlling driving of the light-emitting device 190.

The end portion of the pixel electrode 191 is covered with the partition 216. The pixel electrode 191 contains a material that reflects visible light, and the common electrode 115 contains a material that transmits visible light.

Light emitted from the light-emitting device 190G and the light-emitting device 190B is emitted to the substrate 154 side. For the substrate 154, a material having a high visible-light-transmitting property is preferably used.

The pixel electrodes 191 included in the light-emitting devices can be formed using the same material in the same step. The common layer 112, the common layer 114, and the common electrode 115 are shared by the light-emitting device 190G and the light-emitting device 190B. The light-emitting devices of the respective colors can have a common structure except the structure of the light-emitting layer 193.

The connection portion 204 is provided in a region of the substrate 153 that does not overlap with the substrate 154. In the connection portion 204, the wiring 165 is electrically connected to the FPC 172 through the conductive layer 166 and the connection layer 242. The conductive layer 166 can be obtained by processing the same conductive film as the pixel electrode 191. Thus, the connection portion 204 and the FPC 172 can be electrically connected to each other through the connection layer 242.

Each of the transistor 202 and the transistors 210 includes the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layer 222*a* and the conductive layer 222*b* functions as a source, and the other functions as a drain.

FIG. 10A illustrates an example in which the insulating layer 225 covers a top and side surfaces of the semiconductor layer. The conductive layer 222*a* and the conductive layer 222*b* are connected to the corresponding low-resistance regions 231*n* through the openings provided in the insulating layer 225 and the insulating layer 215.

Figure 10B:
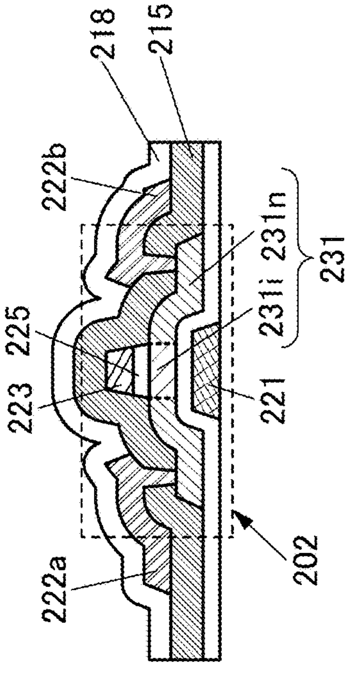
FIG. 10B is a cross-sectional view showing an example of a transistor.

Meanwhile, in FIG. 10B, the insulating layer 225 overlaps with the channel formation region 231*i* of the semiconductor layer 231 and does not overlap with the low-resistance regions 231*n*. The structure shown in FIG. 10B can be manufactured by processing the insulating layer 225 using the conductive layer 223 as a mask, for example. In FIG. 10B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

[Metal Oxide]

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) or CAC (Cloud-Aligned Composite) may be stated. CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is unlikely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO), which is a kind of metal oxide containing indium, gallium, and zinc, has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

As described above, a light-emitting device with little initial decay and an extremely long driving lifetime is used, whereby the reliability of a light-emitting apparatus can be increased.

This embodiment can be combined with the other embodiments as appropriate. In this specification, in the case where a plurality of structure examples are shown in one embodiment, the structure examples can be combined as appropriate.

Embodiment 2

In this embodiment, a display device of one embodiment of the present invention will be described with reference to FIG. 11.

Figure 11A:
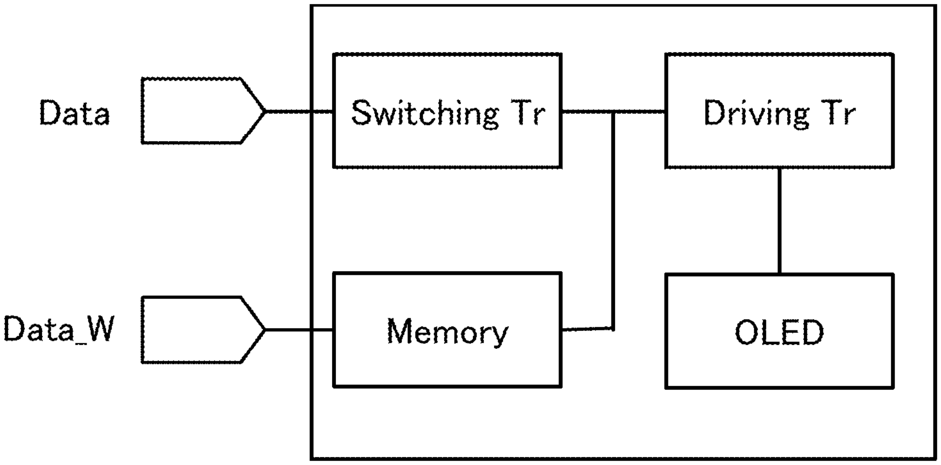
FIG. 11A is a block diagram showing an example of a pixel.

FIG. 11A is a block diagram of a pixel. The pixel illustrated in FIG. 11A includes a memory (Memory) in addition to a switching transistor (Switching Tr), a driving transistor (Driving Tr), and a light-emitting device (OLED).

Data Data_W is supplied to the memory. When the data Data_W is supplied to the pixel in addition to display data Data, a current flowing through the light-emitting device is large, so that the display device can have high luminance.

The light-emitting device included in the display device of one embodiment of the present invention is driven on the basis of the display data Data and the data Data_W, whereby the light-emitting device can emit light with high luminance.

Figure 11B:
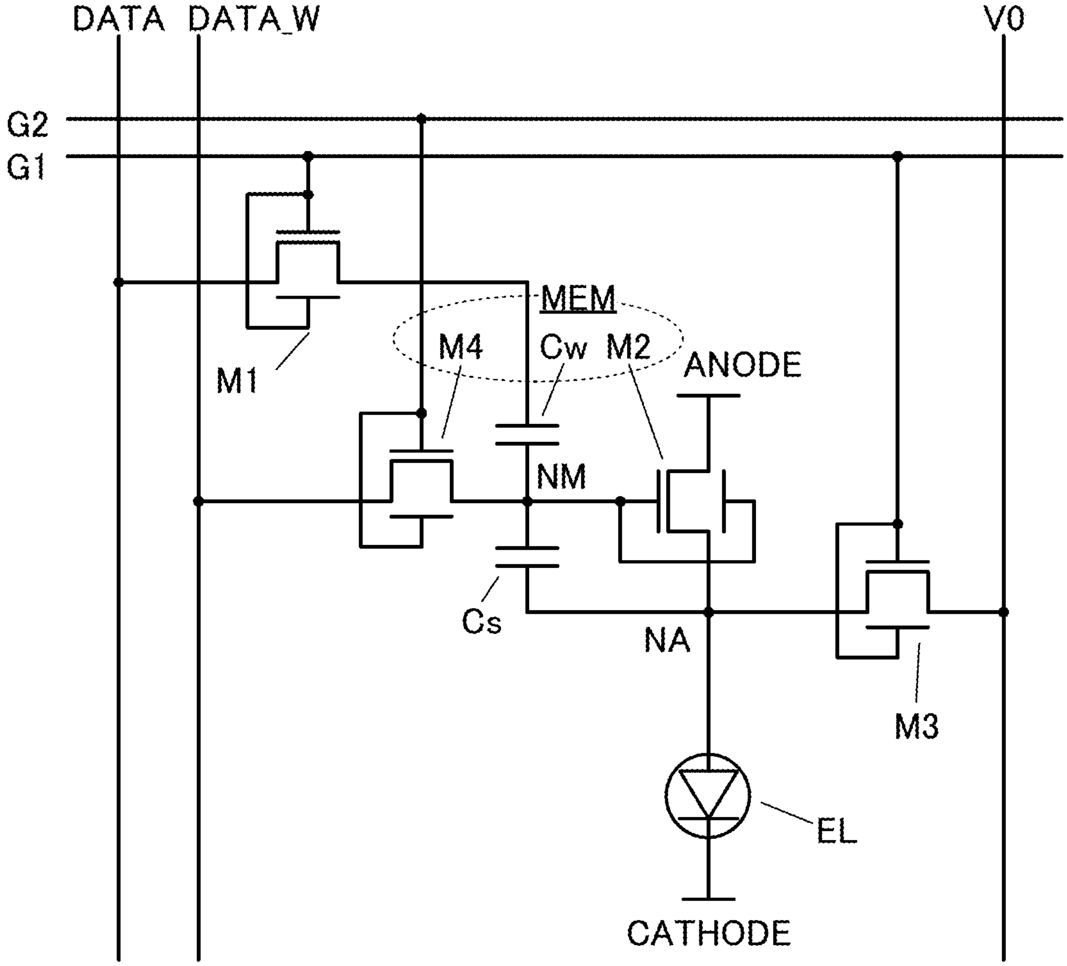
FIG. 11B is a circuit diagram showing an example of a pixel circuit.

FIG. 11B is a specific circuit diagram of the pixel circuit.

The pixel illustrated in FIG. 11B includes a transistor M1, a transistor M2, a transistor M3, a transistor M4, a capacitor Cs, a capacitor Cw, and a light-emitting device EL.

One of a source and a drain of the transistor M1 is electrically connected to one electrode of the capacitor Cw. The other electrode of the capacitor Cw is electrically connected to one of a source and a drain of the transistor M4. The one of the source and the drain of the transistor M4 is electrically connected to a gate of the transistor M2. The gate of the transistor M2 is electrically connected to one electrode of the capacitor Cs. The other electrode of the capacitor Cs is electrically connected to one of a source and a drain of the transistor M2. The one of the source and the drain of the transistor M2 is electrically connected to one of a source and a drain of the transistor M3. The one of the source and the drain of the transistor M3 is electrically connected to one electrode of the light-emitting device EL. The transistors illustrated in FIG. 11B each include a back gate electrically connected to its gate; however, the connection of the back gate is not limited thereto. The transistor does not necessarily include the back gate.

Here, a node to which the other electrode of the capacitor Cw, the one of the source and the drain of the transistor M4, the gate of the transistor M2, and the one electrode of the capacitor Cs are connected is referred to as a node NM. Moreover, a node to which the other electrode of the capacitor Cs, the one of the source and the drain of the transistor M2, the one of the source and the drain of the transistor M3, and the one electrode of the light-emitting device EL are connected is referred to as a node NA.

A gate of the transistor M1 is electrically connected to a wiring G1. A gate of the transistor M3 is electrically connected to the wiring G1. A gate of the transistor M4 is electrically connected to a wiring G2. The other of the source and the drain of the transistor M1 is electrically connected to a wiring DATA. The other of the source and the drain of the transistor M3 is electrically connected to a wiring V0. The other of the source and the drain of the transistor M4 is electrically connected to a wiring DATA_W.

The other of the source and the drain of the transistor M2 is electrically connected to a wiring ANODE (the high potential side). The other electrode of the light-emitting device EL is electrically connected to a wiring CATHODE (the low potential side).

The wiring G1 and the wiring G2 can have a function of signal lines for controlling the operation of the transistors. The wiring DATA can have a function of a signal line for supplying an image signal to the pixel. The wiring DATA_W can have a function of a signal line for writing data to a memory circuit MEM. The wiring DATA_W can have a function of a signal line for supplying a correction signal to the pixel. The wiring V0 has a function of a monitor line for obtaining the electrical characteristics of the transistor M4. A specific potential is supplied from the wiring V0 to the other electrode of the capacitor Cs through the transistor M3, whereby writing of an image signal can be stable.

The memory circuit MEM is formed of the transistor M2, the transistor M4, and the capacitor Cw. The node NM is a storage node; when the transistor M4 is turned on, a signal supplied to the wiring DATA_W can be written to the node NM. The use of a transistor with an extremely low off-state current as the transistor M4 allows the potential of the node NM to be retained for a long time.

As the transistor M4, a transistor containing a metal oxide in its channel formation region (hereinafter, OS transistor) can be used, for example. Thus, the off-state current of the transistor M4 can be extremely low, and the potential of the node NM can be retained for a long time. In this case, OS transistors are preferably used as the other transistors included in the pixel. For the specific example of the metal oxide, Embodiment 1 can be referred to.

An OS transistor has a large energy gap and thus has an extremely low off-state current. Unlike in a transistor in which Si is included in the channel formation region (hereinafter, Si transistor), impact ionization, avalanche breakdown, short-channel effects, and the like do not occur in an OS transistor; accordingly, a highly reliable circuit can be configured.

Furthermore, a Si transistor may be used as the transistor M4. In this case, Si transistors are preferably used as the other transistors included in the pixel.

Examples of the Si transistor include a transistor containing amorphous silicon, a transistor containing crystalline silicon (typically, low-temperature polysilicon), and a transistor containing single crystal silicon.

One pixel may include both an OS transistor and a Si transistor.

In the pixel, the signal written to the node NM is capacitively coupled to the image signal supplied from the wiring DATA, and the resulting data can be output to the node NA. Note that the transistor M1 can have a function of selecting a pixel.

In other words, when an intended correction signal is stored in the node NM in advance, the correction signal can be added to the supplied image signal. Note that the correction signal is sometimes attenuated by a component on the transmission path; hence, the signal is preferably produced in consideration of the attenuation.

When the light-emitting device emits light with the use of the image signal and the correction signal, the amount of current flowing through the light-emitting device can be increased, and high luminance can be achieved. A voltage higher than or equal to the output voltage of a source driver can be applied as the gate voltage of the driving transistor, so that the power consumption of the source driver can be reduced.

This embodiment can be combined with the other embodiments as appropriate.

Embodiment 3

In this embodiment, a method of forming an EL layer by a droplet discharge method is described with reference to FIG. 12. FIG. 12A to FIG. 12D are cross-sectional views illustrating the method for forming an EL layer 786.

Figure 12A:
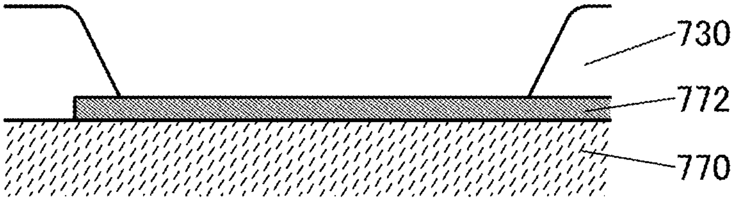
FIG. 12A to FIG. 12D are cross-sectional views showing a method for forming an EL layer.

First, a conductive film 772 is formed over a planarization insulating film 770, and an insulating film 730 is formed to cover part of the conductive film 772 (FIG. 12A).

Figure 12B:
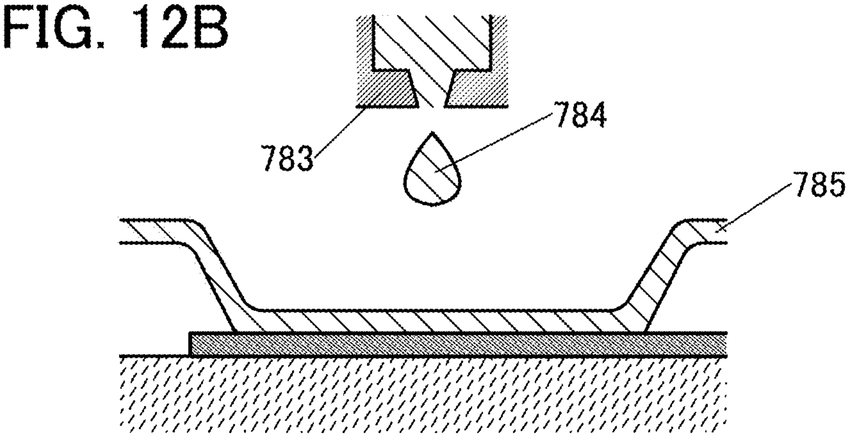

Then, a droplet 784 is discharged from a droplet discharge apparatus 783 to the conductive film 772 exposed in an opening of the insulating film 730, so that a layer 785 containing a composition is formed. The droplet 784 is a composition containing a solvent and is attached onto the conductive film 772 (FIG. 12B).

Note that the step of discharging the droplet 784 may be performed under reduced pressure.

Figure 12C:
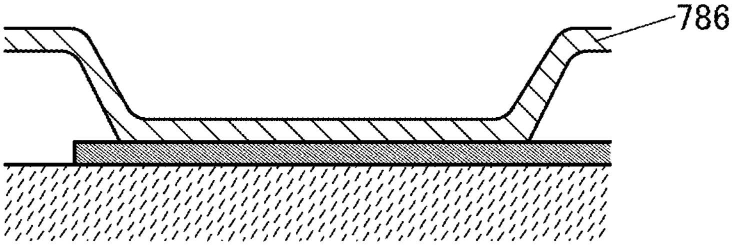

Then, the solvent is removed from the layer 785 containing the composition, and the layer is solidified to form the EL layer 786 (FIG. 12C).

Note that the solvent can be removed by a drying step or a heating step.

Figure 12D:
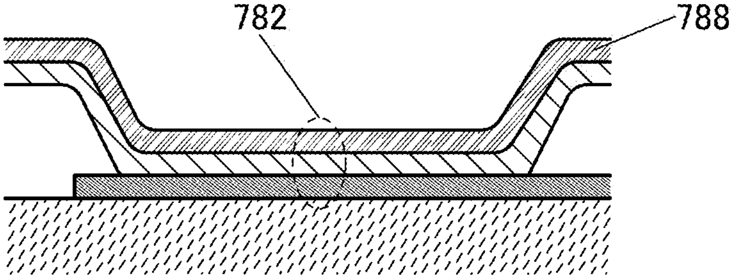

Next, a conductive film 788 is formed over the EL layer 786; thus, a light-emitting device 782 is formed (FIG. 12D).

When the EL layer 786 is formed by a droplet discharge method in this manner, the composition can be selectively discharged; accordingly, waste of the material can be reduced. Furthermore, a lithography process or the like for shaping is not needed, and thus, the process can be simplified and cost reduction can be achieved.

The droplet discharge method mentioned above is a general term for a method with a droplet discharge means such as a nozzle having a composition discharge outlet or a head having one or a plurality of nozzles.

Figure 13:
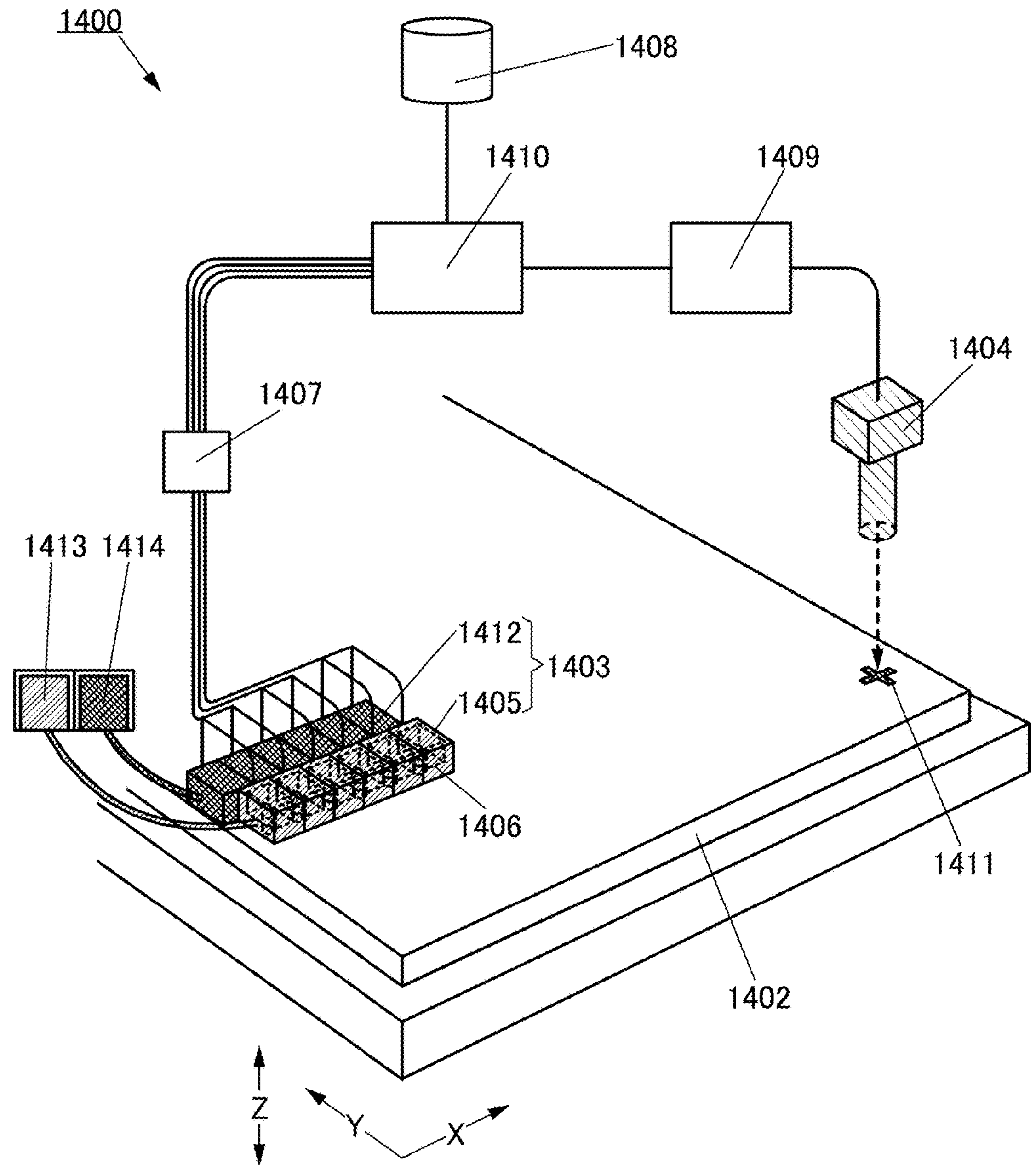
FIG. 13 is a conceptual diagram showing a droplet discharge apparatus.

Next, a droplet discharge apparatus used for the droplet discharge method will be described with reference to FIG. 13. FIG. 13 is a conceptual diagram illustrating a droplet discharge apparatus 1400.

The droplet discharge apparatus 1400 includes a droplet discharge means 1403. In addition, the droplet discharge means 1403 includes a head 1405 and a head 1412.

The head 1405 and the head 1412 are connected to a control means 1407, which is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. The computer 1410 recognizes the digital signal, generates a control signal, and transmits the control signal to the control means 1407.

An image sensor or the like utilizing a charge coupled device (CCD) or a complementary metal-oxide-semiconductor (CMOS) can be used as the imaging means 1404. Note that information about a pattern to be formed over the substrate 1402 is stored in a storage medium 1408, and on the basis of the information, a control signal is transmitted to the control means 1407, and each of the head 1405 and the head 1412 of the droplet discharge means 1403 can be individually controlled. The head 1405 and the head 1412 are supplied with a material to be discharged from a material supply source 1413 and a material supply source 1414 through pipes, respectively.

Inside the head 1405, a space indicated by a dotted line 1406 to be filled with a liquid material and a nozzle serving as a discharge outlet are provided. Although not illustrated, the inside structure of the head 1412 is similar to that of the head 1405. When the nozzle sizes of the head 1405 and the head 1412 are different from each other, different materials with different widths can be discharged simultaneously. Each head can discharge a plurality of light-emitting materials or the like to draw a pattern. In the case of drawing over a large area, the same material can be simultaneously discharged to be drawn from a plurality of nozzles in order to improve throughput. When a large substrate is used, the head 1405 and the head 1412 can freely scan the substrate in directions indicated by arrows X, Y, and Z shown in FIG. 13, and a region in which a pattern is drawn can be freely set. Thus, a plurality of the same patterns can be drawn over one substrate.

Furthermore, the step of discharging the composition may be performed under reduced pressure. The substrate may be heated at the time of discharging. The discharge of the composition is followed by one or both steps of drying and baking. Both the drying and baking steps are heat treatments but different in purpose, temperature, and time. The drying step and the baking step are performed under normal pressure or reduced pressure by laser irradiation, rapid thermal annealing, heating in a heating furnace, or the like. Note that there is no particular limitation on the timing of the heat treatment and the number of times of the heat treatment. The temperature for adequately performing the drying and baking steps depends on the material of the substrate and the properties of the composition.

In the above-described manner, the EL layer 786 can be formed with the droplet discharge apparatus.

This embodiment can be combined with the other embodiments as appropriate.

Embodiment 4

In this embodiment, electronic devices of embodiments of the present invention are described with reference to FIG. 14 and FIG. 15.

The electronic devices of this embodiment includes the display device of one embodiment of the present invention in a display portion and accordingly has a long lifetime and high reliability. Moreover, with the use of the display device of one embodiment of the present invention in the display portion, the electronic device can have a long lifetime and a large screen.

The display portion of the electronic device of this embodiment can display a video with definition of, for example, full high definition, 4K2K, 8K4K, 16K8K, or higher. In addition, as a screen size of the display portion, the diagonal size can be greater than or equal to 20 inches, greater than or equal to 30 inches, greater than or equal to 50 inches, greater than or equal to 60 inches, or greater than or equal to 70 inches.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device of this embodiment can be incorporated along a curved surface of an inside wall or an outside wall of a house or a building or the interior or the exterior of a car.

The electronic device of this embodiment may include an antenna. When a signal is received by the antenna, the electronic device can display a video, information, or the like on the display portion. When the electronic device includes the antenna and a secondary battery, the antenna may be used for contactless power transmission.

The electronic device of this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device of this embodiment can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 14A:
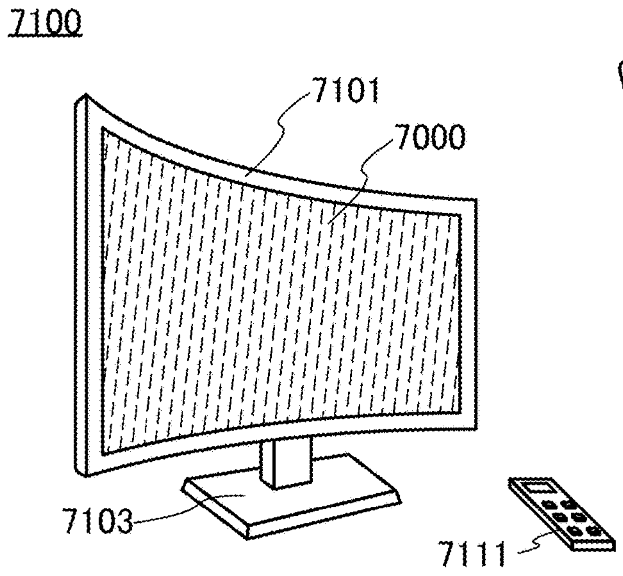
FIG. 14A to FIG. 14D are diagrams showing examples of electronic devices.

FIG. 14A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 14A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With a touch panel or operation keys provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device 7100 is connected to a communication network with or without wires via the modem, one-way (from a transmitter to a receiver) or two-way (between a transmitter and a receiver or between receivers, for example) data communication can be performed.

Figure 14B:
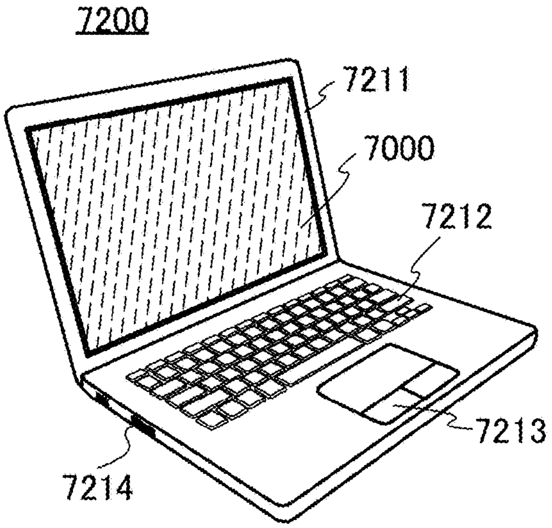

FIG. 14B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 14C:
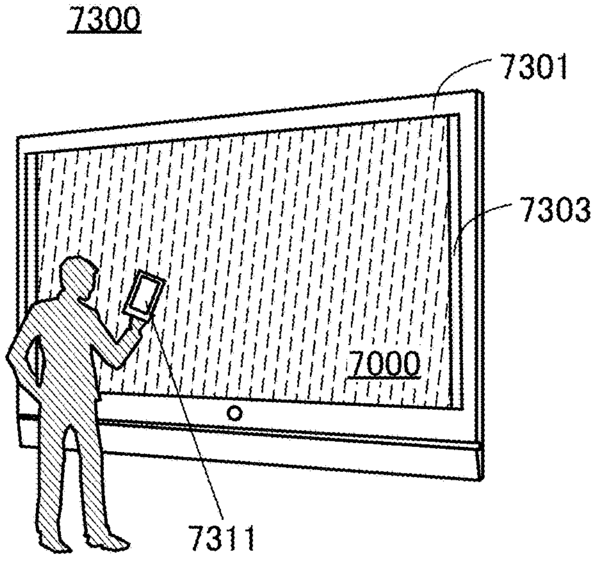
Figure 14D:
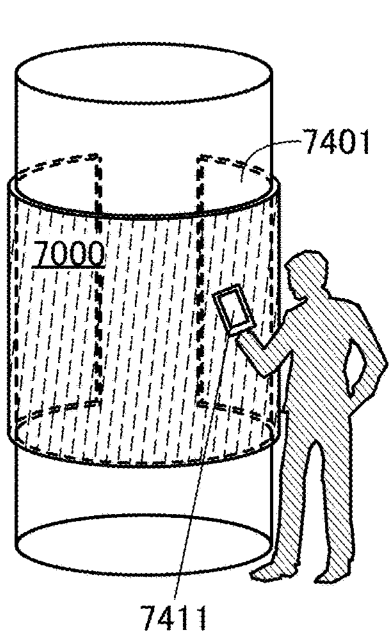

FIG. 14C and FIG. 14D illustrate examples of digital signage.

Digital signage 7300 illustrated in FIG. 14C includes a housing 7301, the display portion 7000, a speaker 7303, and the like. Furthermore, the digital signage can include an LED lamp, operation keys (including a power switch or an operation switch), a connection terminal, any of a variety of sensors, a microphone, and the like.

FIG. 14D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 14C and FIG. 14D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

Furthermore, as illustrated in FIG. 14C and FIG. 14D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411.

By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 15A to FIG. 15F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 15A to FIG. 15F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The electronic devices illustrated in FIG. 15A to FIG. 15F are described in detail below.

Figure 15A:
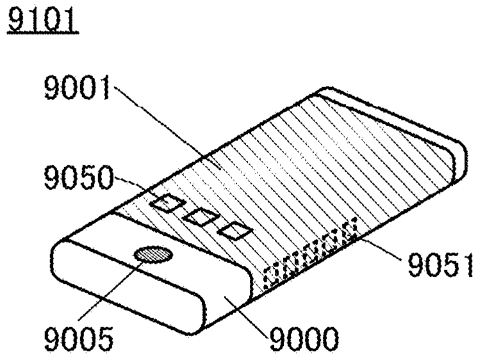
FIG. 15A to FIG. 15F are diagrams showing examples of electronic devices.

FIG. 15A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 15A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 15B:
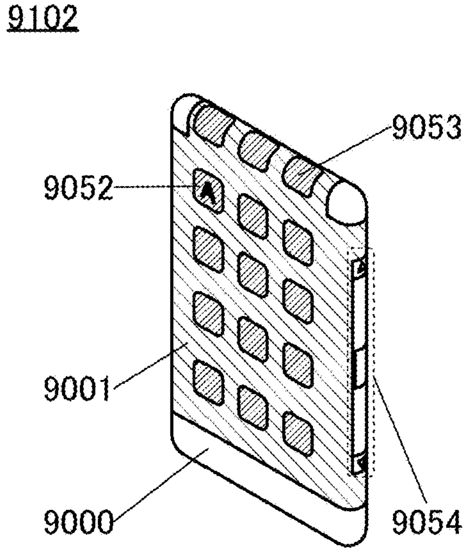

FIG. 15B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 15C:
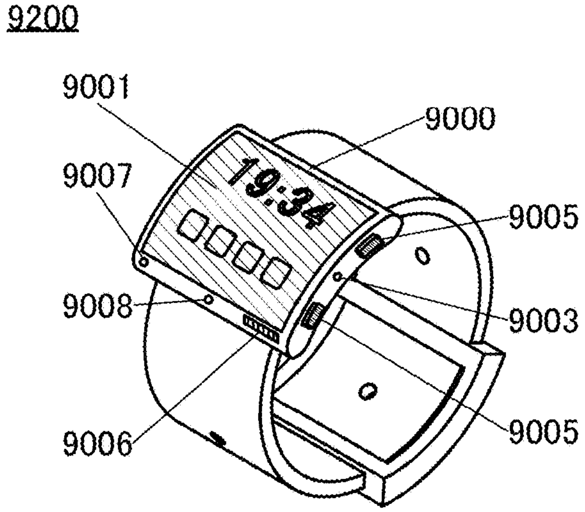

FIG. 15C is a perspective view illustrating a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 15D:
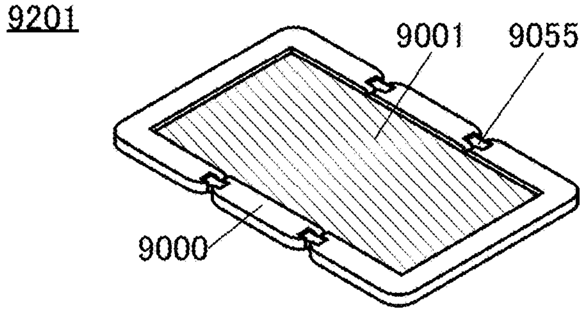
Figure 15E:
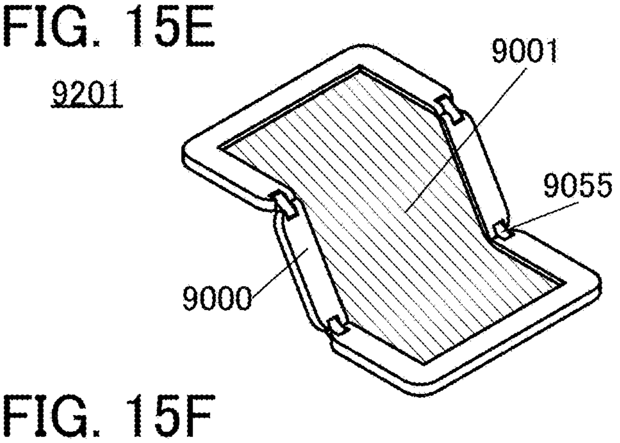
Figure 15F:
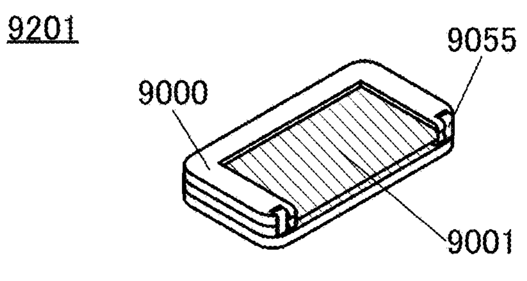

FIG. 15D to FIG. 15F are perspective views illustrating a foldable portable information terminal 9201. FIG. 15D is a perspective view of an opened state of the portable information terminal 9201, FIG. 15F is a perspective view of a folded state thereof, and FIG. 15E is a perspective view of a state in the middle of change from one of FIG. 15D and FIG. 15F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments as appropriate.

Embodiment 5

In this embodiment, a television device of one embodiment of the present invention will be described with reference to FIG. 16.

Figure 16:
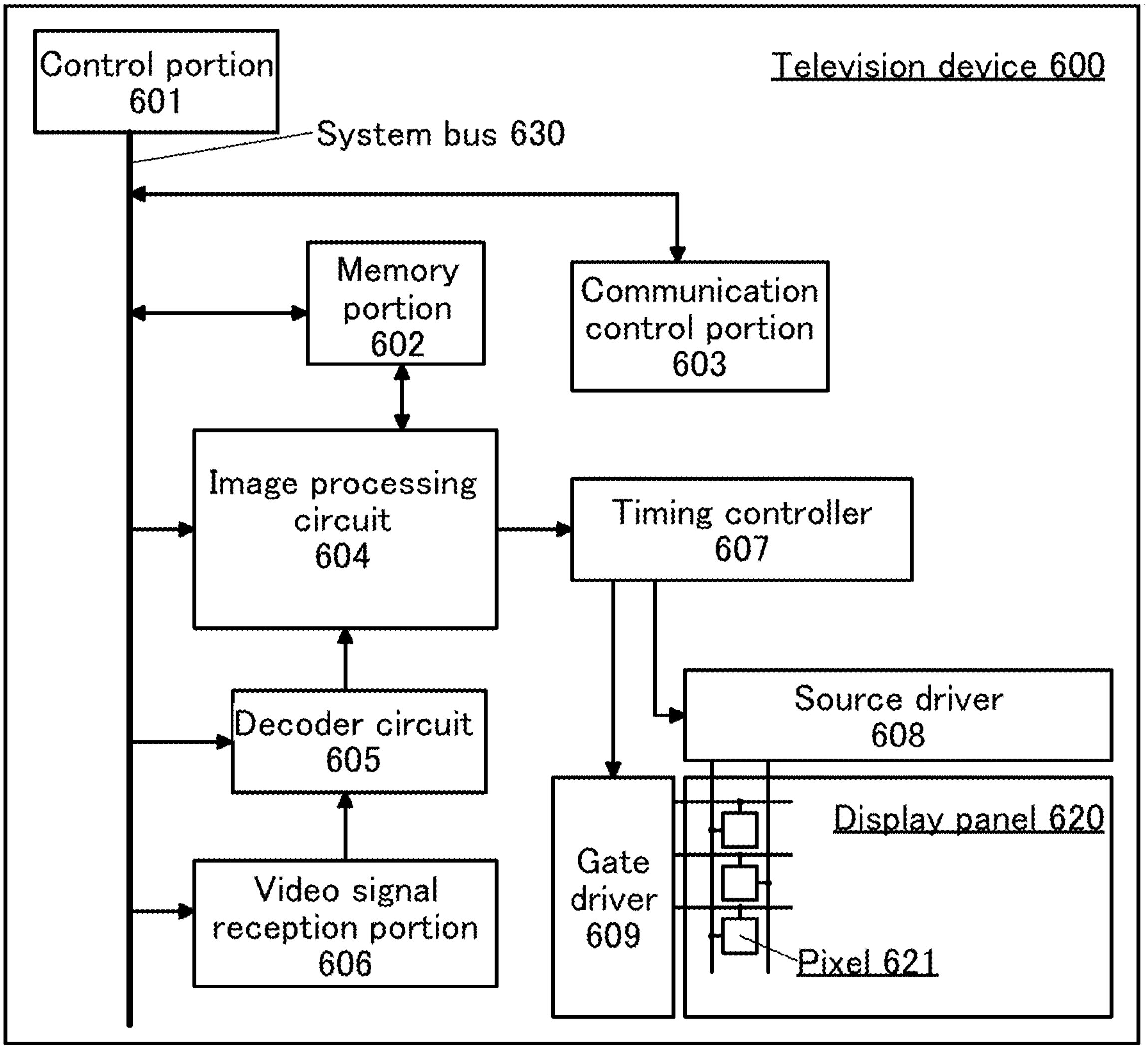
FIG. 16 is a diagram showing an example of a television device.

FIG. 16 is a block diagram of a television device 600.

Note that in the drawings attached to this specification, the block diagram in which components are classified according to their functions and shown as independent blocks is illustrated; however, it is difficult to separate completely actual components according to their functions, and it is possible for one component to relate to a plurality of functions.

The television device 600 includes a control portion 601, a memory portion 602, a communication control portion 603, an image processing circuit 604, a decoder circuit 605, a video signal reception portion 606, a timing controller 607, a source driver 608, a gate driver 609, a display panel 620, and the like.

The display device described in Embodiment 1 can be used for the display panel 620 in FIG. 16. Thus, the television device 600 with a large size, a long lifetime, and high display quality can be obtained.

The control portion 601 can function as, for example, a central processing unit (CPU). For example, the control portion 601 has a function of controlling components such as the memory portion 602, the communication control portion 603, the image processing circuit 604, the decoder circuit 605, and the video signal reception portion 606 via a system bus 630.

Signals are transmitted between the control portion 601 and the components via the system bus 630. In addition, the control portion 601 has a function of processing signals input from the components which are connected via the system bus 630, a function of generating signals to be output to the components, and the like, so that the components connected to the system bus 630 can be controlled comprehensively.

The memory portion 602 functions as a register, a cache memory, a main memory, a secondary memory, or the like that can be accessed by the control portion 601 and the image processing circuit 604.

As a memory device that can be used as a secondary memory, a memory device that uses a rewritable nonvolatile memory can be used, for example. For example, a flash memory, an MRAM (Magnetoresistive Random Access Memory), a PRAM (Phase change RAM), a ReRAM (Resistive RAM), and an FeRAM (Ferroelectric RAM) can be used.

In addition, as a memory device that can be used as a temporary memory such as a register, a cache memory, or a main memory, a volatile memory such as a DRAM (Dynamic RAM) or an SRAM (Static Random Access Memory) may be used.

For example, as a RAM provided in the main memory, a DRAM is used, for example, in which case a memory space as a workspace for the control portion 601 is virtually allocated and used. An operating system, an application program, a program module, program data, and the like which are stored in the memory portion 602 are loaded into the RAM for execution. The data, program, and program module which are loaded into the RAM are directly accessed and operated by the control portion 601.

In the ROM, a BIOS (Basic Input/Output System), firmware, and the like for which rewriting is not needed can be stored. As the ROM, a mask ROM, an OTPROM (One Time Programmable Read Only Memory), an EPROM (Erasable Programmable Read Only Memory), or the like can be used. Examples of an EPROM include an UV-EPROM (Ultra-Violet Erasable Programmable Read Only Memory) which can erase stored data by irradiation with ultraviolet rays, an EEPROM (Electrically Erasable Programmable Read Only Memory), and a flash memory.

Moreover, a structure in which, besides the memory portion 602, a detachable memory device can be connected may be employed. For example, it is preferable to include a terminal connected to a storage media drive functioning as a storage device such as a hard disk drive (HDD) or a solid state drive (SSD) or a storage medium such as a flash memory, a Blu-ray Disc, or a DVD. Accordingly, a video can be stored.

The communication control portion 603 has a function of controlling communication performed via a computer network. That is, the IoT (Internet of Things) technology is applied to the television device 600.

For example, the communication control portion 603 controls a control signal for connection to a computer network in response to instructions from the control portion 601 and transmits the signal to the computer network. Accordingly, communication can be performed by connection with a computer network such as the Internet, which is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network).

Furthermore, the communication control portion 603 may have a function of communicating with a computer network or another electronic device with a communication standard such as Wi-Fi (registered trademark), Bluetooth (registered trademark), or ZigBee (registered trademark).

The communication control portion 603 may have a function of wireless communication. For example, an antenna and a high frequency circuit (an RF circuit) are provided to receive and transmit an RF signal. The high frequency circuit performs conversion between an electromagnetic signal and an electric signal in a frequency band that is set by national laws and performs wireless communication with another communication device using the electromagnetic signal. As a practical frequency band, several tens of kilohertz to several tens of gigahertz are generally used. A structure can be employed in which the high frequency circuit connected to an antenna includes a high frequency circuit portion compatible with a plurality of frequency bands and the high frequency circuit portion includes an amplifier, a mixer, a filter, a DSP, an RF transceiver, or the like.

The video signal reception portion 606 includes, for example, an antenna, a demodulation circuit, an AD converter circuit (analog-digital conversion circuit), and the like. The demodulation circuit has a function of demodulating a signal input from the antenna. Moreover, the AD converter circuit has a function of converting the demodulated analog signal into a digital signal. The signal processed in the video signal reception portion 606 is transmitted to the decoder circuit 605.

The decoder circuit 605 has a function of decoding video data included in a digital signal input from the video signal reception portion 606, in accordance with the specifications of the broadcasting standard of the data to be transmitted, and a function of generating a signal transmitted to the image processing circuit. Examples of the broadcasting standard in 8K broadcasts include H.265|MPEG-H High Efficiency Video Coding (abbreviation: HEVC).

Examples of airwaves that can be received by the antenna included in the video signal reception portion 606 include a ground wave, and a radio wave transmitted from a satellite. In addition, examples of airwaves that can be received by the antenna include airwaves for analog broadcasting, digital broadcasting, video-audio-only broadcasting, and audio-only broadcasting. For example, the antenna can receive airwaves transmitted in a certain frequency band in a UHF band (about 300 MHz to 3 GHz) or a VHF band (30 MHz to 300 MHz). Furthermore, for example, a plurality of pieces of data received in a plurality of frequency bands are used, whereby the transfer rate can be increased and more information can be thus obtained. Accordingly, a video with a resolution exceeding the full high definition can be displayed in the display panel 620. A video with a resolution of, for example, 4K2K, 8K4K, 16K8K, or more can be displayed.

Alternatively, a structure may be employed in which the video signal reception portion 606 and the decoder circuit 605 generate a signal transmitted to the image processing circuit 604 using the broadcasting data transmitted with data transmission technology through a computer network. At this time, in the case where the received signal is a digital signal, the video signal reception portion 606 does not necessarily include a demodulation circuit, an AD converter circuit, and the like.

The image processing circuit 604 has a function of generating a video signal output to the timing controller 607, on the basis of a video signal input from the decoder circuit 605.

The timing controller 607 has a function of generating a signal (a signal such as a clock signal or a start pulse signal)

output to the gate driver 609 and the source driver 608 on the basis of a synchronization signal included in a video signal or the like on which the image processing circuit 604 performs processing. Moreover, the timing controller 607 has a function of generating a video signal output to the source driver 608, as well as the above signal.

The display panel 620 includes a plurality of pixels 621. Each pixel 621 is driven by a signal supplied from the gate driver 609 and the source driver 608. Here, an example of a display panel whose number of pixels is 7680×4320, with the resolution corresponding to the standard of 8K4K, is shown. Note that the resolution of the display panel 620 is not limited thereto, and the display panel 620 may have a resolution corresponding to the standard such as full high definition (the number of pixels is 1920×1080) or 4K2K (the number of pixels is 3840×2160).

A structure in which, for example, a processor is included can be employed for the control portion 601 or the image processing circuit 604 illustrated in FIG. 16. For example, a processor functioning as a CPU can be used for the control portion 601. In addition, another processor such as a DSP (Digital Signal Processor) or a GPU (Graphics Processing Unit) can be used for the image processing circuit 604, for example. Furthermore, a structure in which the above processor is obtained with a PLD (Programmable Logic Device) such as an FPGA (Field Programmable Gate Array) or an FPAA (Field Programmable Analog Array) may be employed for the control portion 601 or the image processing circuit 604.

The processor interprets and executes instructions from various programs to process various kinds of data and control programs. The programs that might be executed by the processor may be stored in a memory region included in the processor or a memory device which is additionally provided.

Furthermore, two or more functions among the functions of the control portion 601, the memory portion 602, the communication control portion 603, the image processing circuit 604, the decoder circuit 605, the video signal reception portion 606, and the timing controller 607 may be aggregated in one IC chip to form a system LSI. For example, a system LSI including a processor, a decoder circuit, a tuner circuit, an AD converter circuit, a DRAM, an SRAM, and the like may be employed.

Note that a transistor that includes an oxide semiconductor in a channel formation region and that achieves an extremely low off-state current can be used in an IC or the like included in the control portion 601 or another component. The transistor has an extremely low off-state current; therefore, with the use of the transistor as a switch for retaining electric charge (data) which has flown into a capacitor serving as a memory, a long data retention period is feasible. Utilizing this characteristic for a register or a cache memory of the control portion 601 or the like enables normally-off computing where the control portion 601 operates only when needed and data on the previous processing is stored in the memory in the other case. Thus, power consumption of television device 600 can be reduced.

Note that the structure of the television device 600 in FIG. 16 is just an example, and all of the components are not necessarily included. It is acceptable as long as the television device 600 includes at least necessary components among the components illustrated in FIG. 16. Furthermore, the television device 600 may include a component other than the components illustrated in FIG. 16.

For example, the television device 600 may include an external interface, an audio output portion, a touch panel unit, a sensor unit, a camera unit, or the like besides the configuration illustrated in FIG. 16. Examples of the external interface include an external connection terminal such as a USB (Universal Serial Bus) terminal, a LAN (Local Area Network) connection terminal, a power reception terminal, an audio output terminal, an audio input terminal, a video output terminal, or a video input terminal; a transceiver for optical communication using infrared rays, visible light, ultraviolet rays, or the like; a physical button provided on a housing; and the like. In addition, examples of the audio input/output portions include a sound controller, a microphone, and a speaker.

The image processing circuit 604 is described in detail below.

The image processing circuit 604 preferably has a function of executing image processing on the basis of a video signal input from the decoder circuit 605.

Examples of the image processing include noise removal processing, grayscale conversion processing, tone correction processing, and luminance correction processing. Examples of the tone correction processing or the luminance correction processing include gamma correction.

Furthermore, the image processing circuit 604 preferably has a function of executing processing such as pixel interpolation processing in accordance with up-conversion of the resolution or frame interpolation processing in accordance with up-conversion of the frame frequency.

As the noise removing processing, various noise such as mosquito noise which appears near outline of characters and the like, block noise which appears in high-speed moving images, random noise causing flicker, and dot noise caused by up-conversion of the resolution are removed, for example.

The grayscale conversion processing converts the grayscale of an image to a grayscale corresponding to output characteristics of the display panel 620. For example, in the case where the number of grayscale levels is increased, gradation values of pixels are interpolated to an input image with a small number of gray levels and assigned to the pixels, so that processing for smoothing a histogram can be executed. In addition, a high-dynamic range (HDR) processing for increasing the dynamic range is also included in the grayscale conversion processing.

In addition, the pixel interpolation processing interpolates data which does not actually exist when resolution is up-converted. For example, with reference to pixels around the target pixel, data is interpolated to display intermediate color therebetween.

In addition, the tone correction processing corrects the tone of an image. The luminance correction processing corrects the brightness (luminance contrast) of an image. For example, a type, luminance, color purity, and the like of a lighting in a space where the television device 600 is provided are detected, and luminance and tone of images displayed on the display panel 620 are corrected to be optimal in accordance with the detection. Alternatively, a function of comparing a displayed image to images of various scenes in an image list stored in advance, and then correcting luminance and tone of the displayed image to be suitable to the images of the closest scene of the image can be included.

In the case where the frame frequency of the displayed video is increased, the frame interpolation processing generates an image for a frame that does not exist actually (an interpolation frame). For example, an image for an interpolation frame which is interposed between certain two images is generated from a difference between the two images.

Alternatively, images for a plurality of interpolation frames can be generated between the two images. For example, when the frame frequency of a video signal input from the decoder circuit 605 is 60 Hz, a plurality of interpolation frames are generated, and the frame frequency of a video signal output to the timing controller 607 can be increased twofold to 120 Hz, fourfold to 240 Hz, or eightfold to 480 Hz, for example.

This embodiment can be combined with the other embodiments as appropriate.

Reference Example 1

In this reference example, methods for calculating the HOMO level, the LUMO level, and the electron mobility of an organic compound in the display device of one embodiment of the present invention will be described.

The HOMO level and the LUMO level can be calculated through cyclic voltammetry (CV) measurement.

In this reference example, an electrochemical analyzer (model number: ALS model 600A or 600C, manufactured by BAS Inc.) was used as a measurement apparatus. To prepare a solution for the CV measurement, dehydrated dimethylformamide (DMF) (manufactured by Sigma-Aldrich Inc., 99.8%, catalog No. 22705-6) was used as a solvent, tetra-n-butylammonium perchlorate ($n\text{-}Bu_4NClO_4$) (manufactured by Tokyo Chemical Industry Co., Ltd., catalog No. T0836) as a supporting electrolyte was dissolved at a concentration of 100 mmol/L, and the object to be measured was dissolved at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag+ electrode (RE7 reference electrode for nonaqueous solvent, manufactured by BAS Inc.) was used as a reference electrode. The measurement was conducted at room temperature (20° C. to 25° C.). The scan speed in the CV measurement was fixed to 0.1 V/sec, and an oxidation potential Ea [V] and a reduction potential Ec [V] with respect to the reference electrode were measured. Ea is an intermediate potential of an oxidation-reduction wave, and Ec is an intermediate potential of a reduction-oxidation wave. Here, since the potential energy of the reference electrode used in this reference example with respect to the vacuum level is known to be −4.94 eV, the HOMO level and the LUMO level can be calculated by the following formulae: HOMO level [eV]=−4.94−Ea and LUMO level [eV]=−4.94−Ec.

The electron mobility can be measured by an impedance spectroscopy method (IS method).

As a method for measuring the carrier mobility of an EL material, a time-of-flight method (TOF method), a method using I-V characteristics of a space-charge-limited current (SCLC), or the like has been known for a long time. The TOF method needs a sample with a much larger thickness than that of an actual organic EL device. The SCLC method has a disadvantage in that electric field strength dependence of carrier mobility cannot be obtained, for example. Since an organic film required for the measurement employing the IS method is as thin as approximately several hundreds of nanometers, the organic film can be formed of a relatively small amount of EL materials, whereby the mobility can be measured with a thickness close to the thickness of a film in an actual organic EL device. In this method, the electric field strength dependence of the carrier mobility can also be measured.

In the IS method, a micro sinusoidal voltage signal ($V=V_0[\exp(j\omega t)]$) is applied to an EL device, and the impedance of the EL device ($Z=V/I$) is obtained from a phase difference between the current amplitude of a response current signal ($I=I_0\exp[j\omega t+\phi]$) and the input signal. By applying the voltage to the EL device while the frequency of the voltage is changed from a high level to a low level, components having various relaxation times that contribute to the impedance can be separated and measured.

Here, admittance Y (=1/Z), which is the reciprocal number of the impedance, can be represented by conductance G and susceptance B as shown in the following formula (1).

[Formula 1]

$$Y = \frac{1}{Z} = G + jB \tag{1}$$

In addition, by a single injection model, calculation of the following formulae (2) and (3) can be performed. Here, g (the formula (4)) is differential conductance. In the formula, C represents capacitance, θ represents a transit angle ωT, ω represents angular frequency, and T represents transit time. For the analysis, the current equation, the Poisson's equation, and the current continuity equation are used, and a diffusion current and a trap state are ignored.

[Formula 2]

$$G = \frac{g\theta^3}{6}\frac{\theta - \sin\theta}{(\theta - \sin\theta)^2 + \left(\frac{\theta^2}{2} + \cos\theta - 1\right)^2} \tag{2}$$

$$B = \omega C = \frac{g\theta^3}{6}\frac{\frac{\theta^2}{2} + \cos\theta - 1}{(\theta - \sin\theta)^2 + \left(\frac{\theta^2}{2} + \cos\theta - 1\right)^2} \tag{3}$$

$$g = \frac{9}{4}\varepsilon\mu\frac{V_0}{d^3} \tag{4}$$

A method for calculating mobility from the frequency characteristics of capacitance is a −ΔB method. A method for calculating mobility from the frequency characteristics of conductance is a ωΔG method.

In practice, first, an electron-only device is fabricated using a material whose electron mobility is intended to be calculated. The electron-only device is a device designed such that only electrons flow therein as carriers. In this specification, a method for calculating mobility from the frequency characteristics of capacitance (the −ΔB method) is described.

Figure 17A:
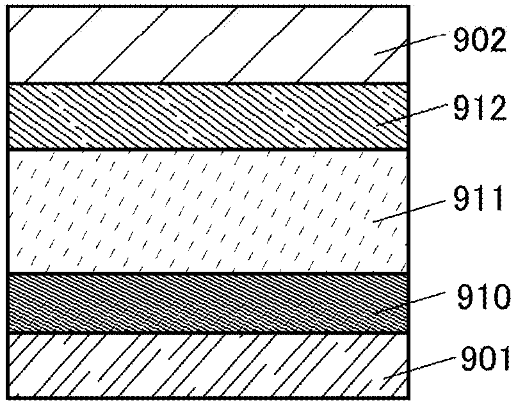
FIG. 17A is a diagram showing a structure of an electron-only device.

FIG. 17A illustrates a structure of the electron-only device fabricated for the measurement, and Table 1 shows its specific structure. The electron-only device fabricated in this reference example includes a first layer 910, a second layer 911, and a third layer 912 between a first electrode 901 (anode) and a second electrode 902 (cathode). The material whose electron mobility is intended to be calculated is used as a material for the second layer 911. In this reference example, the electron mobility of a film formed by co-evaporation of 2-{4-[9,10-di(naphthalen-2-yl)-2-anthryl]phenyl}-1-phenyl-1H-benzimidazole (abbreviation: ZADN) and 8-quinolinolato-lithium (abbreviation: Liq) in 1:1 (weight ratio) was measured. In this reference example, the electron mobilities of 7-[4-(10-phenyl-9-anthryl)phenyl]-

7H-dibenzo[c,g]carbazole (abbreviation: cgDBCzPA) and 2-[3'-(dibenzothiophen-4-yl)biphenyl-3-yl]dibenzo[f,h]quinoxaline (abbreviation: 2mDBTBPDBq-II) were also measured.

TABLE 1

| First electrode (anode) | | | First layer | Second layer | Third layer | Second electrode (cathode) |
|---|---|---|---|---|---|---|
| 100 nm | 50 nm | 100 nm | 1 nm | 200 nm | 1 nm | 100 nm |
| APC | ITSO | Al | Liq | ZADN:Liq (1:1) | Liq | Al |

Figure 18:
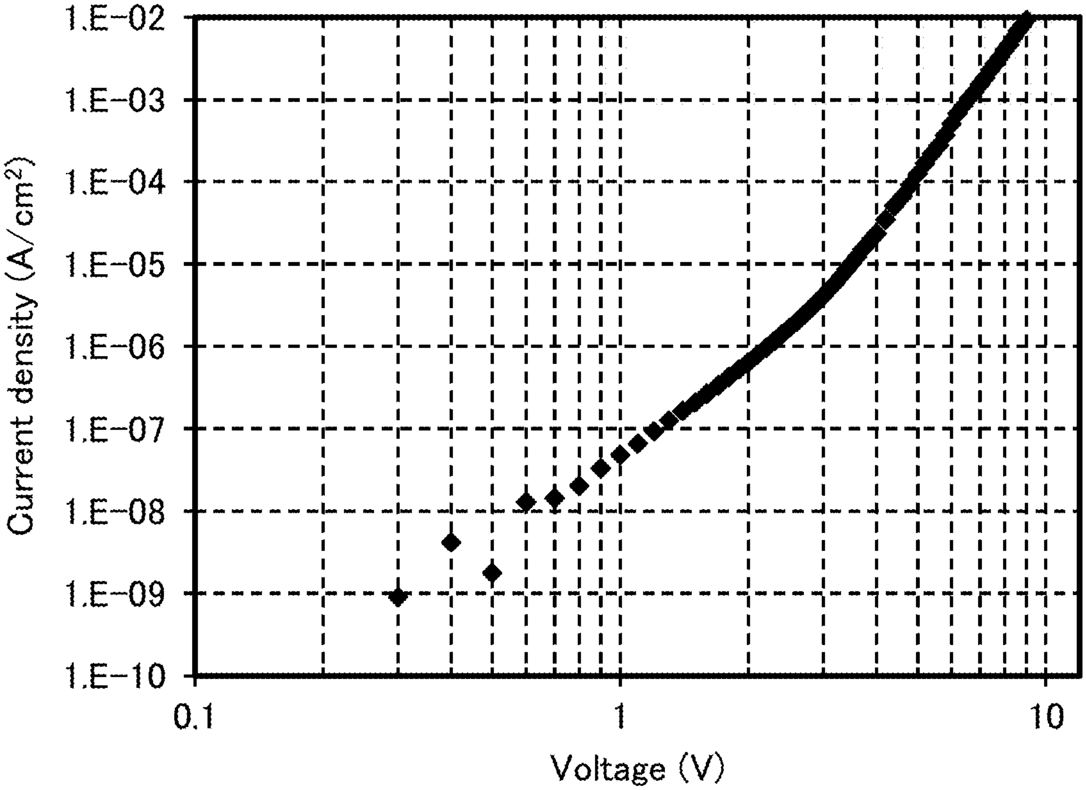
FIG. 18 is a diagram showing current density-voltage characteristics of an electron-only device.

FIG. 18 shows the current density-voltage characteristics of the electron-only device using the film formed by co-evaporation of ZADN and Liq as the second layer 911.

Figure 19:
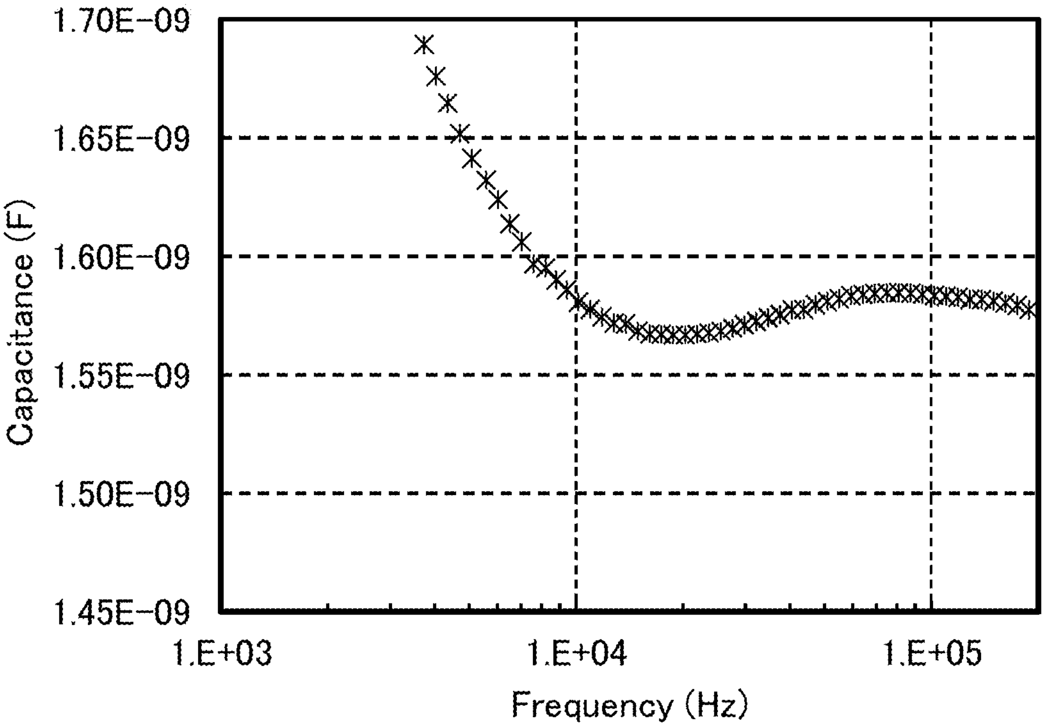
FIG. 19 is a diagram showing frequency characteristics of calculated capacitance C when a direct current power is 7.0 V and ZADN:Liq is 1:1.

The impedance was measured under the conditions where the DC voltage was applied in the range of 5.0 V to 9.0 V, the AC voltage was 70 mV, and the frequency was 1 Hz to 3 MHz. Here, capacitance is calculated from admittance, which is the reciprocal number of the obtained impedance (the above formula (1)). FIG. 19 shows the frequency characteristics of the calculated capacitance C when the application voltage was 7.0 V.

The frequency characteristics of the capacitance C are obtained from a phase difference in current, which is generated because a space charge generated by carriers injected by the micro voltage signal cannot completely follow the micro AC voltage. The transit time of the injected carriers in the film is defined by time T until the carriers reach a counter electrode, and is represented by the following formula (5).

[Formula 3]

$$T = \frac{4}{3}\frac{L^2}{\mu V_0} \quad (5)$$

A negative susceptance change ($-\Delta B$) corresponds to a value ($-\omega\Delta C$) obtained by multiplying a capacitance change $-\Delta C$ by angular frequency c. According to the formula (3), there is a relation between peak frequency on the lowest frequency side $f'_{max}$ ($=\omega_{max}/2\pi$) and the transit time T as shown in the following formula (6).

[Formula 4]

$$T = \frac{4.5}{2\pi f'_{max}} \quad (6)$$

Figure 20:
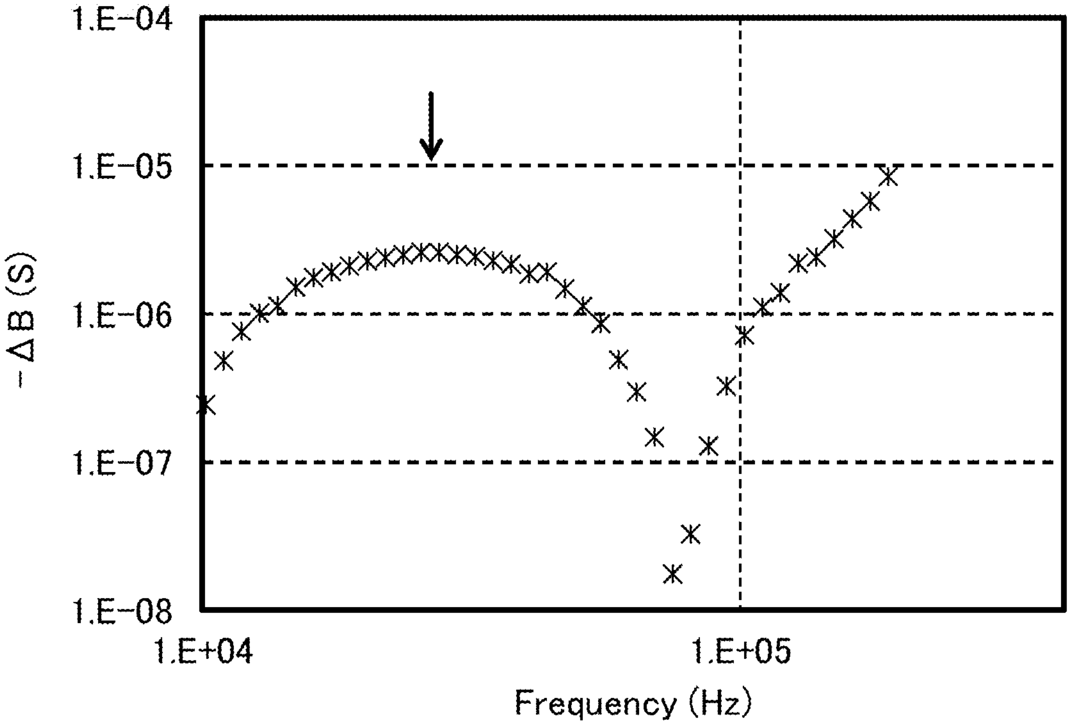
FIG. 20 is a diagram showing frequency characteristics of $-\Delta B$ when a direct current voltage is 7.0 V and ZADN:Liq is 1:1.

FIG. 20 shows the frequency characteristics of $-\Delta B$ calculated from the above measurement (i.e., $-\Delta B$ at a DC voltage of 7.0 V). The peak frequency on the lowest frequency side $f'_{max}$ that is obtained from FIG. 20 is indicated by an arrow in the diagram.

The transit time T is obtained from $f'_{max}$ obtained from the above measurement and analysis (formula (6)); thus, in this example, the electron mobility at a voltage of 7.0 V can be obtained from the above formula (5). Through the same measurement with the DC voltage in the range of 5.0 V to 9.0 V, the electron mobility at each voltage (electric field strength) can be calculated, so that the electric field strength dependence of the mobility can also be measured.

Figure 21:
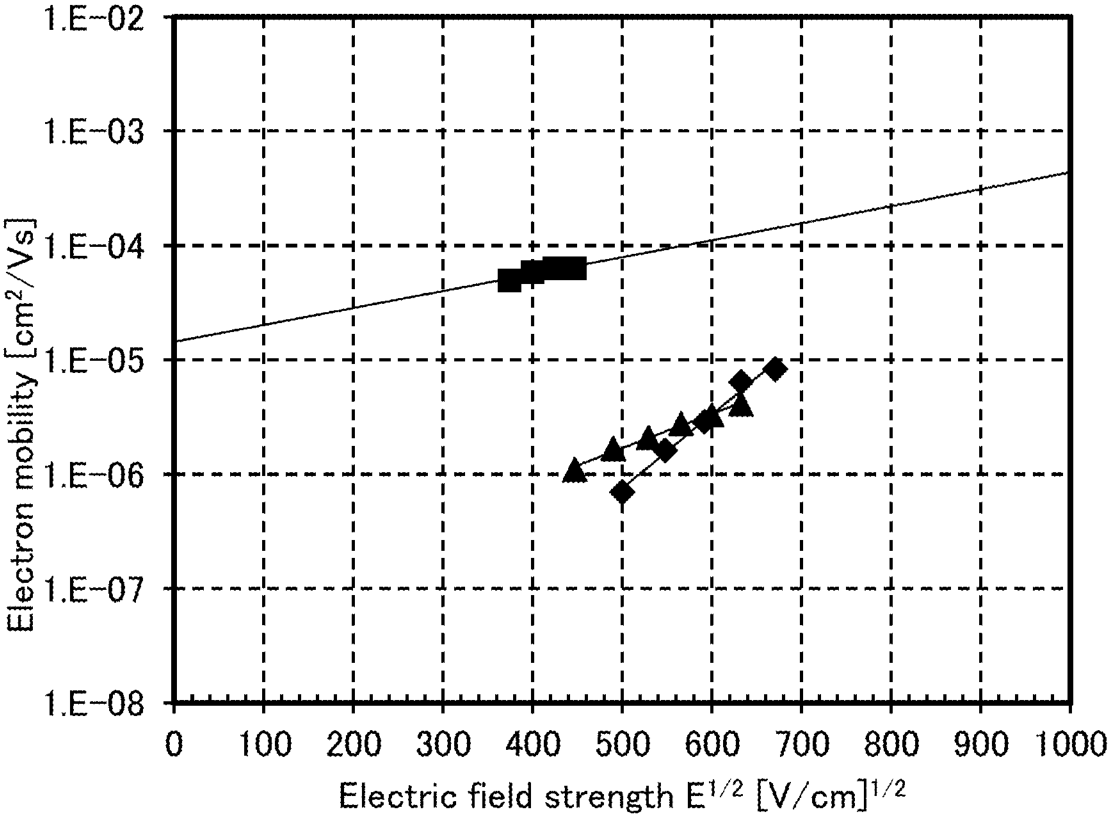
FIG. 21 is a diagram showing electric field strength dependence of electron mobility of organic compounds.

FIG. 21 shows the final electric field strength dependence of the electron mobility of the organic compounds obtained by the above calculation method, and Table 2 shows the values of the electron mobility read from the diagram when the square root of the electric field strength [V/cm] was 600 $[V/cm]^{1/2}$. In FIG. 21, squares represent the result of cgDBCzPA, triangles represent the result of 2mDBTBPDBq-II, and rhombuses represent the result of the film formed by co-evaporation of ZADN and Liq.

TABLE 2

| | Electron mobility ($cm^2/Vs$) |
|---|---|
| cgDBCzPA | $7.7 \times 10^{-5}$ |
| 2mDBTBPDBq-II | $2.2 \times 10^{-5}$ |
| ZADN:Liq (1:1) | $3.5 \times 10^{-6}$ |

The electron mobility can be calculated as described above. For the details of the measurement method, the following reference can be referred to: Takayuki Okachi et al., "*Japanese Journal of Applied Physics*", vol. 47, No. 12, 2008, pp. 8965-8972.

Example 1

In this example, light-emitting devices that can be used for the display device of one embodiment of the present invention were fabricated and evaluation results thereof are described.

Figure 17B:
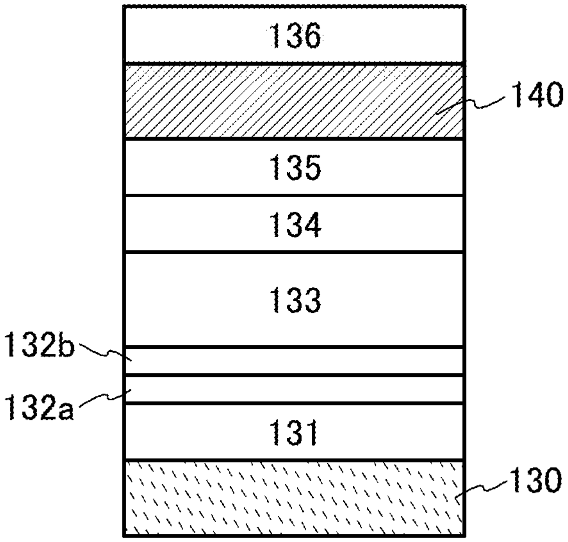
FIG. 17B is a diagram showing a structure of a light-emitting device in Examples.

In this example, a device R1 that emits red light, a device G1 that emits green light, and a device B1 that emits blue light were fabricated as light-emitting devices and evaluation results thereof are described. FIG. 17B illustrates the device structure used in this example, and Table 3 shows specific structures. The chemical formulae of the materials used in this example are shown below.

TABLE 3

| | First electrode 130 | | Hole-injection layer 131 | Hole-transport layer 132a | Hole-transport layer 132b | Light-emitting layer 133 | Electron-transport layer 134 | Electron-injection layer 135 | Second electrode 140 | Buffer layer 136 |
|---|---|---|---|---|---|---|---|---|---|---|
| Device R1 | APC (100 nm) | ITSO (110 nm) | BBABnf: ALD-MP001Q (1:0.05 10 nm) | BBABnf (30 nm) | PCBBiF (50 nm) | * | ZADN:Liq (1:1 25 nm) | Liq (1 nm) | Ag:Mg (1:0.1 15 nm) | DBT3P-II 80 nm |
| Device G1 | APC (100 nm) | ITSO (85 nm) | BBABnf: ALD-MP001Q (1:0.05 10 nm) | BBABnf (10 nm) | PCBBi1BP (60 nm) | ** | ZADN:Liq (1:1 25 nm) | Liq (1 nm) | Ag:Mg (1:0.1 15 nm) | DBT3P-II 80 nm |

TABLE 3-continued

| | First electrode 130 | | Hole-injection layer 131 | Hole-transport layer 132a | Hole-transport layer 132b | Light-emitting layer 133 | Electron-transport layer 134 | Electron-injection layer 135 | Second electrode 140 | Buffer layer 136 |
|---|---|---|---|---|---|---|---|---|---|---|
| Device B1 | APC (100 nm) | ITSO (85 nm) | BBABnf: ALD-MP001Q (1:0.05 10 nm) | BBABnf (25 nm) | PCzN2 (10 nm) | *** | ZADN:Liq (1:0.8 25 nm) | Liq (1 nm) | Ag:Mg (1:0.1 15 nm) | DBT3P-II 80 nm |

* 9mDBtBPNfpr:PCBFF:ALD-MG018Q (0.7:0.3:0.05 60 nm)

** 8BP-4mDBtPBfpm:βNCCP:[Ir(ppy)$_2$(mbfpypy-d$_3$)] (0.6:0.4:0.1 50 nm)

*** αN-βNPAnth:3,10PCA2Nbf(IV)-02 (1:0.015 25 nm)

[Chemical formula 1]

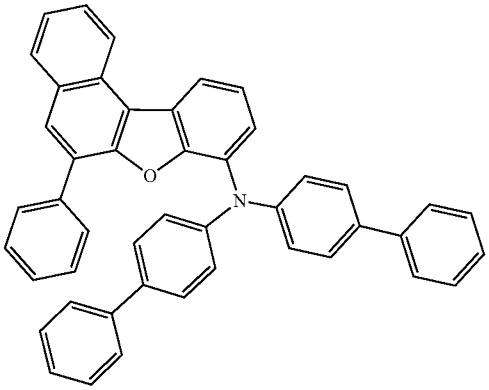

BBABnf

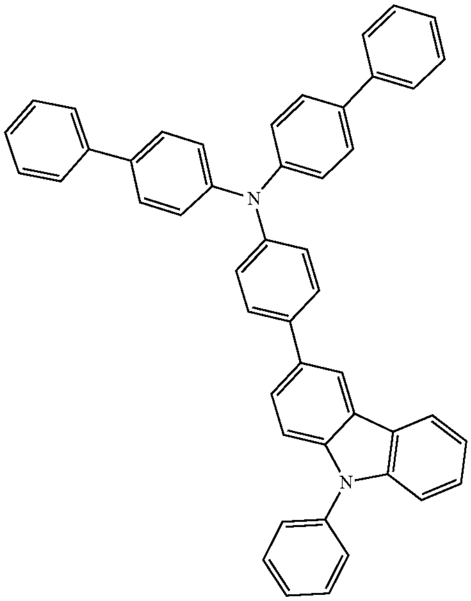

PCBBi1BP

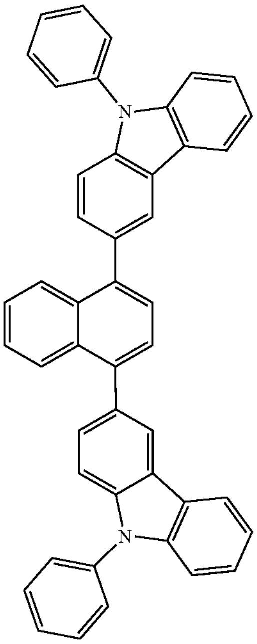

PCzN2

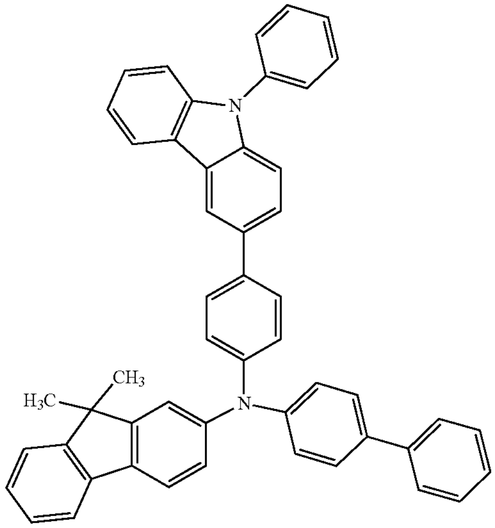

PCBBiF

-continued
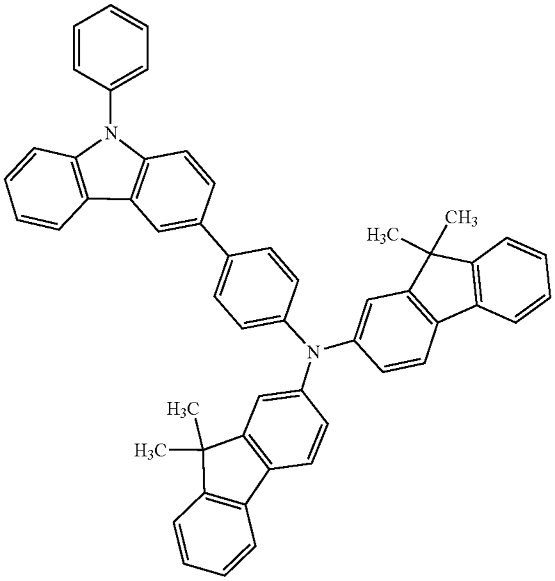
PCBFF
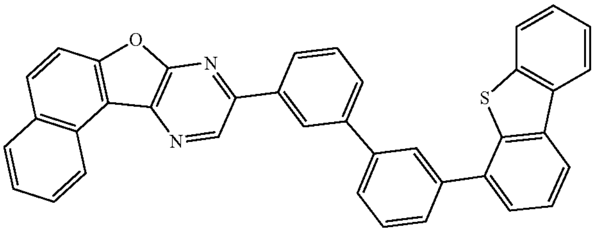
9mDBtBPNfpr
[Chemical formula 2]
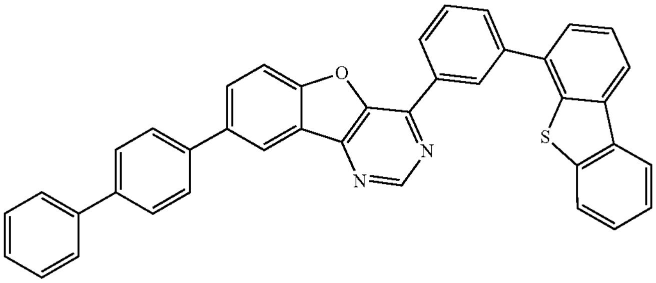
8BP-4mDBtPBfpm
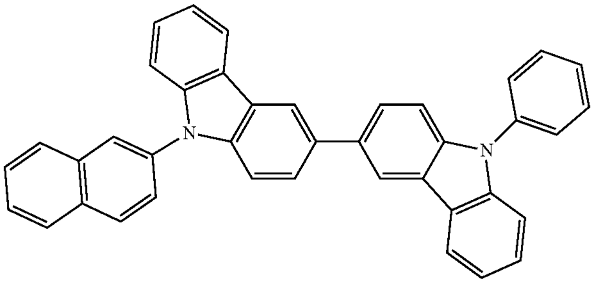
β NCCP
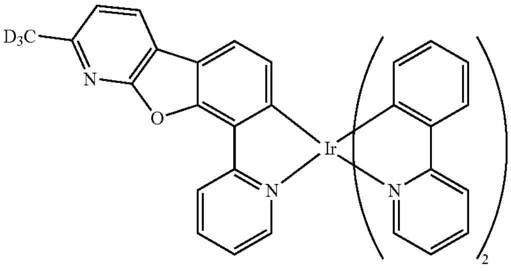
[Ir(ppy)$_2$(mbfpypy-d$_3$)]

-continued
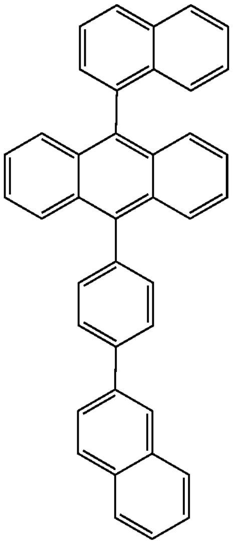
α N-β NPAnth
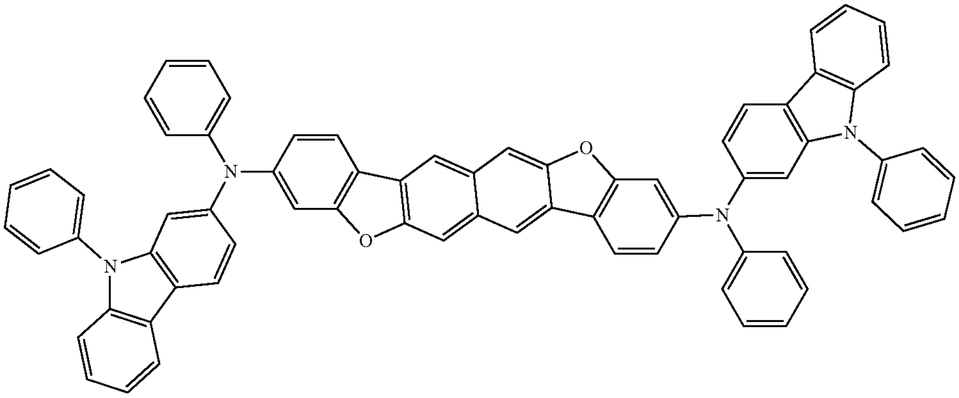
3,10PCA2Nbf(IV)-02
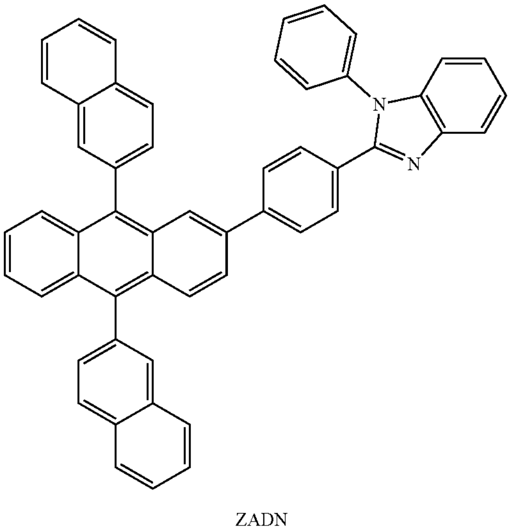
ZADN
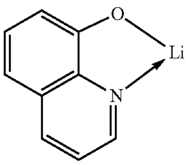
Liq -continued

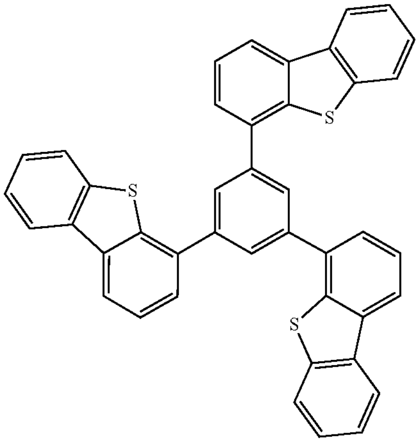

DBT3P-II

<<Fabrication of Light-Emitting Devices>>

As illustrated in FIG. 17B, the device R1, the device G1, and the device B1 fabricated in this example each have a structure in which a first electrode 130 is formed over a substrate (not illustrated), a hole-injection layer 131, a hole-transport layer 132*a*, a hole-transport layer 132*b*, a light-emitting layer 133, an electron-transport layer 134, and an electron-injection layer 135 are sequentially stacked over the first electrode 130, and a second electrode 140 is formed over the electron-injection layer 135. Each device further includes a buffer layer 136 over the second electrode 140. The buffer layer 136 has a function of reducing loss of optical energy due to a surface plasmon in the second electrode 140 (transflective electrode). Any of a variety of organic films that can be used for the light-emitting device can be employed as the buffer layer 136.

First, the first electrode 130 was formed over the substrate. The electrode area was set to 4 $mm^2$ (2 mm×2 mm). A glass substrate was used as the substrate. The first electrode 130 was formed in such a manner that an alloy of silver (Ag), palladium (Pd), and copper (Cu) (Ag—Pd—Cu (APC)) was deposited by a sputtering method and indium tin oxide containing silicon oxide (ITSO) was deposited by a sputtering method. In the device R1, APC was deposited to have a thickness of 100 nm, and ITSO was deposited to have a thickness of 110 nm. In each of the device G1 and the device B1, APC was deposited to have a thickness of 100 nm, and ITSO was deposited to have a thickness of 85 nm. In this example, the first electrode 130 functioned as an anode.

As pretreatment, a surface of the substrate was washed with water, baking was performed at 200° C. for one hour, and then UV ozone treatment was performed for 370 seconds. After that, the substrate was transferred into a vacuum evaporation apparatus in which the pressure was reduced to approximately $10^{-4}$ Pa, vacuum baking at 170° C. for 30 minutes was performed in a heating chamber in the vacuum evaporation apparatus, and then the substrate was cooled down for approximately 30 minutes.

Next, the hole-injection layer 131 was formed over the first electrode 130. The hole-injection layer 131 was formed in such a manner that after the pressure in a vacuum evaporation apparatus was reduced to $10^{-4}$ Pa, N,N-bis(4-biphenyl)-6-phenylbenzo[b]naphtho[1,2-d]furan-8-amine (abbreviation: BBABnf) and ALD-MP001Q (produced by Analysis Atelier Corporation, material serial No. 1S20180314) were co-evaporated in a weight ratio of 1:0.05 (=BBABnf:ALD-MP001Q) to have a thickness of 10 nm. ALD-MP001Q has a property of accepting electrons from BBABnf.

Then, the hole-transport layer 132*a* was formed over the hole-injection layer 131. The hole-transport layer 132*a* was formed by evaporation of BBABnf. In the device R1, the hole-transport layer 132*a* was formed to have a thickness of 30 nm; in the device G1, to have a thickness of 10 nm; and in the device B1, to have a thickness of 25 nm.

Then, the hole-transport layer 132*b* was formed over the hole-transport layer 132*a*.

The hole-transport layer 132*b* of the device R1 was formed to have a thickness of 50 nm by evaporation of N-(1,1'-biphenyl-4-yl)-N-[4-(9-phenyl-9H-carbazol-3-yl)phenyl]-9,9-dimethyl-9H-fluoren-2-amine (abbreviation: PCBBiF).

The hole-transport layer 132*b* of the device G1 was formed to a thickness of 60 nm by evaporation of 4,4'-diphenyl-4"-(9-phenyl-9H-carbazol-3-yl)triphenylamine (abbreviation: PCBBi1BP).

The hole-transport layer 132*b* of the device B1 was formed to have a thickness of 10 nm by evaporation of 3,3'-(naphthalen-1,4-diyl)bis(9-phenyl-9H-carbazole) (abbreviation: PCzN2).

Next, the light-emitting layer 133 was formed over the hole-transport layer 132*b*.

The light-emitting layer 133 of the device R1 was formed to have a thickness of 60 nm by co-evaporation of 9-[(3'-dibenzothiophen-4-yl)biphenyl-3-yl]naphtho[1',2':4,5]furo[2,3-b]pyrazine (abbreviation: 9mDBtBPNfpr), N-[4-(9-phenyl-9H-carbazol-3-yl)phenyl]-bis(9,9-dimethyl-9H-fluoren-2-yl)amine (abbreviation: PCBFF), and ALD-MG018Q (produced by Analysis Atelier Corporation, material serial No. 1S20161025) in a weight ratio of 0.7:0.3:0.05 (=9mDBtBPNfpr:PCBFF:ALD-MG018Q). ALD-MG018Q is a red-light-emitting substance.

The light-emitting layer 133 of the device G1 was formed to have a thickness of 50 nm by co-evaporation of 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-(2-naphthyl)-9'-phenyl-9H,9'H-3,3'-bicarbazole (abbreviation: βNCCP), and [2-d3-methyl-(2-pyridinyl-κN)benzofuro[2,3-b]pyridine-KC]bis[2-(2- pyridinyl-κN)phenyl-κC]iridium(III) (abbreviation: [Ir(ppy)$_2$(mbfpypy-d$_3$)]) in a weight ratio of 0.6:0.4:0.1 (=8BP-4mDBtPBfpm: βNCCP:[Ir(ppy)$_2$(mbfpypy-d$_3$)]). [Ir (ppy)$_2$(mbfpypy-d$_3$)] is a green-light-emitting substance.

The light-emitting layer 133 of the device B1 was formed to have a thickness of 25 nm by co-evaporation of 9-(1-naphthyl)-10-[4-(2-naphthyl)phenyl]anthracene (abbreviation: αN-βNPAnth) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) in a weight ratio of 1:0.015 (=αN-βNPAnth:3,10PCA2Nbf(IV)-02). Note that 3,10PCA2Nbf(IV)-02 is a blue-light-emitting substance.

Next, the electron-transport layer 134 was formed over the light-emitting layer 133. The electron-transport layer 134 of each of the device R1 and the device G1 was formed to have a thickness of 25 nm by co-evaporation of 2-{4-[9,10-di(naphthalen-2-yl)-2-anthryl]phenyl}-1-phenyl-1H-benzimidazole (abbreviation: ZADN) and 8-quinolinolato-lithium (abbreviation: Liq) in a weight ratio of 1:1 (=ZADN: Liq). The electron-transport layer 134 of the device B1 was formed to have a thickness of 25 nm by co-evaporation of ZADN and Liq in a weight ratio of 1:0.8 (=ZADN:Liq).

Then, the electron-injection layer 135 was formed over the electron-transport layer 134. The electron-injection layer 135 was formed to have a thickness of 1 nm by evaporation of Liq.

Then, the second electrode 140 was formed over the electron-injection layer 135. The second electrode 140 was formed to have a thickness of 15 nm by co-evaporation of sliver (Ag) and magnesium (Mg) in a volume ratio of 1:0.1 (=Ag:Mg). Note that in this example, the second electrode 140 functioned as a cathode.

Then, the buffer layer 136 was formed over the second electrode 140. The buffer layer 136 was formed to have a thickness of 80 nm by evaporation of 4,4',4"-(benzene-1,3,5-triyl)tri(dibenzothiophene) (abbreviation: DBT3P-II).

Through the above steps, the light-emitting devices in each of which an EL layer was provided between the pair of electrodes over the substrate were formed. Note that in all the evaporation steps in the above fabrication method, an evaporation method by a resistance-heating method was used.

The light-emitting device fabricated as described above was sealed using a different substrate (not illustrated). At the time of the sealing using the different substrate (not illustrated), the different substrate (not illustrated) on which an adhesive that is solidified by ultraviolet light was applied was fixed onto the substrate in a glove box containing a nitrogen atmosphere, and the substrates were bonded to each other such that the adhesive was attached to the periphery of the light-emitting device formed over the substrate. At the time of the sealing, the adhesive was irradiated with 365-nm ultraviolet light at 6 J/cm$^2$ to be solidified, and the adhesive was subjected to heat treatment at 80° C. for one hour to be stabilized.

<<Operation Characteristics of Light-Emitting Devices>>

The operation characteristics of the device R1, the device G1, and the device B1 were measured. Note that the measurement was carried out at room temperature (in an atmosphere maintained at 25° C.).

Figure 23:
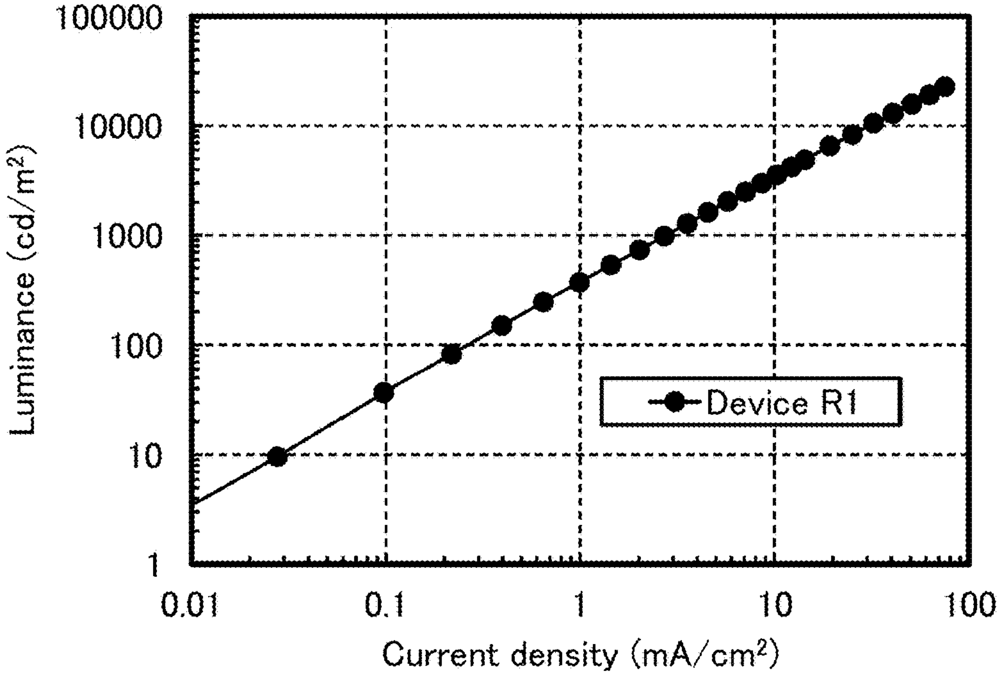
FIG. 23 is a diagram showing luminance-current density characteristics.
Figure 24:
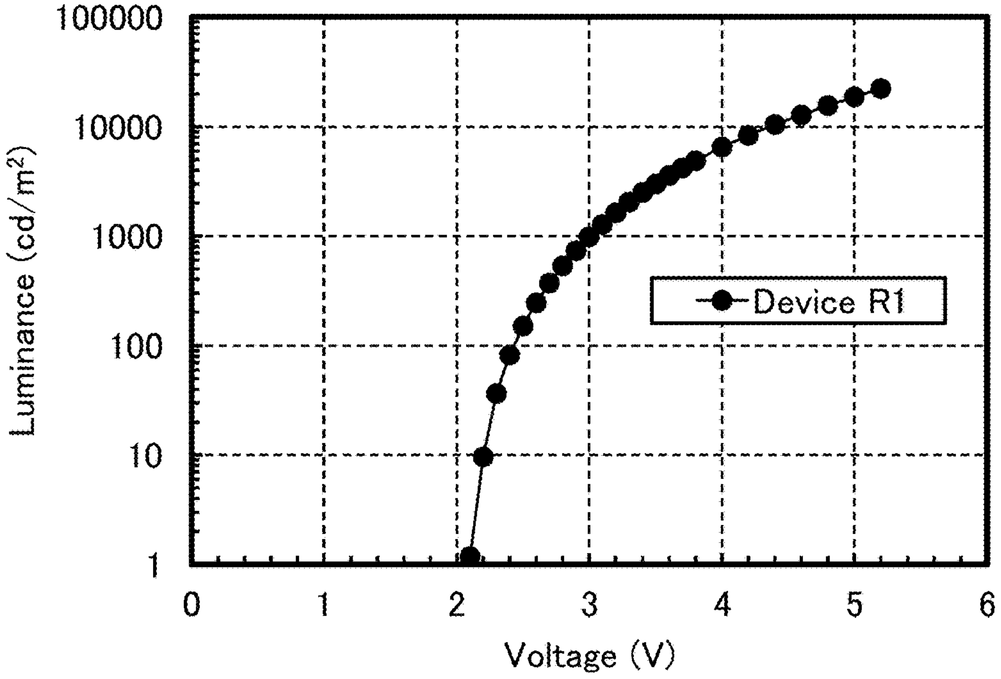
FIG. 24 is a diagram showing luminance-voltage characteristics.
Figure 25:
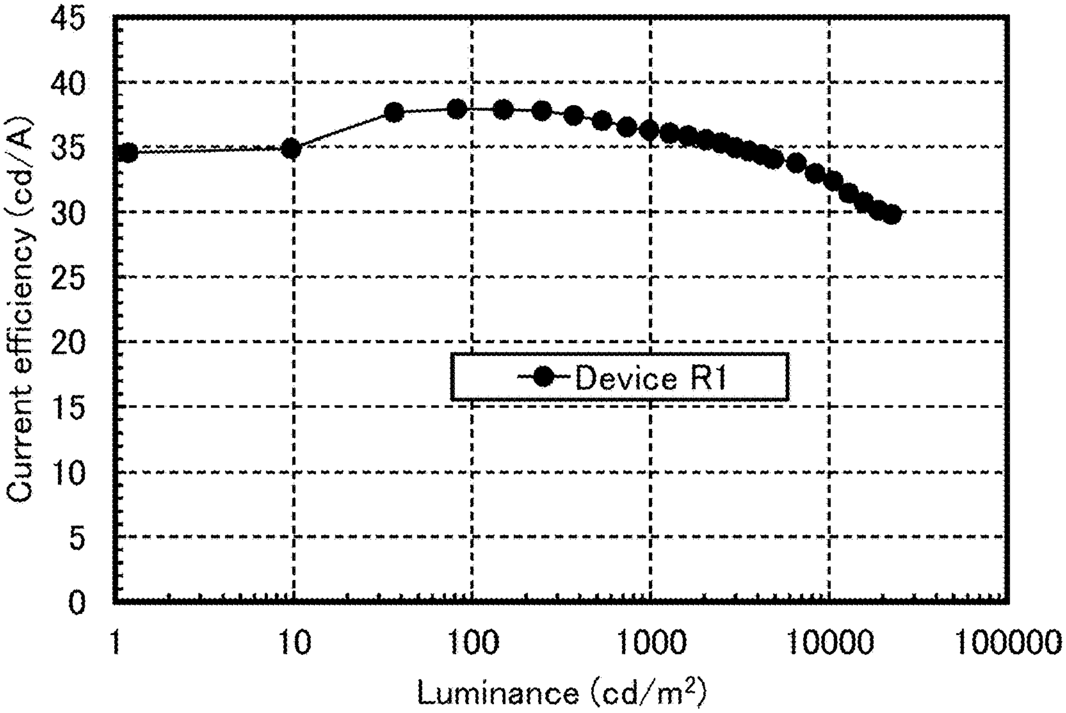
FIG. 25 is a diagram showing current efficiency-luminance characteristics.
Figure 26:
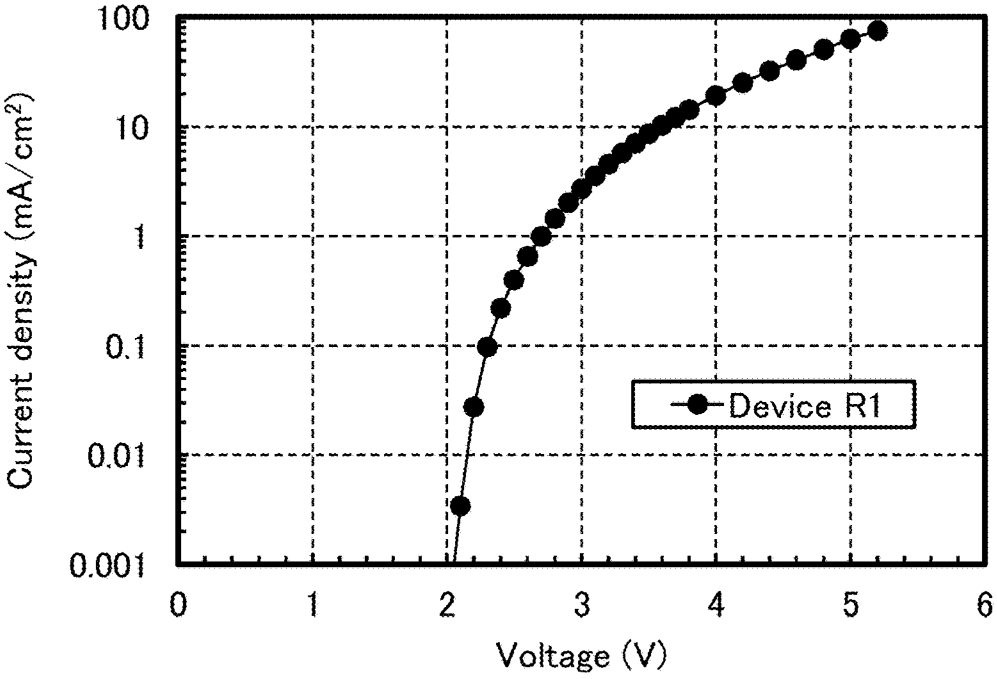
FIG. 26 is a diagram showing current density-voltage characteristics.
Figure 27:
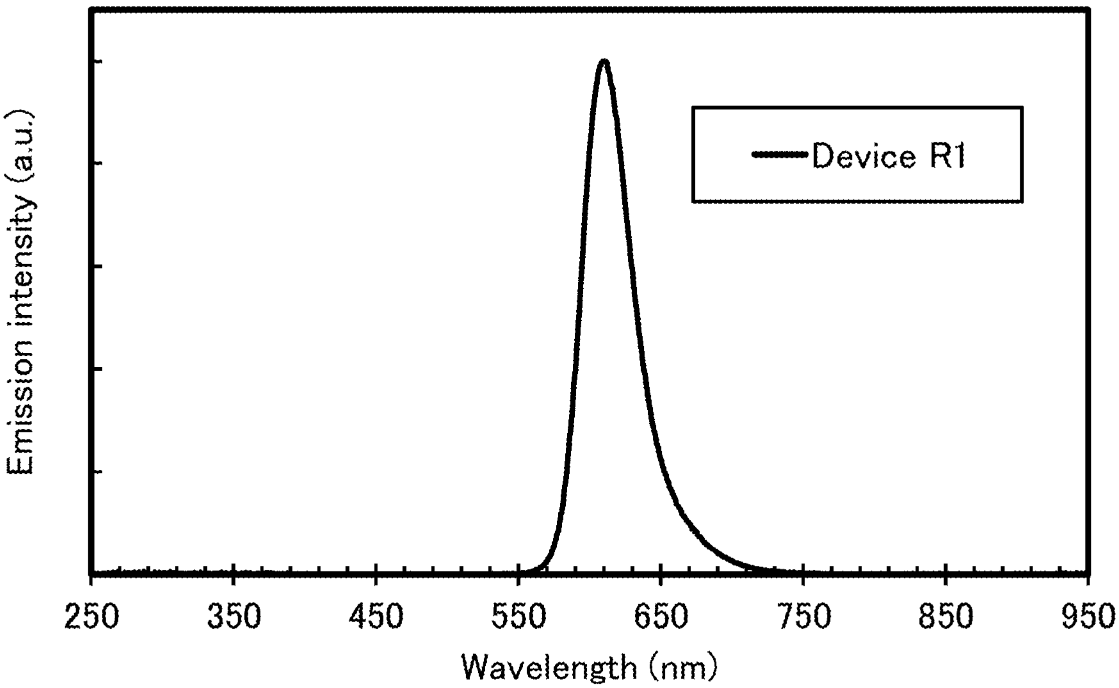
FIG. 27 is a diagram showing an emission spectrum.

FIG. 23 to FIG. 27 show the characteristics of the device R1. FIG. 23 is a diagram showing the luminance-current density characteristics of the device R1. FIG. 24 is a diagram showing the luminance-voltage characteristics of the device R1. FIG. 25 is a diagram showing the current efficiency-luminance characteristics of the device R1. FIG. 26 is a diagram showing the current density-voltage characteristics of the device R1. FIG. 27 is a diagram showing an emission spectrum when current at a current density of 5 mA/cm$^2$ was supplied to the device R1.

Figure 28:
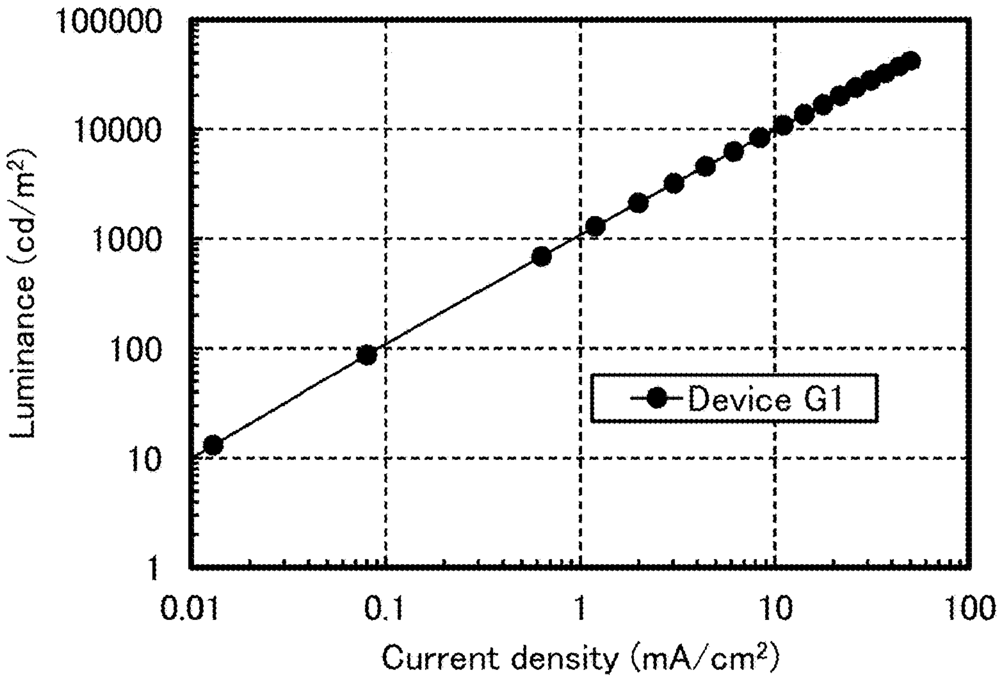
FIG. 28 is a diagram showing luminance-current density characteristics.
Figure 29:
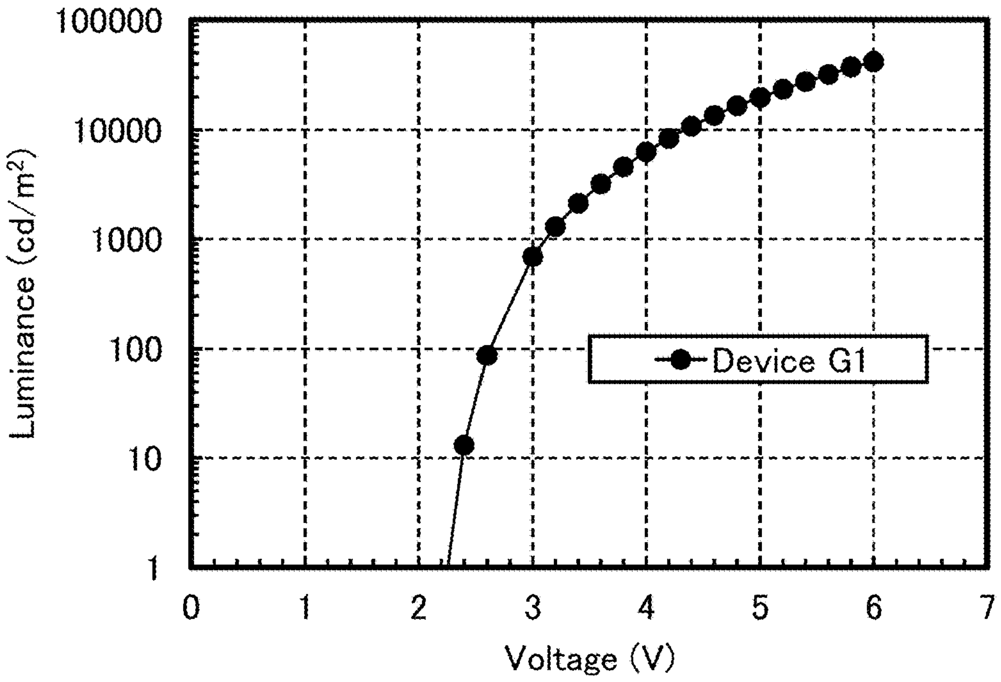
FIG. 29 is a diagram showing luminance-voltage characteristics.
Figure 30:
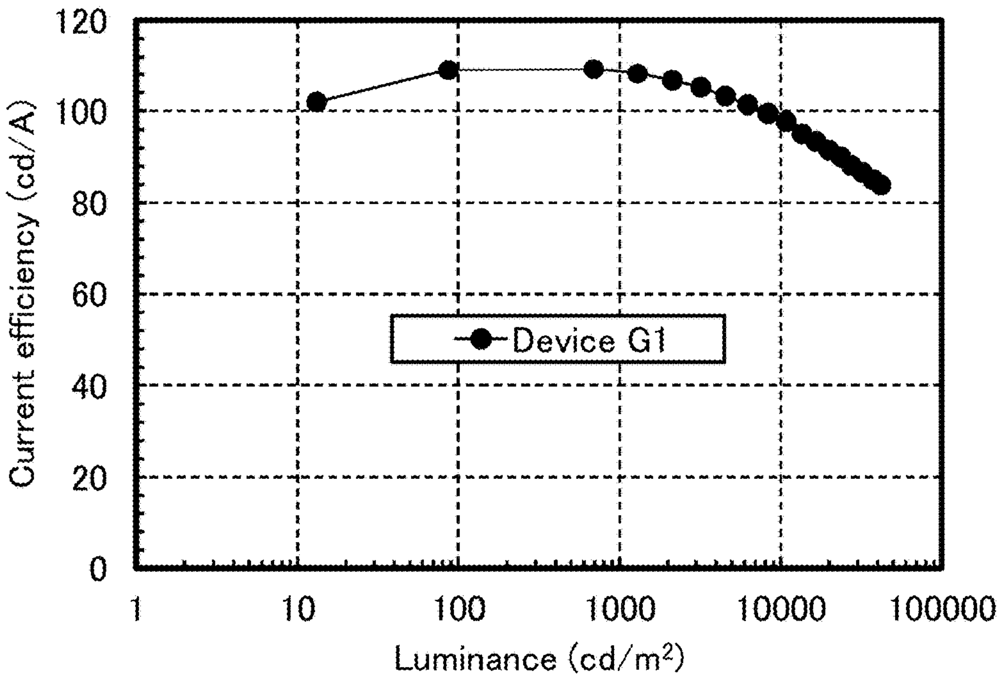
FIG. 30 is a diagram showing current efficiency-luminance characteristics.
Figure 31:
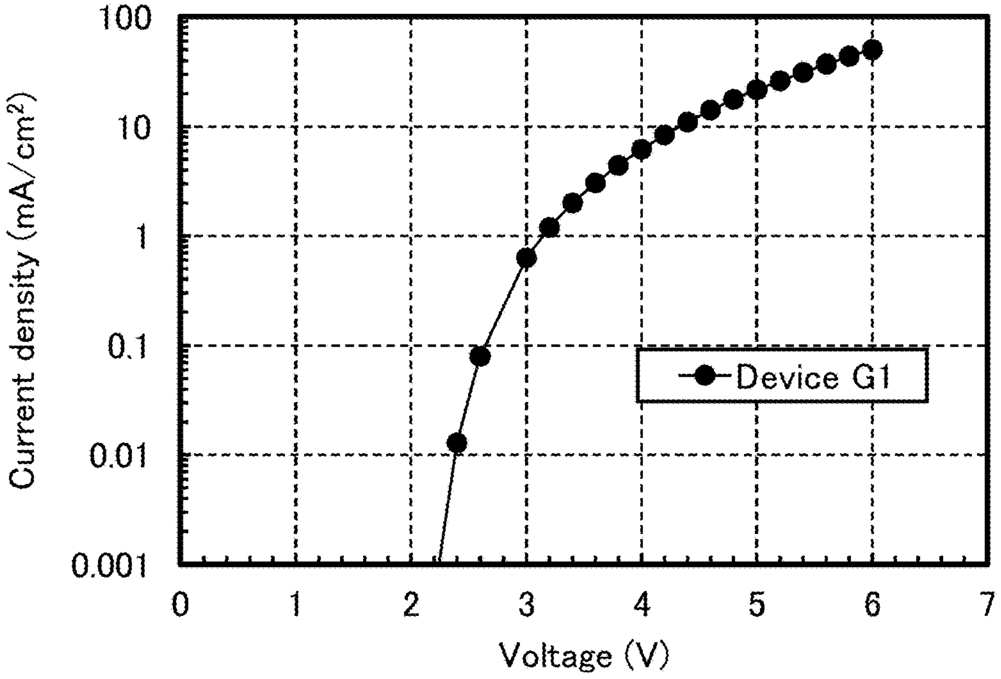
FIG. 31 is a diagram showing current density-voltage characteristics.
Figure 32:
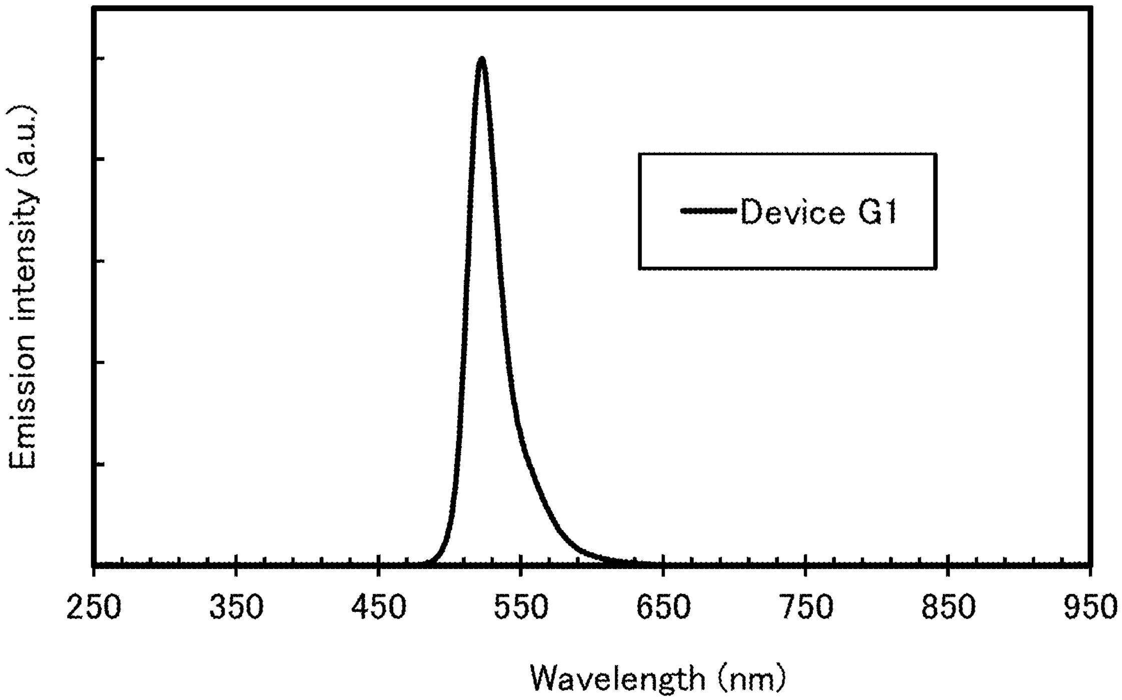
FIG. 32 is a diagram showing an emission spectrum.

FIG. 28 to FIG. 32 show the characteristics of the device G1. FIG. 28 is a diagram showing the luminance-current density characteristics of the device G1. FIG. 29 is a diagram showing the luminance-voltage characteristics of the device G1. FIG. 30 is a diagram showing the current efficiency-luminance characteristics of the device G1. FIG. 31 is a diagram showing the current density-voltage characteristics of the device G1. FIG. 32 is a diagram showing an emission spectrum when current at a current density of 5 mA/cm$^2$ was supplied to the device G1.

Figure 33:
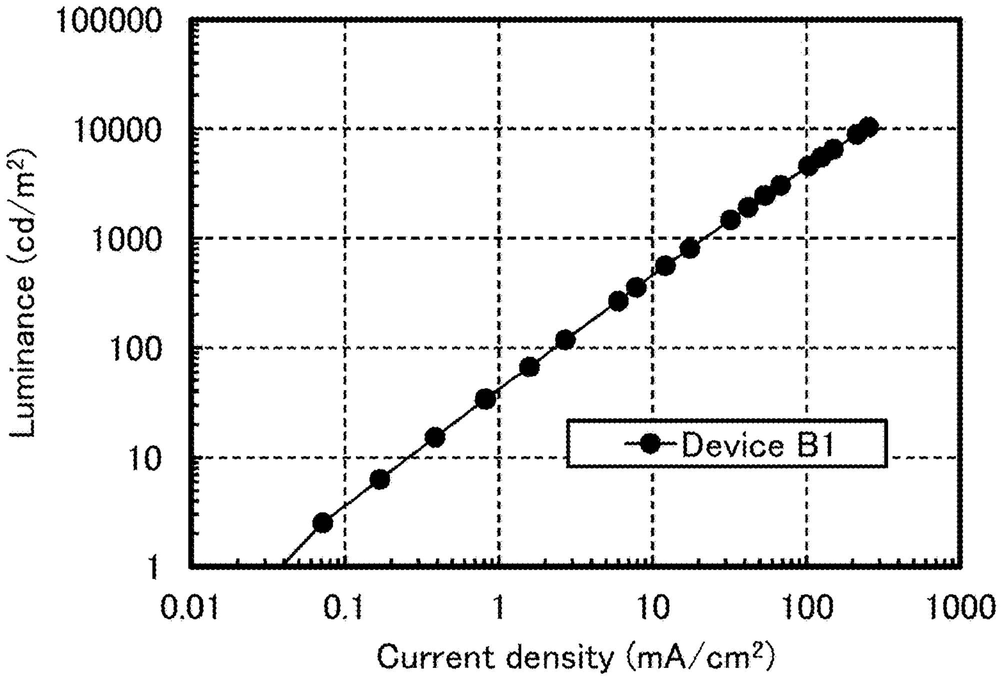
FIG. 33 is a diagram showing luminance-current density characteristics.
Figure 34:
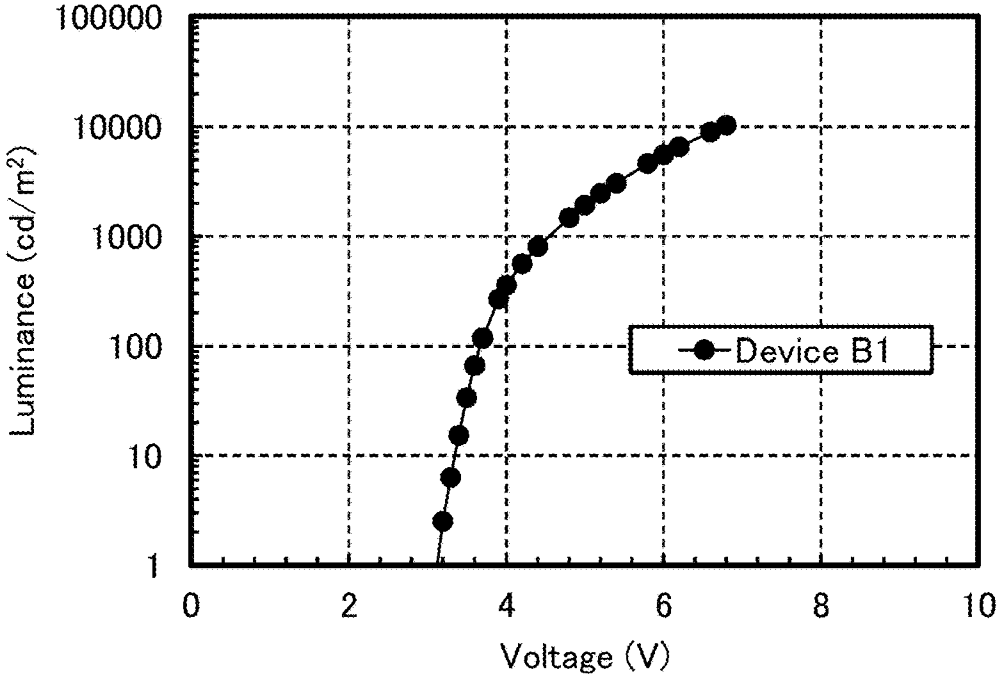
FIG. 34 is a diagram showing luminance-voltage characteristics.
Figure 35:
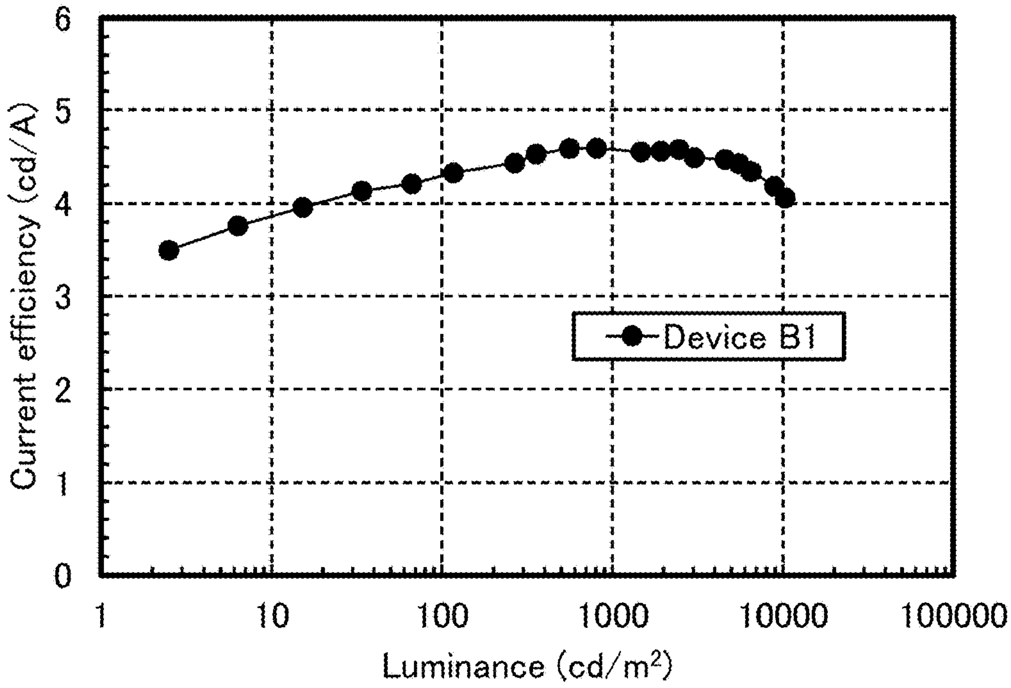
FIG. 35 is a diagram showing current efficiency-luminance characteristics.
Figure 36:
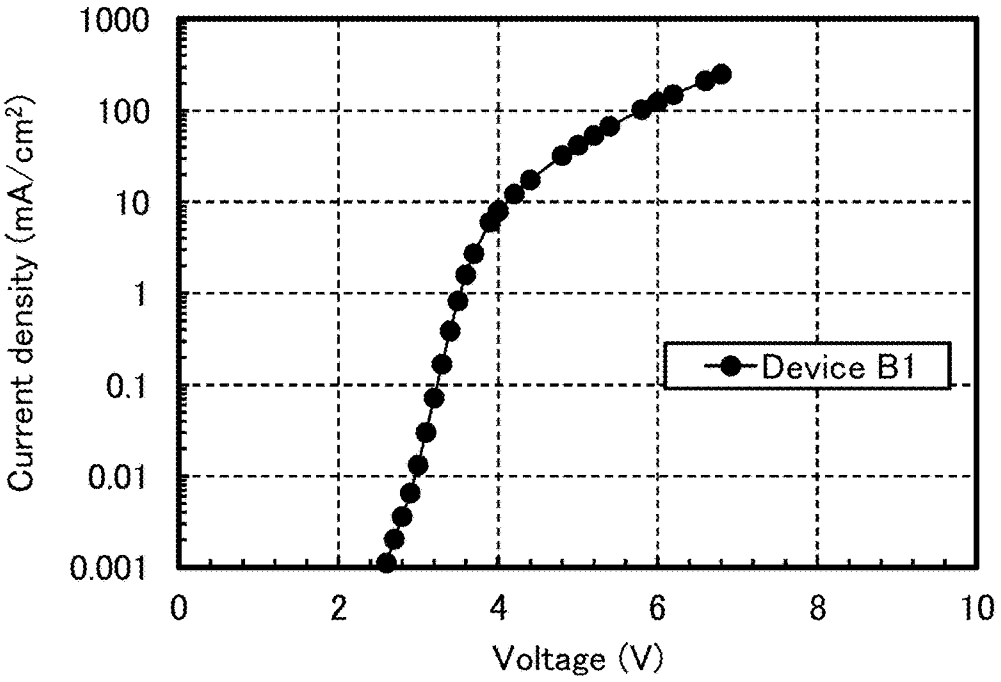
FIG. 36 is a diagram showing current density-voltage characteristics.
Figure 37:
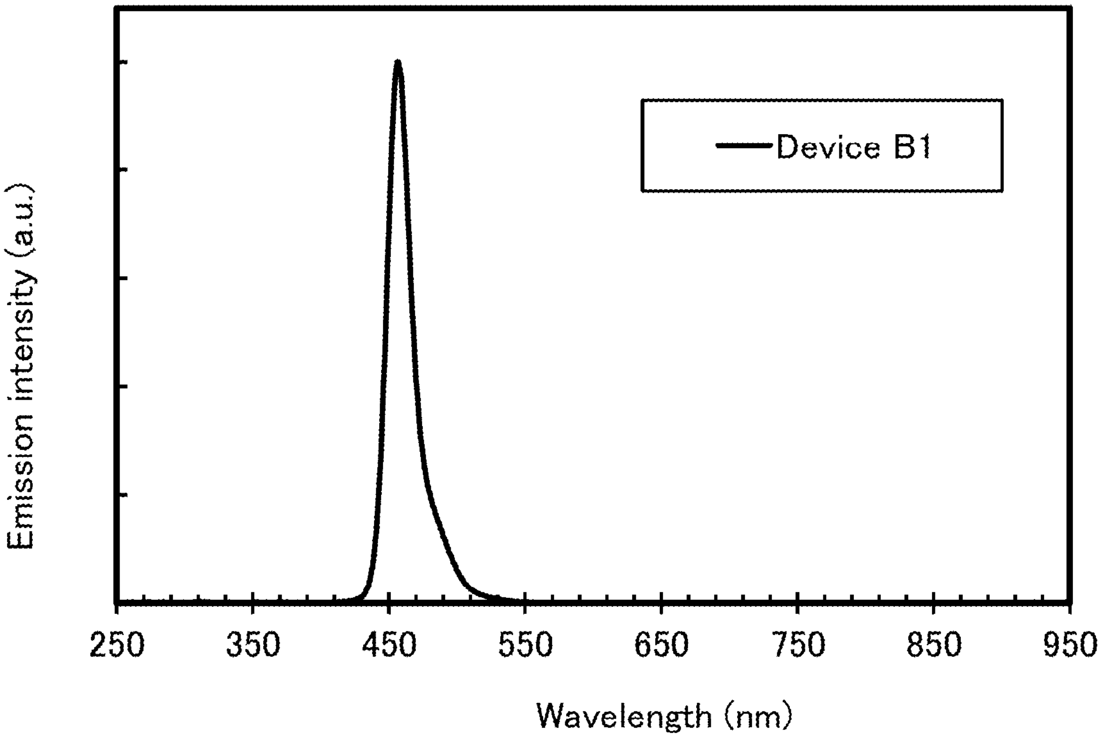
FIG. 37 is a diagram showing an emission spectrum.

FIG. 33 to FIG. 37 show the characteristics of the device B1. FIG. 33 is a diagram showing the luminance-current density characteristics of the device B1. FIG. 34 is a diagram showing the luminance-voltage characteristics of the device B1. FIG. 35 is a diagram showing the current efficiency-luminance characteristics of the device B1. FIG. 36 is a diagram showing the current density-voltage characteristics of the device B1. FIG. 37 is a diagram showing an emission spectrum when current at a current density of 25 mA/cm$^2$ was supplied to the device B1.

Table 4 shows the initial values of main characteristics of the respective light-emitting devices at around 1000 cd/m$^2$.

TABLE 4

| | Voltage (V) | Current (mA) | Current density (mA/cm$^2$) | Chromaticity x | Chromaticity y | Luminance (cd/m$^2$) | Current efficiency (cd/A) |
|---|---|---|---|---|---|---|---|
| Device R1 | 3.0 | 0.1 | 2.7 | 0.66 | 0.34 | 981 | 36 |
| Device G1 | 3.2 | 0.05 | 1.2 | 0.20 | 0.76 | 1295 | 106 |
| Device B1 | 4.4 | 0.7 | 18 | 0.14 | 0.05 | 804 | 4.6 |

As shown in Table 4, it was found that each of the devices R1, G1, and B1 exhibited light emission with high color purity and had high efficiency.

As shown in FIG. 27, the device R1 exhibited an emission spectrum having a maximum peak at around 609 nm. Furthermore, as shown in FIG. 32, the device G1 exhibited an emission spectrum having a maximum peak at around 523 nm. Moreover, as shown in FIG. 37, the device B1 exhibited an emission spectrum having a maximum peak at around 457 nm.

<<Reliability Characteristics of Light-Emitting Devices>>

Figure 38:
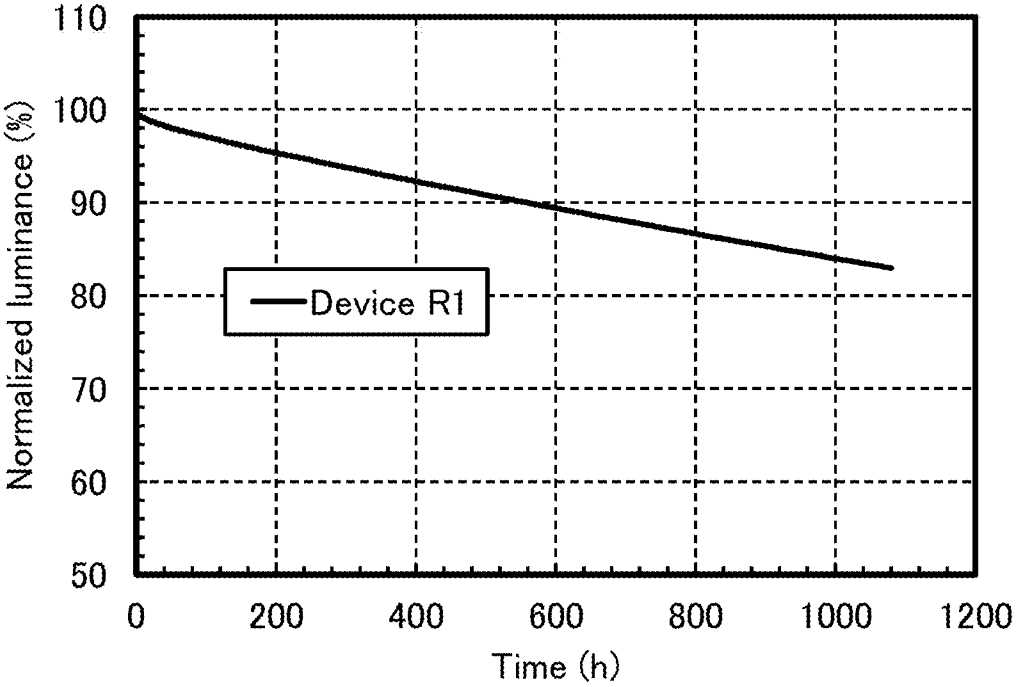
FIG. 38 is a diagram showing a result of a reliability test.
Figure 39:
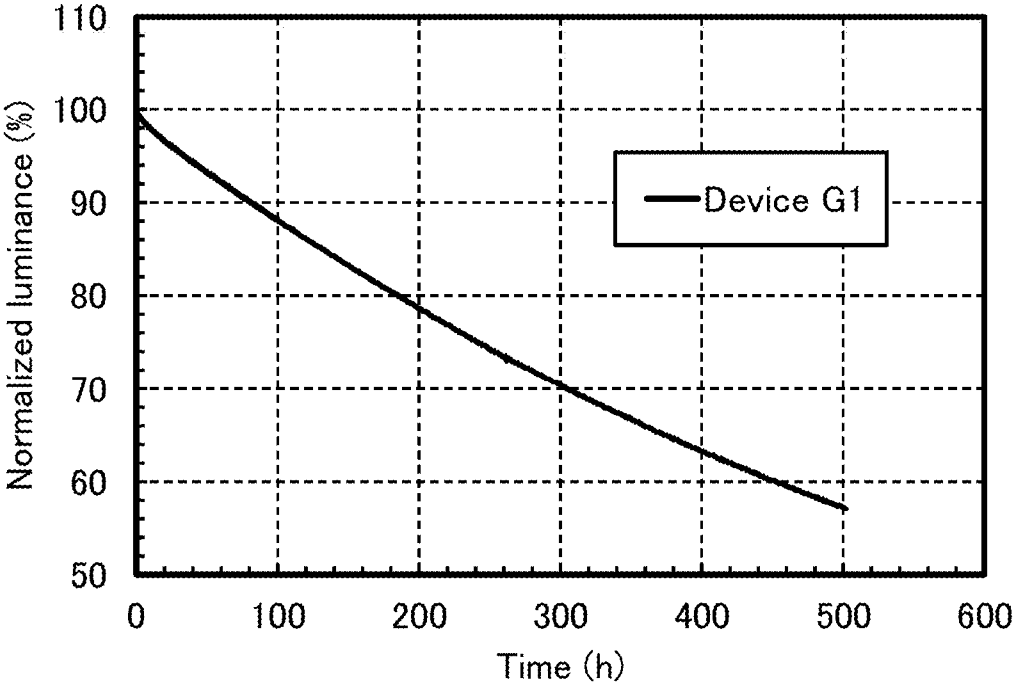
FIG. 39 is a diagram showing a result of a reliability test.
Figure 40:
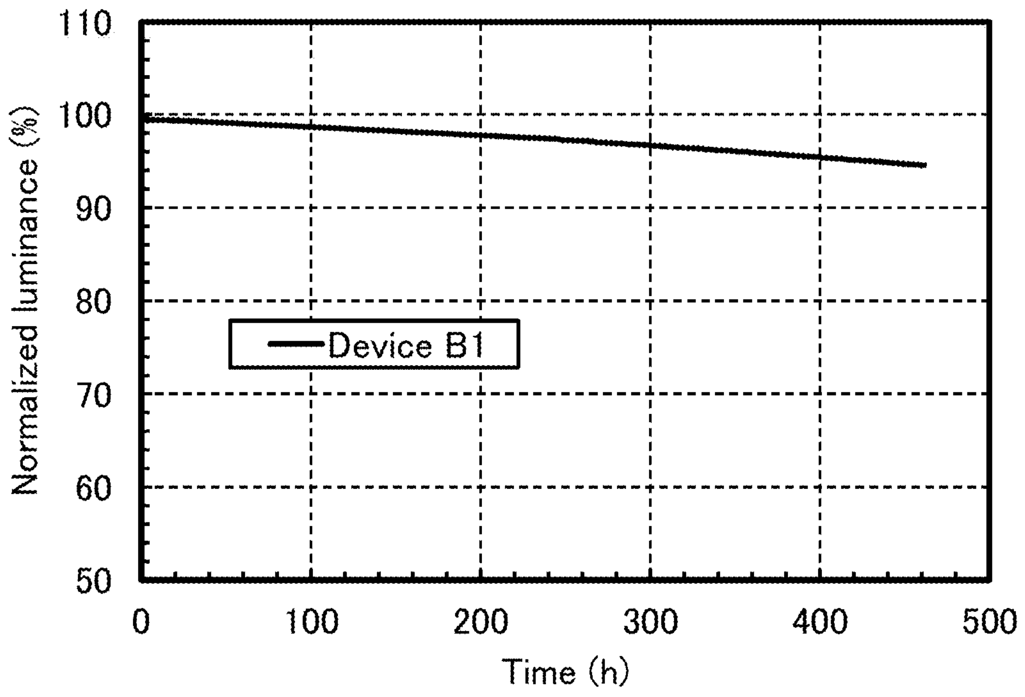
FIG. 40 is a diagram showing a result of a reliability test.

Next, a reliability test was performed on each light-emitting device. FIG. 38 to FIG. 40 show the results of the reliability test. In each of FIG. 38 to FIG. 40, the vertical axis represents normalized luminance (%) with an initial luminance of 100%, and the horizontal axis represents driving time (h). Note that in the reliability test, the device R1 was driven at a current density of 75 mA/$cm^2$ and the devices G1 and B1 were driven at a current density of 50 mA/$cm^2$.

It was found from FIG. 38 that the normalized luminance of the device R1 after 1100 hours was 83%. It was found from FIG. 39 that the normalized luminance of the device G1 after 500 hours was 57%. It was found from FIG. 40 that the normalized luminance of the device B1 after 460 hours was 95%.

As described above, any of the light-emitting devices that emitted red light, green light, and blue light had a long driving lifetime by employing the ReSTI structure in this example. In addition, either of the light-emitting devices that exhibited fluorescence and phosphorescence had a long driving lifetime by employing the ReSTI structure in this example.

The three light-emitting devices fabricated in this example included the light-emitting layers containing different materials from each other. Meanwhile, the three light-emitting devices included the layers containing the same material, and further the layers containing the same material and having the same thickness. Therefore, it was suggested that with common layers among light-emitting devices of three colors, the light-emitting devices having a long driving lifetime were able to be fabricated through fewer steps in fabrication of the display device of one embodiment of the present invention.

Example 2

In this example, light-emitting devices that can be used for the display device of one embodiment of the present invention were fabricated and evaluation results thereof are described.

In this example, a device R2 that emits red light, a device G2 that emits green light, and a device B2 that emits blue light were fabricated as light-emitting devices and evaluation results thereof are described. FIG. 17B illustrates the device structure used in this example, and Table 5 shows specific structures.

Note that Example 1 can be referred to for the chemical formulae of the materials used in this example and the fabrication method of the light-emitting devices.

Example 1 mainly in that the electron-transport layer 134 has a stacked-layer structure of two layers containing ZADN and Liq at different mixture ratios. Specifically, in the electron-transport layer 134 of each of the light-emitting devices of this example, the cathode (the second electrode 140) side has a smaller Liq content than the anode (the first electrode 130) side.

<<Operation Characteristics of Light-Emitting Devices>>

The operation characteristics of the device R2, the device G2, and the device B2 were measured. Note that the measurement was carried out at room temperature (in an atmosphere maintained at 25° C.).

Figure 41:
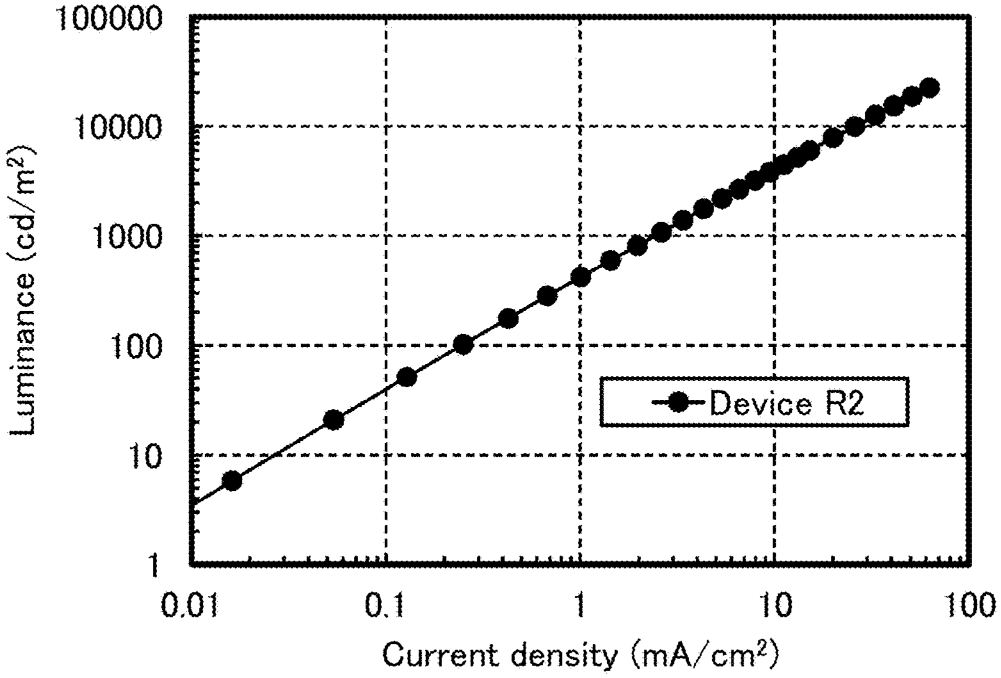
FIG. 41 is a diagram showing luminance-current density characteristics.
Figure 42:
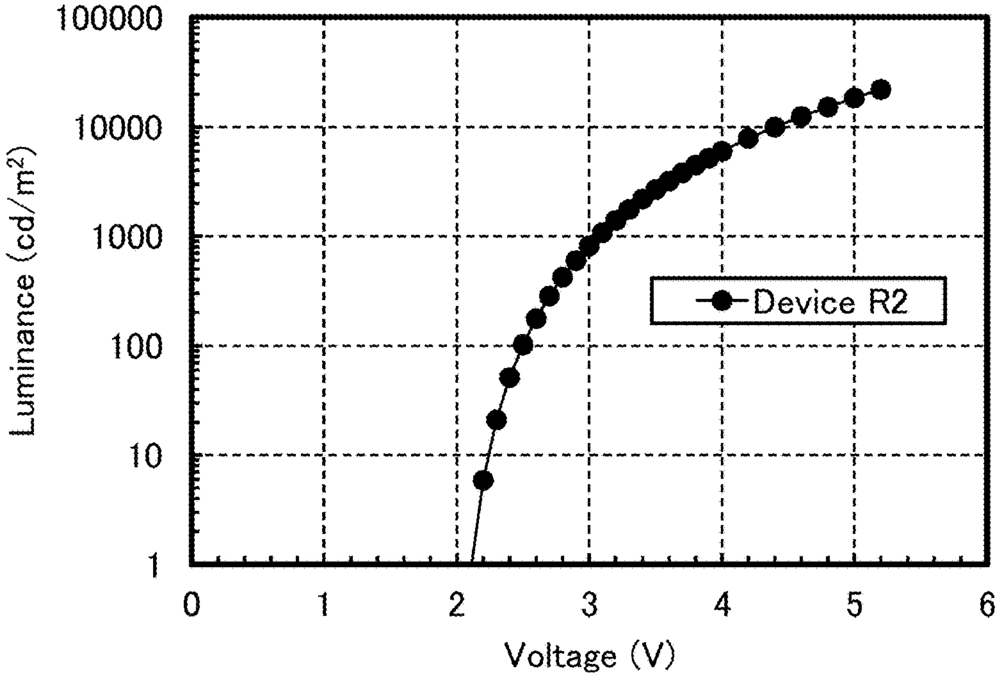
FIG. 42 is a diagram showing luminance-voltage characteristics.
Figure 43:
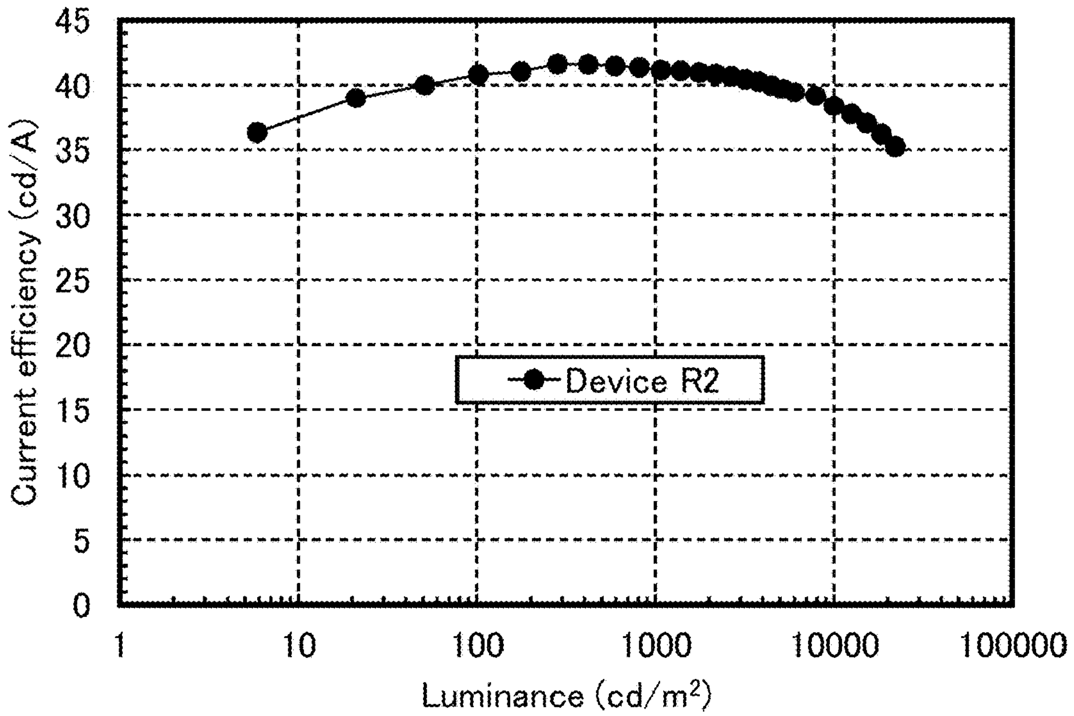
FIG. 43 is a diagram showing current efficiency-luminance characteristics.
Figure 44:
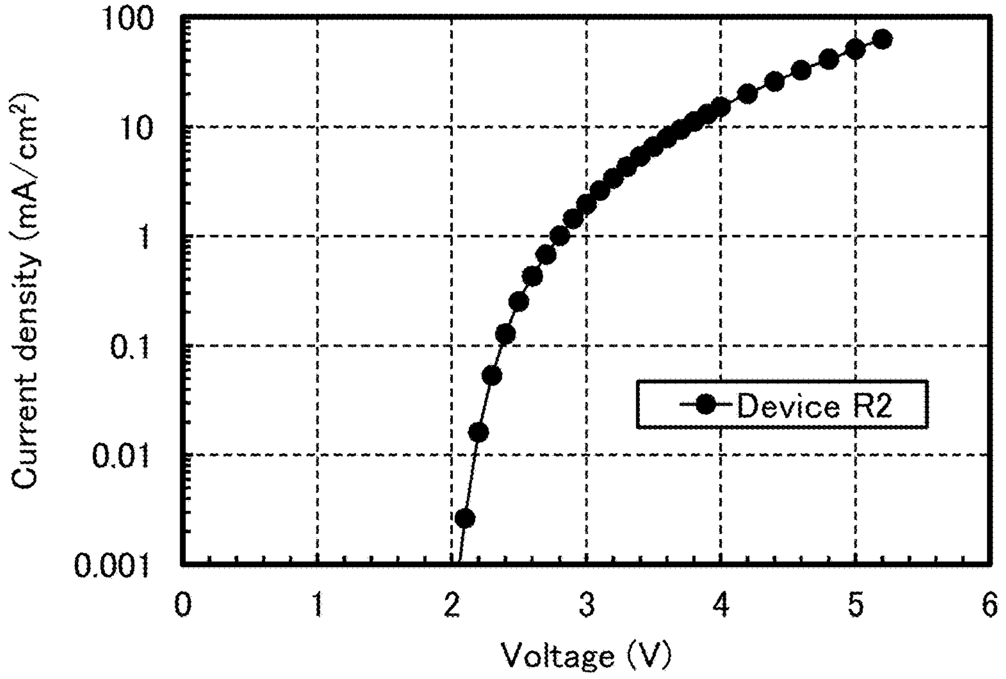
FIG. 44 is a diagram showing current density-voltage characteristics.
Figure 45:
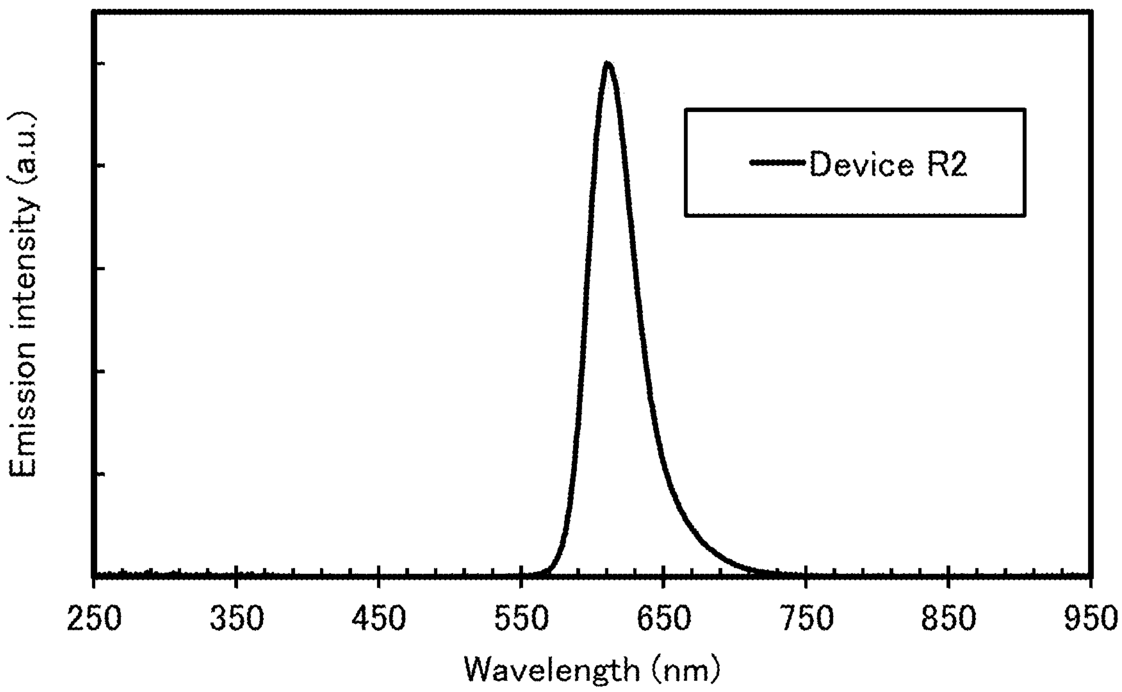
FIG. 45 is a diagram showing an emission spectrum.

FIG. 41 to FIG. 45 show the characteristics of the device R2. FIG. 41 is a diagram showing the luminance-current density characteristics of the device R2. FIG. 42 is a diagram showing the luminance-voltage characteristics of the device R2. FIG. 43 is a diagram showing the current efficiency-luminance characteristics of the device R2. FIG. 44 is a diagram showing the current density-voltage characteristics of the device R2. FIG. 45 is a diagram showing an emission spectrum when current at a current density of 5 mA/$cm^2$ was supplied to the device R2.

Figure 46:
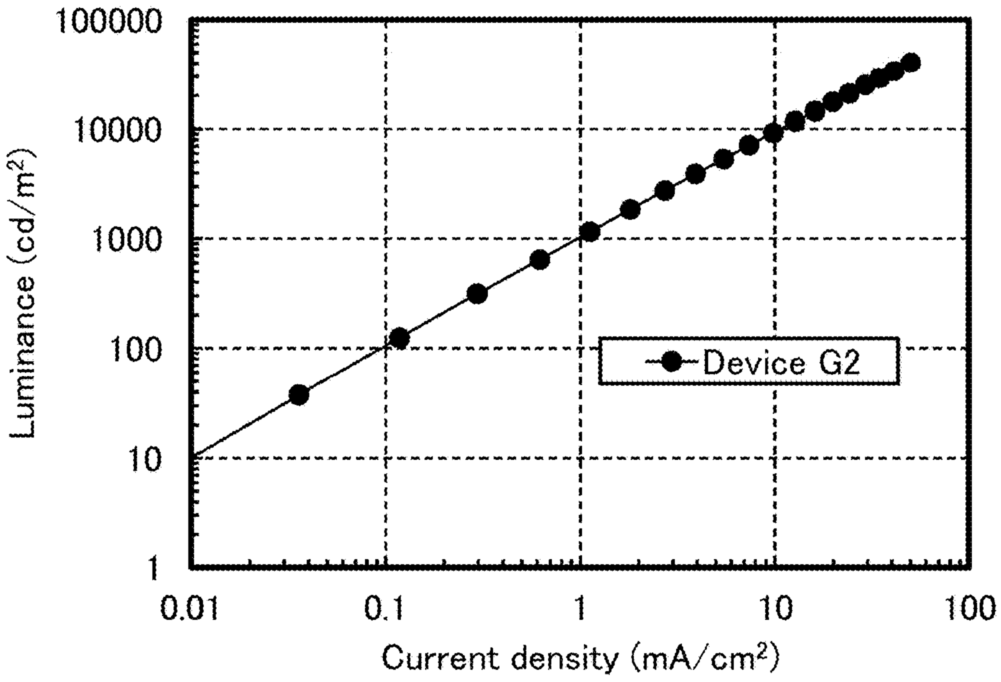
FIG. 46 is a diagram showing luminance-current density characteristics.
Figure 47:
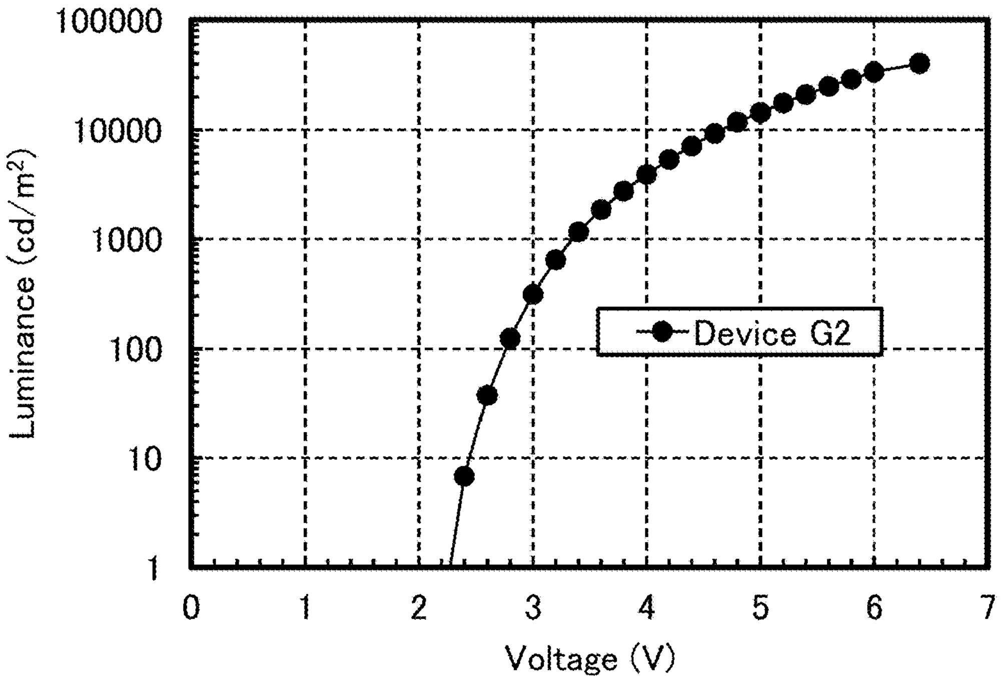
FIG. 47 is a diagram showing luminance-voltage characteristics.
Figure 48:
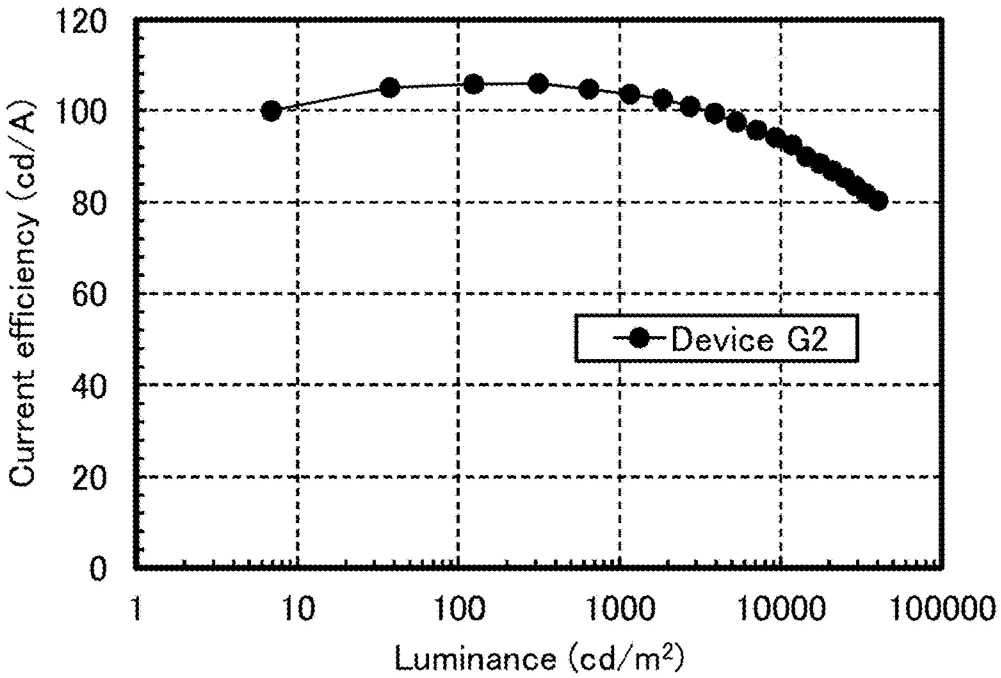
FIG. 48 is a diagram showing current efficiency-luminance characteristics.
Figure 49:
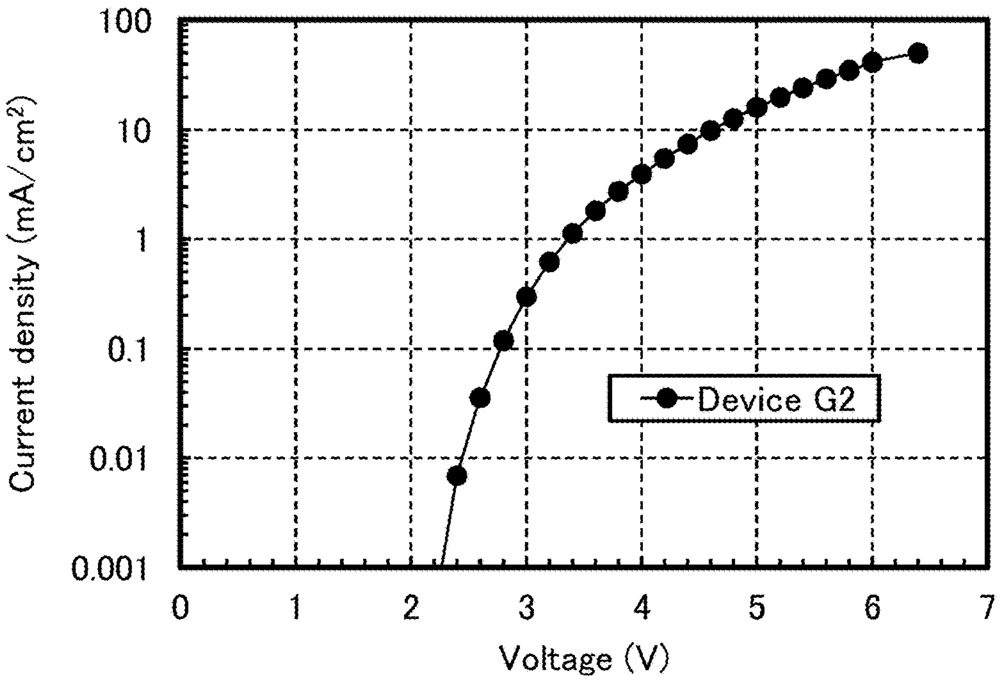
FIG. 49 is a diagram showing current density-voltage characteristics.
Figure 50:
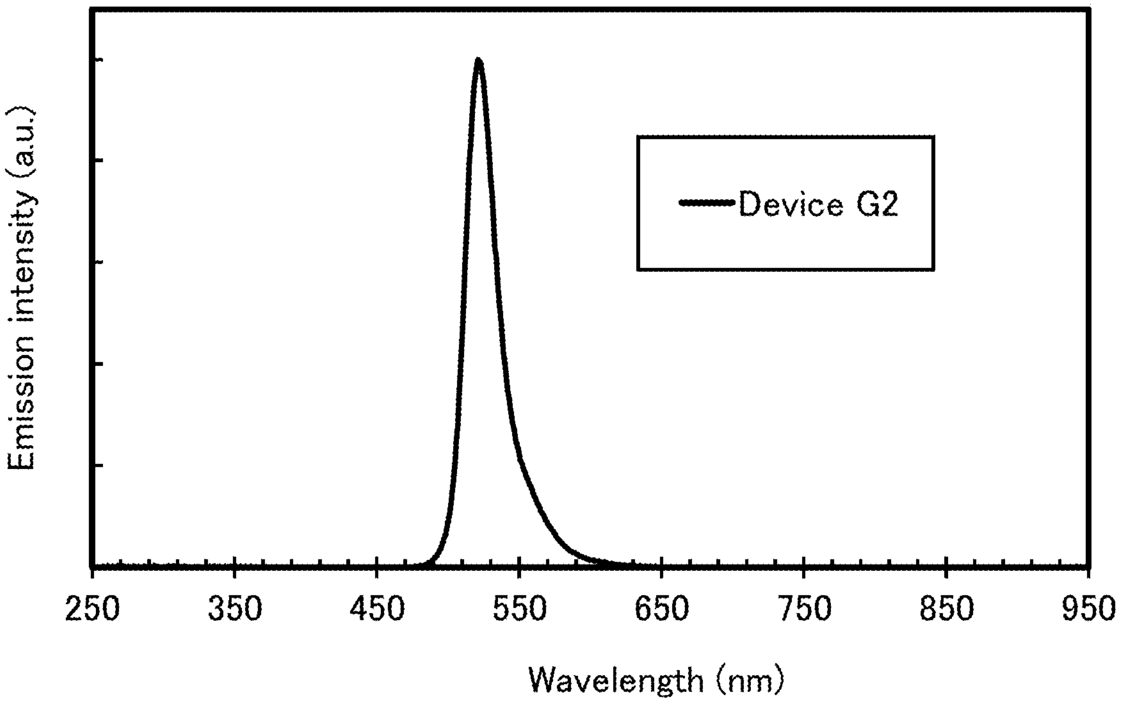
FIG. 50 is a diagram showing an emission spectrum.

FIG. 46 to FIG. 50 show the characteristics of the device G2. FIG. 46 is a diagram showing the luminance-current density characteristics of the device G2. FIG. 47 is a diagram showing the luminance-voltage characteristics of the device G2. FIG. 48 is a diagram showing the current efficiency-luminance characteristics of the device G2. FIG. 49 is a diagram showing the current density-voltage characteristics of the device G2. FIG. 50 is a diagram showing an emission spectrum when current at a current density of 5 mA/$cm^2$ was supplied to the device G2.

Figure 51:
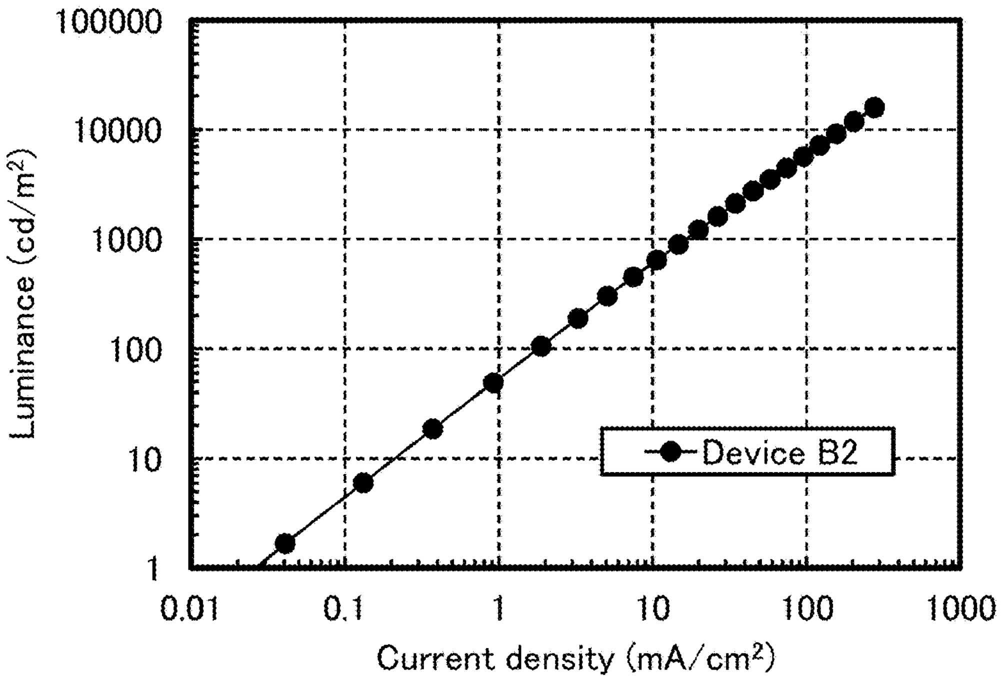
FIG. 51 is a diagram showing luminance-current density characteristics.
Figure 52:
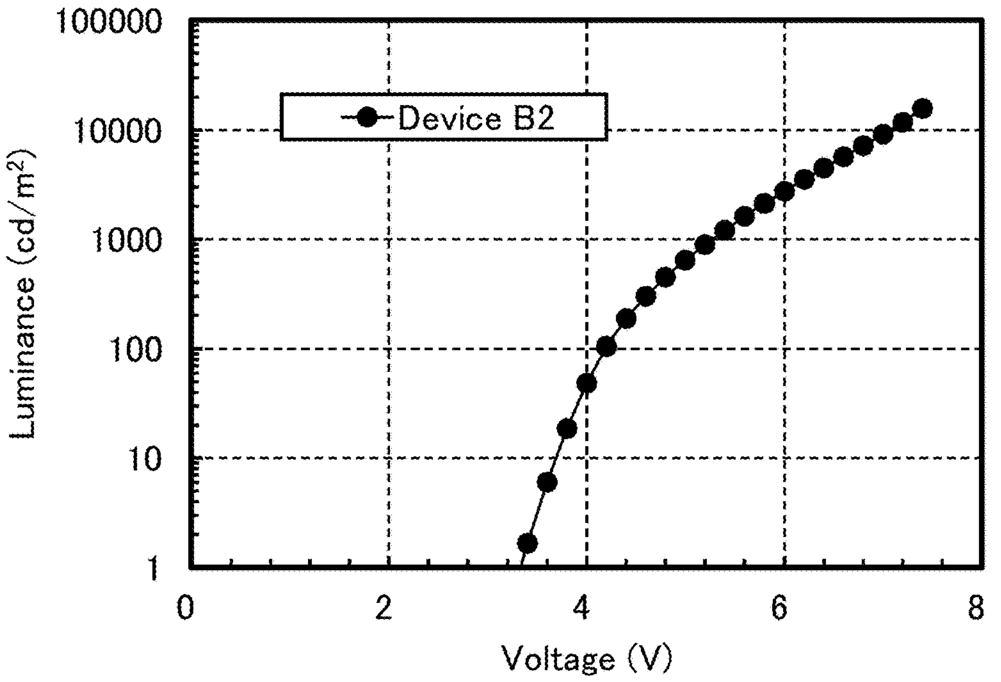
FIG. 52 is a diagram showing luminance-voltage characteristics.
Figure 53:
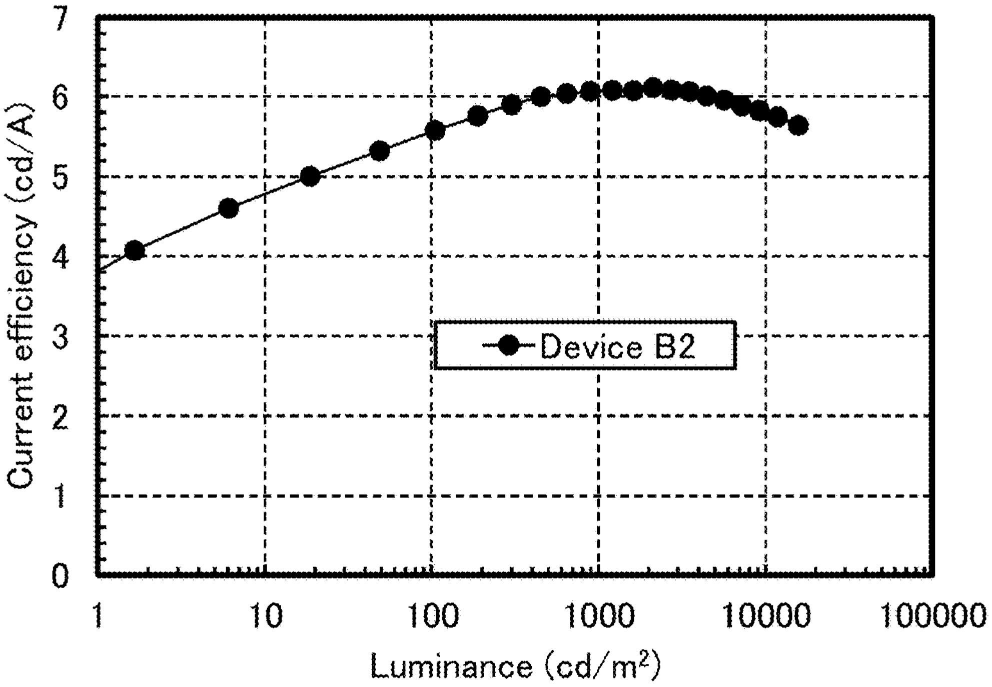
FIG. 53 is a diagram showing current efficiency-luminance characteristics.
Figure 54:
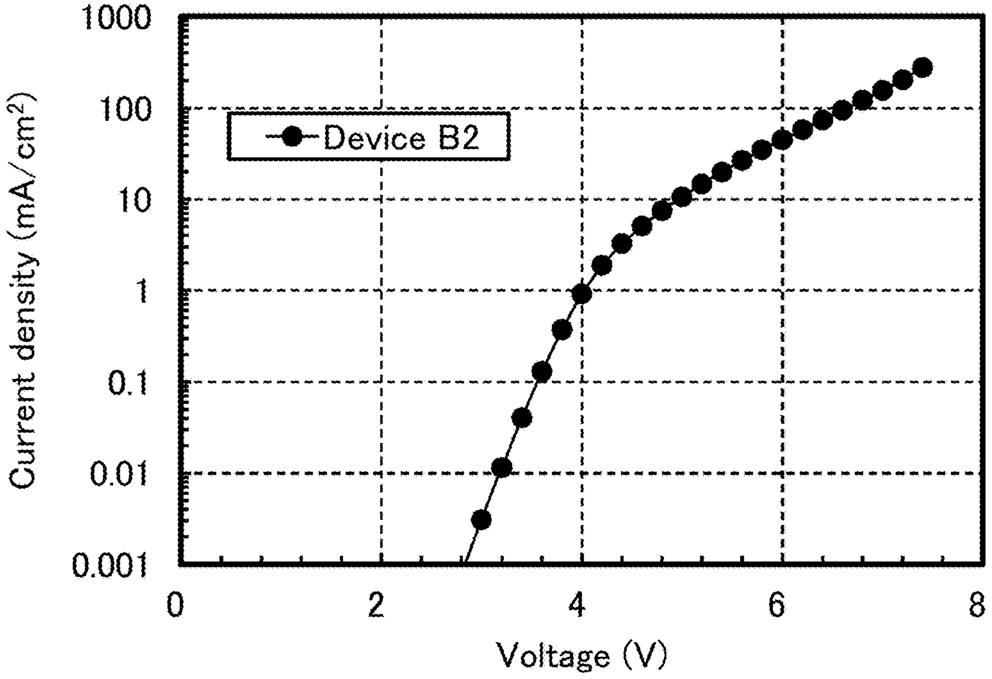
FIG. 54 is a diagram showing current density-voltage characteristics.
Figure 55:
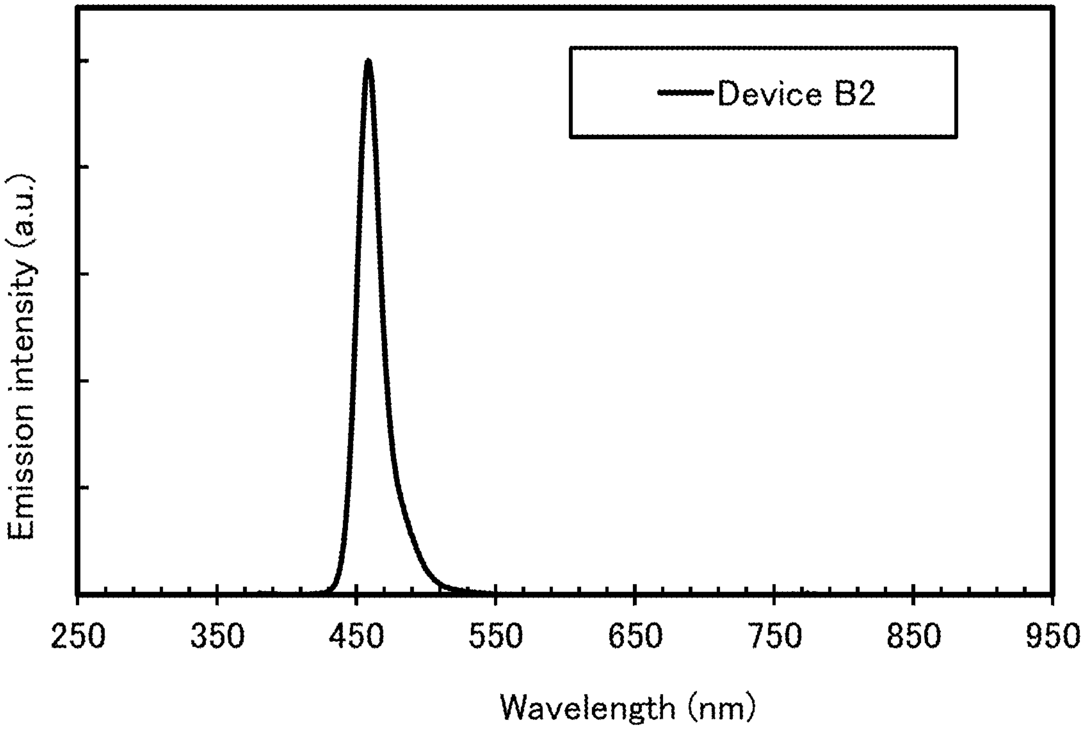
FIG. 55 is a diagram showing an emission spectrum.

FIG. 51 to FIG. 55 show the characteristics of the device B2. FIG. 51 is a diagram showing the luminance-current density characteristics of the device B2. FIG. 52 is a diagram showing the luminance-voltage characteristics of the device B2. FIG. 53 is a diagram showing the current efficiency-luminance characteristics of the device B2. FIG. 54 is a diagram showing the current density-voltage characteristics of the device B2. FIG. 55 is a diagram showing an emission spectrum when current at a current density of 14.7 mA/$cm^2$ was supplied to the device B2.

TABLE 5

| | First electrode 130 | | Hole-injection layer 131 | Hole-transport layer 132a | Hole-transport layer 132b | Light-emitting layer 133 | Electron-transport layer 134 | | Electron-injection layer 135 | Second electrode 140 | Buffer layer 136 |
|---|---|---|---|---|---|---|---|---|---|---|---|
| Device R2 | APC (100 nm) | ITSO (110 nm) | BBABnf: ALD-MP001Q (1:0.05 10 nm) | BBABnf (30 nm) | PCBBiF (50 nm) | * | ZADN:Liq (0.7:1 10 nm) | ZADN:Liq (1:1 25 nm) | Liq (1 nm) | Ag:Mg (1:0.1 15 nm) | DBT3P-II 80 nm |
| Device G2 | APC (100 nm) | ITSO (85 nm) | BBABnf: ALD-MP001Q (1:0.05 10 nm) | BBABnf (10 nm) | PCBBi1BP (50 nm) | ** | ZADN:Liq (0.7:1 10 nm) | ZADN:Liq (1:1 25 nm) | Liq (1 nm) | Ag:Mg (1:0.1 15 nm) | DBT3P-II 80 nm |
| Device B2 | APC (100 nm) | ITSO (85 nm) | BBABnf: ALD-MP001Q (1:0.05 10 nm) | BBABnf (25 nm) | PCzN2 (10 nm) | *** | ZADN:Liq (0.3:1 15 nm) | ZADN:Liq (1:0.3 15 nm) | Liq (1 nm) | Ag:Mg (1:0.3 15 nm) | DBT3P-II 80 nm |

* 9mDBtBPNfpr:PCBFF:ALD-MG018Q (0.7:0.3:0.05 60 nm)

** 8BP-4mDBtPBfpm:βNCCP:[Ir(ppy)$_2$(mbfpypy-d$_3$)] (0.6:0.4:0.1 50 nm)

*** αN-βNPAnth:3,10PCA2Nbf(IV)-02 (1:0.015 25 nm)

As shown in Table 5, the light-emitting devices of this example are different from the light-emitting devices of Table 6 shows the initial values of main characteristics of the respective light-emitting devices at around 1000 cd/$m^2$.

TABLE 6

| | Voltage (V) | Current (mA) | Current density ($mA/cm^2$) | Chromaticity x | Chromaticity y | Luminance ($cd/m^2$) | Current efficiency (cd/A) |
|---|---|---|---|---|---|---|---|
| Device R2 | 3.1 | 0.1 | 2.6 | 0.66 | 0.34 | 1075 | 41 |
| Device G2 | 3.4 | 0.04 | 1.1 | 0.19 | 0.77 | 1162 | 104 |
| Device B2 | 5.2 | 0.6 | 15 | 0.14 | 0.05 | 894 | 6.1 |

As shown in Table 6, it was found that each of the devices R2, G2, and B2 exhibited light emission with high color purity and had high efficiency.

As shown in FIG. 45, the device R2 exhibited an emission spectrum having a maximum peak at around 610 nm. Furthermore, as shown in FIG. 50, the device G2 exhibited an emission spectrum having a maximum peak at around 521 nm. Moreover, as shown in FIG. 55, the device B2 exhibited an emission spectrum having a maximum peak at around 459 nm.

<<Reliability Characteristics of Light-Emitting Devices>>

Figure 56:
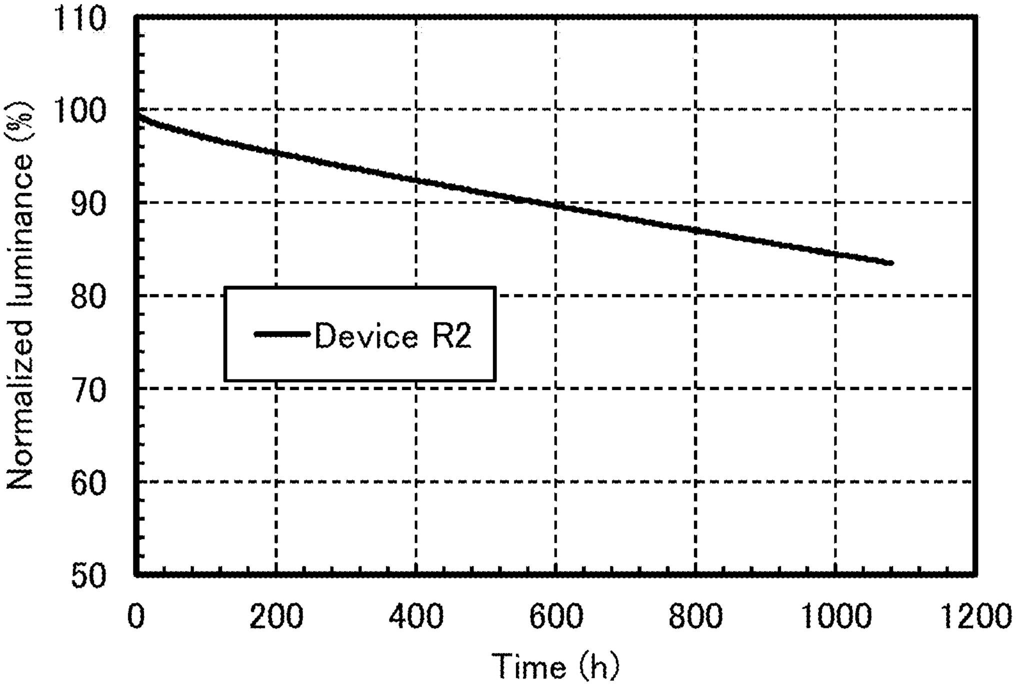
FIG. 56 is a diagram showing a result of a reliability test.
Figure 57:
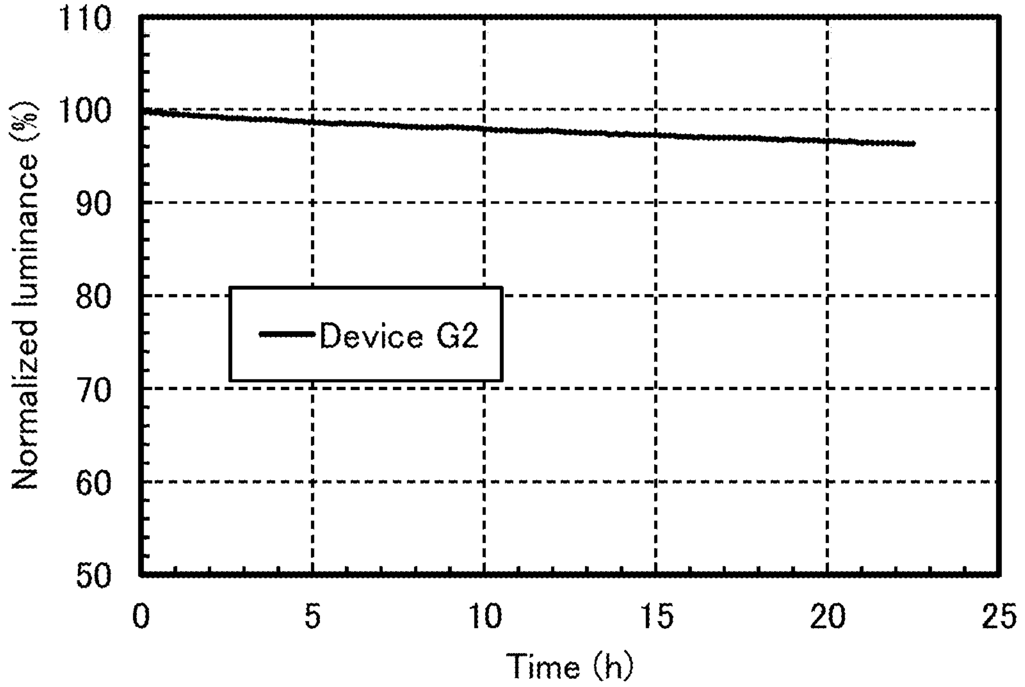
FIG. 57 is a diagram showing a result of a reliability test.
Figure 58:
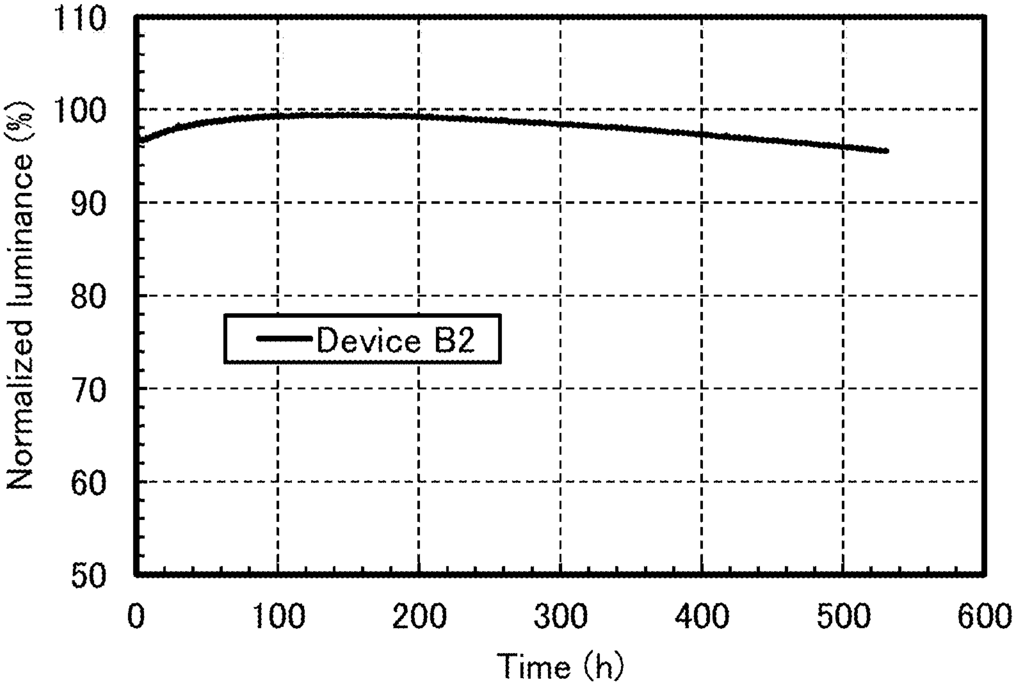
FIG. 58 is a diagram showing a result of a reliability test.

Next, a reliability test was performed on each light-emitting device. FIG. 56 to FIG. 58 show the results of the reliability test. In each of FIG. 56 to FIG. 58, the vertical axis represents normalized luminance (%) with an initial luminance of 100%, and the horizontal axis represents driving time (h). Note that in the reliability test, the device R2 was driven at a current density of 75 $mA/cm^2$ and the devices G2 and B2 were driven at a current density of 50 $mA/cm^2$.

It was found from FIG. 56 that the normalized luminance of the device R2 after 1080 hours was 84%. It was found from FIG. 57 that the normalized luminance of the device G2 after 23 hours was 96%. It was found from FIG. 58 that the normalized luminance of the device B2 after 530 hours was 95%.

It was found that the devices R2, G2, and B2 exhibited behavior with small initial decay.

As described above, any of the light-emitting devices that emitted red light, green light, and blue light had a long driving lifetime by employing the ReSTI structure in this example. In addition, either of the light-emitting devices that exhibited fluorescence and phosphorescence had a long driving lifetime by employing the ReSTI structure in this example.

The three light-emitting devices fabricated in this example included the light-emitting layers including different materials from each other. Meanwhile, the three light-emitting devices included the layers containing the same material, and further the layers containing the same material and having the same thickness. Therefore, it was suggested that with common layers among light-emitting devices of three colors, the light-emitting devices having a long driving lifetime were able to be fabricated through fewer steps in fabrication of the display device of one embodiment of the present invention.

Example 3

In this example, light-emitting devices that can be used for the display device of one embodiment of the present invention were fabricated and evaluation results thereof are described.

In this example, a device R3 that emits red light, a device G3 that emits green light, and a device B3 that emits blue light were fabricated as light-emitting devices and evaluation results thereof are described. FIG. 17B illustrates the device structure used in this example, and Table 7 shows specific structures.

Note that Example 1 can be referred to for the fabrication method of the light-emitting devices in this example. The chemical formula of the material used in this example is shown below. Note that the chemical formulae of the materials shown above are not shown here.

TABLE 7

| | First electrode 130 | | Hole-injection layer 131 | Hole-transport layer 132a | Hole-transport layer 132b | Light-emitting layer 133 | Electron-transport layer 134 | | Electron-injection layer 135 | Second electrode 140 | Buffer layer 136 |
|---|---|---|---|---|---|---|---|---|---|---|---|
| Device R3 | APC (100 nm) | ITSO (110 nm) | BBABnf: ALD-MP001Q (1:0.05 10 nm) | BBABnf (30 nm) | PCBBiF (70 nm) | * | ZADN:Liq (0.3:1 17.5 nm) | ZADN:Liq (1:0.3 17.5 nm) | Liq (1 nm) | Ag:Mg (1:0.3 15 nm) | DBT3P-II 80 nm |
| Device G3 | APC (100 nm) | ITSO (85 nm) | BBABnf: ALD-MP001Q (1:0.05 10 nm) | BBABnf (10 nm) | PCBBi1BP (50 nm) | ** | ZADN:Liq (0.3:1 17.5 nm) | ZADN:Liq (1:0.3 17.5 nm) | Liq (1 nm) | Ag:Mg (1:0.3 15 nm) | DBT3P-II 80 nm |
| Device B3 | APC (100 nm) | ITSO (85 nm) | BBABnf: ALD-MP001Q (1:0.05 10 nm) | BBABnf (25 nm) | PCzN2 (10 nm) | *** | ZADN:Liq (0.7:1 12.5 nm) | ZADN:Liq (1:0.7 12.5 nm) | Liq (1 nm) | Ag:Mg (1:0.1 15 nm) | DBT3P-II 80 nm |

* 9mDBtBPNfpr:PCBBiF:ALD-MG018Q (0.7:0.3:0.05 60 nm)

** 8BP-4mDBtPBfpm:βNCCP:[Ir(ppy)$_2$(mbfpypy)] (0.6:0.4:0.1 50 nm)

*** αN-βNPAnth:3,10PCA2Nbf(IV)-02 (1:0.015 25 nm)

[Chemical Formula 3]

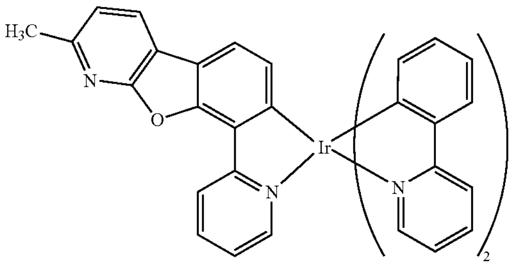

[Ir(ppy)$_2$(mbfpypy)]

As shown in Table 7, the light-emitting devices of this example are different from the light-emitting devices of Example 1 mainly in that the electron-transport layer 134 has a stacked-layer structure of two layers including ZADN and Liq at different mixture ratios. Specifically, in the electron-transport layer 134 of each of the light-emitting devices of this example, the cathode (the second electrode 140) side has a smaller Liq content than the anode (the first electrode 130) side.

The light-emitting layer 133 of the device G3 was formed to have a thickness of 50 nm by co-evaporation of 8BP-4mDBtPBfpm, βNCCP, and [2-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy)]) in a weight ratio of 0.6:0.4:0.1 (=8BP-4mDBtPBfpm:βNCCP:[Ir(ppy)$_2$(mbfpypy)]).

The device R3 that emits red light, the device G3 that emits green light, and the device B3 that emits blue light in this example were fabricated to have chromaticity of emission color substantially the same as that of a subpixel of commercial display device (smartphone) using organic EL devices.

<<Reliability Characteristics of Light-Emitting Devices>>

Figure 59:
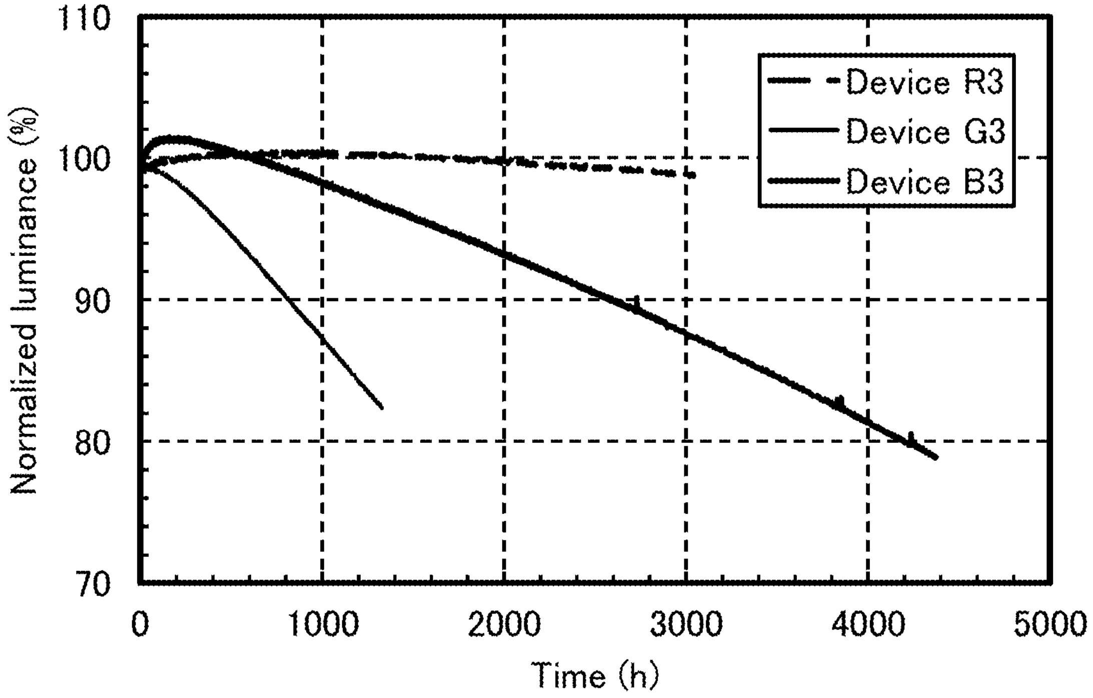
FIG. 59 is a diagram showing results of a reliability test.

A reliability test was performed on each light-emitting device. FIG. 59 shows the results of the reliability test. In FIG. 59, the vertical axis represents normalized luminance (%) with an initial luminance of 100%, and the horizontal axis represents driving time (h).

Note that in this example, the reliability test was performed in such a manner that the device R3 that emits red light, the device G3 that emits green light, and the device B3 that emits blue light were made to emit light with luminance and chromaticity substantially the same as those of the light-emitting devices (organic EL devices) in the subpixels of the commercial display device (smartphone). As for the luminance of the light-emitting device of each color in the commercial display device, which was made to independently emit light with brightness set to the gray scale level of 255/255 (brightness 100%), red (R) was 108 cd/m$^2$, green (G) was 354 cd/m$^2$, and blue (B) was 32.9 cd/m$^2$. As for the aperture ratio of the subpixel in the commercial display device, red was 4.5%, green was 4.3%, and blue was 6.8%. The luminance in each of the subpixels (RGB) is calculated from the aperture ratio and the luminance of each of RGB in the display device. Finally, on the assumption that the transmittance including a circular polarizing plate is 40% (the luminance in each of the subpixels (RGB) is divided by 0.4), the luminance when each of the devices R3, G3, and B3 is driven can be determined. Note that a color filter and a circular polarizing plate are provided for each subpixel in the commercial display device; the chromaticity and the luminance of each organic EL device, in which light extracted through them, were measured. Also in the light-emitting devices of this example, color filters that pass light of corresponding colors were provided over the light-emitting devices, and the chromaticity and the luminance of the light-emitting devices, in which light extracted through the color filters, were measured.

Table 8 shows driving conditions in the reliability test of the light-emitting devices. That is, the devices R3, G3, and B3 were driven at a constant current with an initial luminance of 6580 cd/m$^2$, 20000 cd/m$^2$, and 1450 cd/m$^2$, respectively.

TABLE 8

| | Initial voltage (V) | Constant current value (mA) | Chromaticity x | Chromaticity y | Luminance (cd/m$^2$) | Current efficiency (cd/A) |
|---|---|---|---|---|---|---|
| Device R3 | 6.2 | 0.670 | 0.68 | 0.32 | 6580 | 42 |
| Device G3 | 6.6 | 0.680 | 0.27 | 0.71 | 20000 | 118 |
| Device B3 | 5.3 | 0.879 | 0.14 | 0.06 | 1450 | 6.0 |

As shown in FIG. 59, LT95 (a time taken until the luminance decreases to 95% of the initial luminance) of the device R3 was 3000 hours or longer, LT95 of the device G3 was 480 hours, and LT95 of the device B3 was 1640 hours.

In general, of red-, green-, and blue-light-emitting devices, the driving lifetime of the blue-light-emitting device tends to be the shortest; however, of the light-emitting devices of this example, the driving lifetime of the blue-light-emitting device was the second longest after that of the red-light-emitting device. In this example, the light-emitting device that emits blue light employs the light-emitting layer that exhibits fluorescence and the ReSTI structure. This probably inhibits the initial decay of the light-emitting device that emits blue light and extremely extends the driving lifetime.

In the case where the light-emitting devices of RGB should have an equivalent emission lifetime, the necessary luminance can be changed by changing the aperture ratio of the subpixel of each color; thus, the emission lifetime can be adjusted. The effect of inhibiting initial decay can be expected also in this case; thus, it can be said that manufacture of a long-lifetime light-emitting device of each color is possible. The lifetime of the blue fluorescent device employing the ReSTI structure is extremely long; thus, in the case of an OLED display employing the blue fluorescent device, the aperture ratio of the blue subpixel can be lower than that in the conventional OLED display. Furthermore, since a red phosphorescent device employing the ReSTI structure and ExTET also has an extremely long lifetime, the aperture ratio of the red subpixel can be the lowest of the RGB subpixels. The aperture ratio of the green subpixel is made the highest of the RGB subpixels, whereby the total lifetime can be extended while white display balance is kept. Low aperture ratios of the blue and red subpixels are advantageous also in an increase in definition of a display device with pentile arrangement.

As described above, any of the light-emitting devices that emitted red light, green light, and blue light had a long driving lifetime by employing the ReSTI structure in this example. In addition, either of the light-emitting devices that exhibited fluorescence and phosphorescence had a long driving lifetime by employing the ReSTI structure in this example.

The three light-emitting devices fabricated in this example included the light-emitting layers containing different materials from each other. Meanwhile, the three light-emitting devices included the layers containing the same material, and further the layers containing the same material and having the same thickness. Therefore, it was suggested that with common layers among light-emitting devices of three colors, the light-emitting devices having a long driving lifetime were able to be fabricated through fewer steps in fabrication of the display device of one embodiment of the present invention.

Reference Example 2

In this reference example, a synthesis method of 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm) used in Example 1 to Example 3 is described.

[Chemical Formula 4]

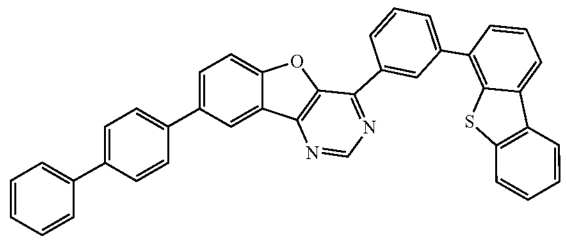

8BP-4mDBtPBfpm

Into a three-neck flask, 1.37 g of 8-chloro-4-[3-(dibenzothiophen-4-yl)phenyl]-[1]benzofuro[3,2-d]pyrimidine, 0.657 g of 4-biphenylboronic acid, 1.91 g of tripotassium phosphate, 30 mL of diethylene glycol dimethyl ether (diglyme), and 0.662 g of t-butanol were put, they were degassed by being stirred under reduced pressure, and the air in the flask was replaced with nitrogen.

This mixture was heated to 60° C. and 23.3 mg of palladium(II) acetate and 66.4 mg of di(1-adamantyl)-n-butylphosphine were added, followed by stirring at 120° C. for 27 hours. Water was added to this reaction liquid, suction filtration was performed, and the obtained residue was washed with water, ethanol, and toluene. This residue was dissolved in heated toluene, followed by filtration through a filter aid filled with Celite, alumina, and Celite in this order. The obtained solution was concentrated and dried, and then recrystallized with toluene to give 1.28 g of a target white solid in a yield of 74%.

By a train sublimation method, 1.26 g of the white solid was sublimated and purified. In the purification by sublimation, the solid was heated at 310° C. under a pressure of 2.56 Pa while the argon gas flowed at a flow rate of 10 m/min. After the purification by sublimation, 1.01 g of a target pale yellow solid was obtained at a collection rate of 80%. The synthesis scheme is shown in Formula (a-1) below.

[Chemical formula 5]

(a-1)

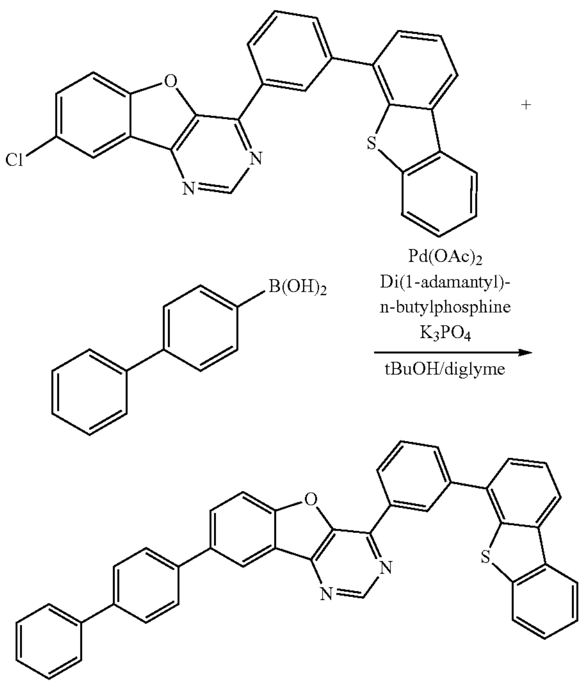

8BP-4mDBtPBfpm

Analysis results by nuclear magnetic resonance ($^1$H-NMR) spectroscopy of the pale yellow solid obtained in the above reaction are shown below. The results reveal that 8BP-4mDBtPBfpm was obtained.

$^1$H-NMR. δ ($CDCl_3$): 7.39 (t, 1H), 7.47-7.53 (m, 4H), 7.63-7.67 (m, 2H), 7.68 (d, 2H), 7.75 (d, 2H), 7.79-7.83 (m, 4H), 7.87 (d, 1H), 7.98 (d, 1H), 8.02 (d, 1H), 8.23-8.26 (m, 2H), 8.57 (s, 1H), 8.73 (d, 1H), 9.05 (s, 1H), 9.34 (s, 1H).

REFERENCE NUMERALS

G1: wiring, G2: wiring, ML: transistor, M2: transistor, M3: transistor, M4: transistor, V0: wiring, 10A: display device, 10B: display device, 10C: display device, 10D: display device, 10E: display device, 21B: light, 21G: light, 21R: light, 42: transistor, 51: pixel, 52: pixel, 53: pixel, 54: pixel, 100A: display device, 100B: display device, 101: anode, 102: cathode, 103: EL layer, 112: common layer, 114: common layer, 115: common electrode, 121: hole-injection layer, 122: hole-transport layer, 122*a*: hole-transport layer, 122*b*: hole-transport layer, 123: light-emitting layer, 123-1: light-emitting region, 124: electron-transport layer, 124-1: non-light-emitting recombination region, 124*a*: electron-transport layer, 124*b*: electron-transport layer, 125: electron-injection layer, 130: first electrode, 131: hole-injection layer, 132*a*: hole-transport layer, 132*b*: hole-transport layer, 133: light-emitting layer, 134: electron-transport layer, 135: electron-injection layer, 136: buffer layer, 140: second electrode, 142: adhesive layer, 143: space, 151: substrate, 152: substrate, 153: substrate, 154: substrate, 155: adhesive layer, 162: display portion, 164: circuit, 165: wiring, 166: conductive layer, 172: FPC, 173: IC, 182: common layer, 184: common layer, 190: light-emitting device, 190B: light-emitting device, 190G: light-emitting device, 190R: light-emitting device, 191: pixel electrode, 192: buffer layer, 192B: buffer layer, 192G: buffer layer, 192R: buffer layer, 193: light-emitting layer, 193B: light-emitting layer, 193G: light-emitting layer, 193R: light-emitting layer, 194: buffer layer, 194B: buffer layer, 194G: buffer layer, 194R: buffer layer, 195: protective layer, 195*a*: inorganic insulating layer, 195*b*: organic insulating layer, 195*c*: inorganic insulating layer, 199: optical adjustment layer, 199B: optical adjustment layer, 199G: optical adjustment layer, 199R: optical adjustment layer, 201: transistor, 202: transistor, 204: connection portion, 205: transistor, 210: transistor, 211: insulating layer, 212: insulating layer, 213: insulating layer, 214: insulating layer, 215: insulating layer, 216: partition, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 242: connection layer, 600: television device, 601: control portion, 602: memory portion, 603: communication control portion, 604: image processing circuit, 605: decoder circuit, 606: video signal reception portion, 607: timing controller, 608: source driver, 609: gate driver, 620: display panel, 621: pixel, 630: system bus, 730: insulating film, 770: planarization insulating film, 772: conductive film, 782: light-emitting device, 783: droplet discharge apparatus, 784: droplet, 785: layer containing a composition, 786: EL layer, 788: conductive film, 901: first electrode, 902: second electrode, 910: first layer, 911: second layer, 912: third layer, 1400: droplet discharge apparatus, 1402: substrate, 1403: droplet discharge means, 1404: imaging means, 1405: head, 1406: dotted line, 1407: control means, 1408: storage medium, 1409: image processing means, 1410: computer, 1411: marker, 1412: head, 1413: material supply source, 1414: material supply source, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal.

The invention claimed is:

1. A display device comprising:

a first light-emitting device; and a second light-emitting device, wherein the first light-emitting device comprises a first electrode and a common electrode, wherein the second light-emitting device comprises a second electrode and the common electrode, wherein the first light-emitting device comprises a hole-injection layer, a first light-emitting layer, and an electron-transport layer in this order from a side of the first electrode, wherein the second light-emitting device comprises a second light-emitting layer between the second electrode and the common electrode, wherein the hole-injection layer is in contact with the first electrode, wherein the hole-injection layer comprises a first compound and a second compound, wherein the first light-emitting layer comprises a third compound that emits light of a first color, wherein the second light-emitting layer comprises a fourth compound that emits light of a second color, wherein the electron-transport layer comprises a fifth compound, wherein the first compound comprises at least one of a cyano group and a fluoro group, wherein a HOMO level of the second compound is higher than or equal to −5.7 eV and lower than or equal to −5.4 eV, and wherein a HOMO level of the fifth compound is higher than or equal to −6.0 eV.

2. The display device according to claim 1, wherein the fifth compound is a triazine derivative, a phenanthroline derivative, or a compound comprising an anthracene skeleton.

3. The display device according to claim 1, wherein the first color is blue.

4. The display device according to claim 1, wherein each of the third compound and the fourth compound is a fluorescent substance.

5. The display device according to claim 1, wherein the second light-emitting device comprises a layer shared with the first light-emitting device between the second electrode and the common electrode.

6. The display device according to claim 1, wherein the second compound comprises at least one of a carbazole skeleton, a dibenzofuran skeleton, a dibenzothiophene skeleton, and an anthracene skeleton.

7. The display device according to claim 1, wherein the electron-transport layer further comprises an organic complex comprising an alkali metal or an alkaline earth metal.

8. A display device comprising:

a first light-emitting device; and a second light-emitting device, wherein the first light-emitting device comprises a first electrode and a common electrode, wherein the second light-emitting device comprises a second electrode and the common electrode, wherein the first light-emitting device comprises a hole-injection layer, a first hole-transport layer, a first light-emitting layer, and an electron-transport layer in this order from a side of the first electrode, wherein the second light-emitting device comprises a second light-emitting layer between the second electrode and the common electrode, wherein the hole-injection layer is in contact with the first electrode, wherein the hole-injection layer comprises a first compound and a second compound, wherein the first light-emitting layer comprises a third compound that emits light of a first color, wherein the second light-emitting layer comprises a fourth compound that emits light of a second color, wherein the electron-transport layer comprises a fifth compound, wherein the first hole-transport layer comprises a sixth compound, wherein the first compound comprises at least one of a cyano group and a fluoro group, wherein a HOMO level of the second compound is higher than or equal to −5.7 eV and lower than or equal to −5.4 eV, wherein a HOMO level of the fifth compound is higher than or equal to −6.0 eV, wherein a HOMO level of the sixth compound is lower than or equal to the HOMO level of the second compound, and wherein a difference between the HOMO level of the sixth compound and the HOMO level of the second compound is 0.2 eV or less.

9. The display device according to claim 8, wherein the fifth compound is a triazine derivative, a phenanthroline derivative, or a compound comprising an anthracene skeleton.

10. The display device according to claim 8, wherein the first color is blue.

11. The display device according to claim 8, wherein each of the third compound and the fourth compound is a fluorescent substance.

12. The display device according to claim 8, wherein the second light-emitting device comprises a layer shared with the first light-emitting device between the second electrode and the common electrode.

13. The display device according to claim 8, wherein the second compound comprises at least one of a carbazole skeleton, a dibenzofuran skeleton, a dibenzothiophene skeleton, and an anthracene skeleton.

14. The display device according to claim 8, wherein the electron-transport layer further comprises an organic complex comprising an alkali metal or an alkaline earth metal.

15. The display device according to claim 8, wherein the first light-emitting device further comprises a second hole-transport layer, wherein the second hole-transport layer comprises a seventh compound, and wherein a HOMO level of the seventh compound is lower than the HOMO level of the sixth compound.

16. A display device comprising:

a first light-emitting device;

a second light-emitting device; and a third light-emitting device, wherein the first light-emitting device comprises a first electrode and a common electrode, wherein the second light-emitting device comprises a second electrode and the common electrode, wherein the third light-emitting device comprises a third electrode and the common electrode, wherein the first light-emitting device comprises a hole-injection layer, a first light-emitting layer, and an electron-transport layer in this order from a side of the first electrode, wherein the second light-emitting device comprises a second light-emitting layer between the second electrode and the common electrode, wherein the third light-emitting device comprises a third light-emitting layer between the third electrode and the common electrode, wherein the hole-injection layer is in contact with the first electrode, wherein the hole-injection layer comprises a first compound and a second compound, wherein the electron-transport layer comprises a third compound, wherein the first compound comprises at least one of a cyano group and a fluoro group, wherein a HOMO level of the second compound is higher than or equal to −5.7 eV and lower than or equal to −5.4 eV, wherein a maximum peak wavelength of an emission spectrum of the first light-emitting device is shorter than a maximum peak wavelength of an emission spectrum of the second light-emitting device, wherein the maximum peak wavelength of the emission spectrum of the second light-emitting device is shorter than a maximum peak wavelength of an emission spectrum of the third light-emitting device, and wherein in a top view, an area of a light-emitting region of the first light-emitting device is larger than or equal to an area of a light-emitting region of the third light-emitting device and smaller than or equal to an area of a light-emitting region of the second light-emitting device.

17. The display device according to claim 16, wherein the third compound is a triazine derivative, a phenanthroline derivative, or a compound comprising an anthracene skeleton.

18. The display device according to claim 16, wherein the second compound comprises at least one of a carbazole skeleton, a dibenzofuran skeleton, a dibenzothiophene skeleton, and an anthracene skeleton.

19. The display device according to claim 16, wherein the electron-transport layer further comprises an organic complex comprising an alkali metal or an alkaline earth metal.

* * * * *